United States Patent
Amano et al.

(10) Patent No.: US 12,436,170 B2
(45) Date of Patent: Oct. 7, 2025

(54) SENSOR APPARATUS

(71) Applicant: SONY GROUP CORPORATION, Tokyo (JP)

(72) Inventors: Toru Amano, Tokyo (JP); Hiroyuki Kamata, Tokyo (JP); Tsutomu Sawada, Tokyo (JP); Yoshitaka Suga, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 147 days.

(21) Appl. No.: 17/759,234

(22) PCT Filed: Jul. 28, 2020

(86) PCT No.: PCT/JP2020/028907
§ 371 (c)(1),
(2) Date: Jul. 21, 2022

(87) PCT Pub. No.: WO2021/152884
PCT Pub. Date: Aug. 5, 2021

(65) Prior Publication Data
US 2023/0048524 A1 Feb. 16, 2023

(30) Foreign Application Priority Data

Jan. 31, 2020 (JP) .................. 2020-014351

(51) Int. Cl.
*G01P 15/14* (2013.01)
*G01C 19/5783* (2012.01)
(Continued)

(52) U.S. Cl.
CPC .......... *G01P 15/14* (2013.01); *G01C 19/5783* (2013.01); *G01P 15/08* (2013.01);
(Continued)

(58) Field of Classification Search
CPC ...... G01P 15/14; G01P 15/08; G01P 15/0802; G01P 2015/0845; G01P 2015/0848;
(Continued)

(56) References Cited

U.S. PATENT DOCUMENTS

2005/0091843 A1* 5/2005 Yu ..................... G01P 15/097
29/830
2012/0130652 A1* 5/2012 Yost ................... G01C 19/5776
702/41

(Continued)

FOREIGN PATENT DOCUMENTS

JP H09170926 A 6/1997
JP H09243657 A 9/1997

(Continued)

OTHER PUBLICATIONS

International Search Report and Written Opinion of PCT Application No. PCT/JP2020/028907, issued on Oct. 20, 2020, 13 pages of ISRWO.

*Primary Examiner* — Benjamin R Schmitt
(74) *Attorney, Agent, or Firm* — CHIP LAW GROUP

(57) ABSTRACT

Provided is a sensor apparatus that includes a substrate, one or more first IMU sensors, and one or more second IMU sensors. The substrate has a first surface and a second surface opposite to the first surface. The one or more first IMU sensors are arranged on the first surface. The one or more second IMU sensors are arranged on the second surface. By arranging the IMU sensors on both the first surface and the second surface, it is possible to reduce the size of the apparatus and to suppress a deformation of the substrate due to heat. This makes it possible to realize a highly accurate measurement based on a detection result (sensing result) of a plurality of IMU sensors.

33 Claims, 34 Drawing Sheets

(51) Int. Cl.
*G01P 15/08* (2006.01)
*H05K 1/02* (2006.01)
*H05K 1/14* (2006.01)
*H05K 1/18* (2006.01)
*G01C 19/5663* (2012.01)
*G01C 19/5733* (2012.01)
*G01C 19/5769* (2012.01)

(52) U.S. Cl.
CPC ............. *H05K 1/028* (2013.01); *H05K 1/141* (2013.01); *H05K 1/147* (2013.01); *H05K 1/181* (2013.01); *G01C 19/5663* (2013.01); *G01C 19/5733* (2013.01); *G01C 19/5769* (2013.01); *G01P 15/0802* (2013.01); *G01P 2015/0845* (2013.01); *G01P 2015/0848* (2013.01); *G01P 2015/0862* (2013.01); *H05K 2201/10151* (2013.01); *H05K 2201/10204* (2013.01); *H05K 2203/1572* (2013.01)

(58) Field of Classification Search
CPC ........ G01P 2015/0862; G01C 19/5783; G01C 19/5663; G01C 19/5733; G01C 19/5769; H05K 1/141; H05K 1/181; H05K 2201/10151; H05K 2201/10204; H05K 2203/1572; G01D 11/30
See application file for complete search history.

(56) References Cited

U.S. PATENT DOCUMENTS

2016/0047675 A1 2/2016 Tanenhaus et al.
2016/0057851 A1* 2/2016 Huang ................. H05K 1/0231
29/601

FOREIGN PATENT DOCUMENTS

| JP | H11190746 A | 7/1999 | |
| JP | 2002296039 A | 10/2002 | |
| JP | 2007127607 A | 5/2007 | |
| JP | 2018-009908 A | 1/2018 | |
| WO | WO-2015145489 A1 * | 10/2015 | ............ G01P 15/125 |

* cited by examiner

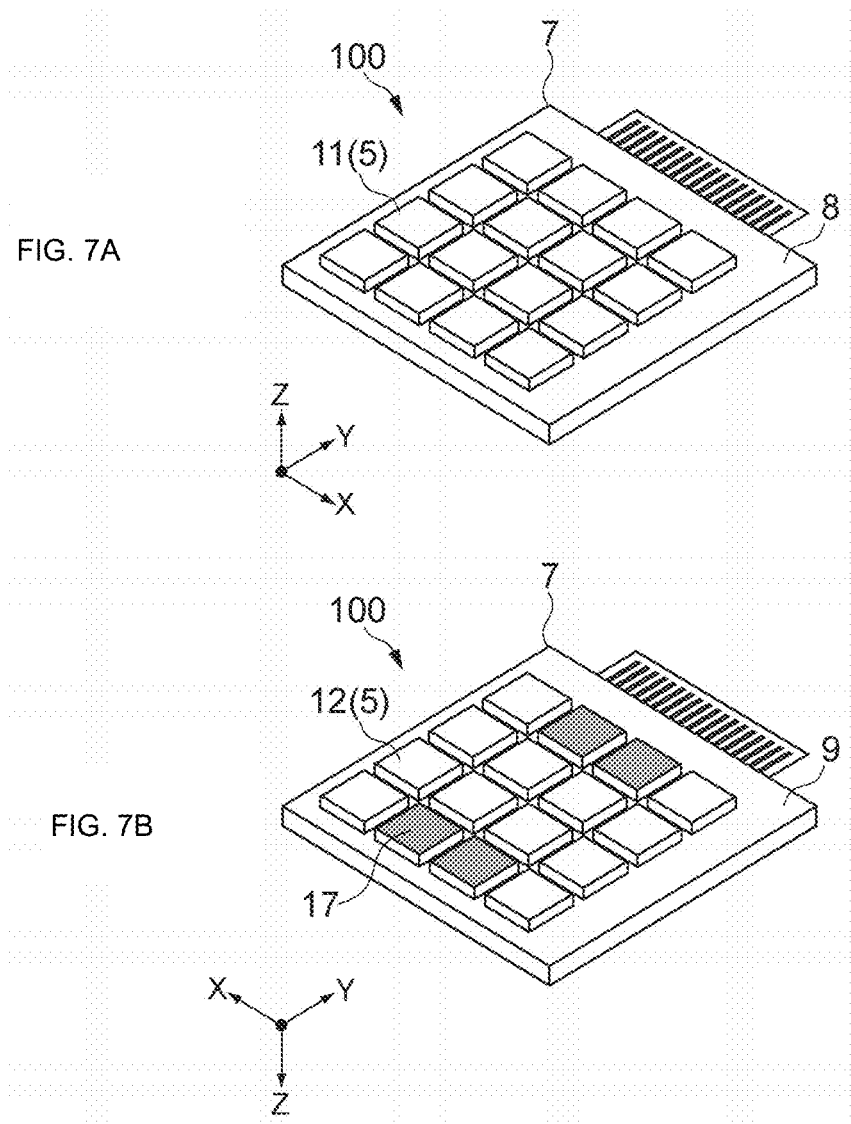

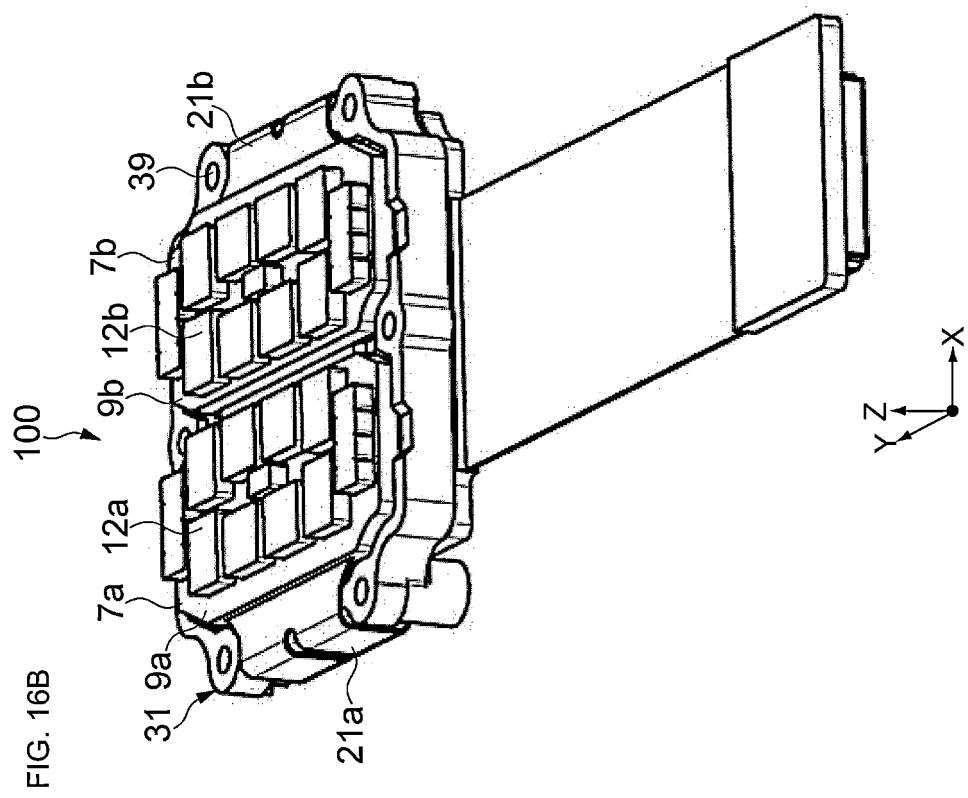
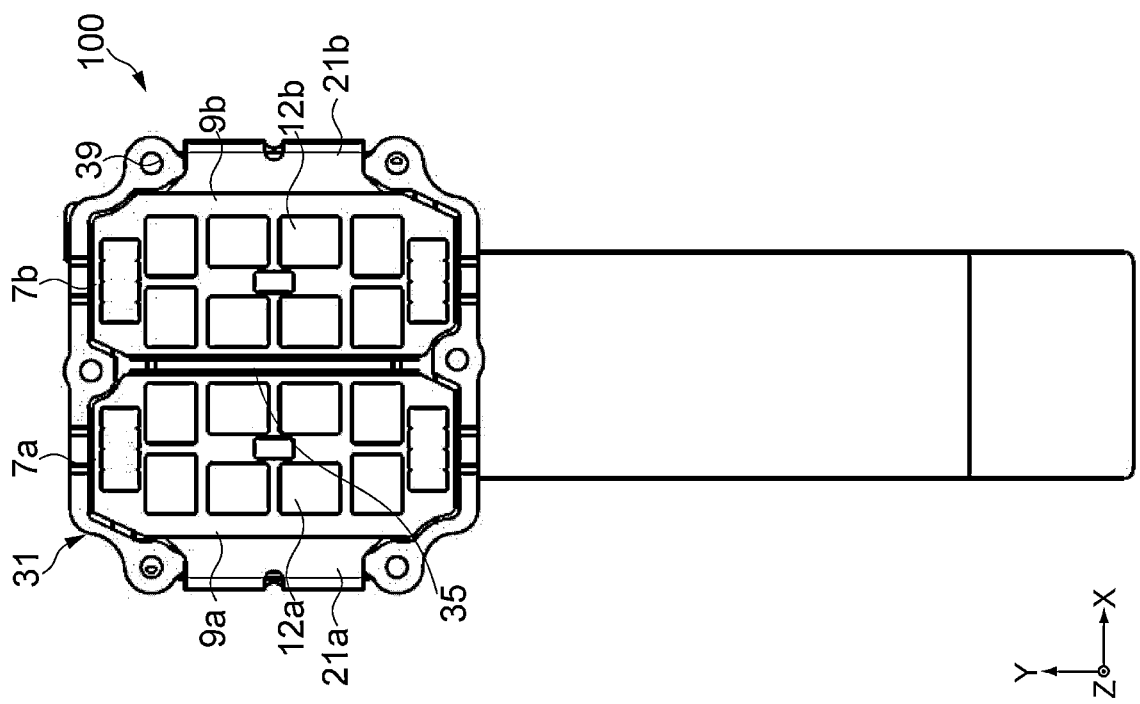

SENSOR APPARATUS

CROSS REFERENCE TO RELATED APPLICATIONS

This application is a U.S. National Phase of International Patent Application No. PCT/JP2020/028907 filed on Jul. 28, 2020, which claims priority benefit of Japanese Patent Application No. JP 2020-014351 filed in the Japan Patent Office on Jan. 31, 2020. Each of the above-referenced applications is hereby incorporated herein by reference in its entirety.

TECHNICAL FIELD

The present technology relates to a sensor apparatus applicable to inertial measurement and the like.

BACKGROUND ART

Patent Literature 1 discloses an inertial measuring unit comprising a plurality of MEMS gyroscopic sensors (paragraph [0087] FIGS. 6A, 6B, and 6C, etc.).

CITATION LIST

Patent Literature

Patent Literature 1: U.S. Patent Application Publication No. 2016/0047675

DISCLOSURE OF INVENTION

Technical Problem

In the inertial measuring apparatus and the like as described in Patent Literature 1, a technology capable of improving measurement accuracy while reducing a size of the apparatus is required.

In view of the above circumstances, an object of the present technology is to provide a sensor apparatus capable of improving the measurement accuracy while reducing the size the apparatus.

Solution to Problem

To achieve the above object, a sensor apparatus according to an embodiment of the present technology includes a substrate, one or more first IMU sensors, and one or more second IMU sensors.

The substrate has a first surface and a second surface opposite to the first surface.

The one or more first IMU sensors are arranged on the first surface.

The one or more second IMU sensors are arranged on the second surface.

In the sensor apparatus, the one or more first IMU sensors are arranged on the first surface of the substrate. In addition, the one or more second IMU sensors are arranged on the second surface opposite to the first surface. By arranging the IMU sensors on both the first surface and the second surface, it is possible to reduce the size the apparatus and to suppress a deformation of the substrate due to heat. This makes it possible to realize a highly accurate measurement based on a detection result (sensing result) of a plurality of IMU sensors.

Each of the one or more first IMU sensors and each of the one or more second IMU sensors may be an MEMS sensor.

A first arrangement configuration of a plurality of first IMU sensors arranged on the first surface and a second arrangement configuration of a plurality of second IMU sensors arranged on the second surface may correspond to each other.

The first arrangement configuration and the second arrangement configuration may be equal to each other.

The one or more first IMU sensors may be the plurality of first IMU sensors. In this case, the one or more second IMU sensors may be the plurality of second IMU sensors having the number corresponding to the number of the plurality of first IMU sensors.

The number of the plurality of second IMU sensors may be the same as the number of the plurality of first IMU sensors.

The plurality of first IMU sensors may be arranged at predetermined positions on the first surface, respectively. In this case, each of the plurality of second IMU sensors may be arranged on the second surface at positions corresponding to the positions of the plurality of first IMU sensors on the first surface.

The position of each of the plurality of first IMU sensors on the first surface and the position of each of the plurality of second IMU sensors on the second surface may be equal to each other.

Each of the plurality of second IMU sensors may be arranged on the second surface at positions opposite to the positions of the plurality of first IMU sensors on the first surface.

The plurality of first IMU sensors may be symmetrically arranged with respect to a predetermined first reference position of the first surface.

The plurality of second IMU sensors may be symmetrically arranged with respect to a second reference position of the second surface corresponding to the first reference position.

The sensor apparatus may further include a control circuit unit for controlling an operation of each of the one or more first IMU sensors and the one or more second IMU sensors.

In a case where the substrate having the first surface and the second surface is a sensor substrate, the sensor apparatus may further include one or more sensor substrates, a main substrate, and one or more flexible substrates.

The main substrate is formed separately from the one or more sensor substrates, and the control circuit unit is arranged on the main substrate.

The one or more flexible substrates electrically connect the one or more sensor substrates and the main substrate.

The one or more sensor substrates may include a first sensor substrate and a second sensor substrate. In this case, the one or more flexible substrates may include a first flexible substrate electrically connecting the first sensor substrate and the main substrate, and a second flexible substrate electrically connecting the second sensor substrate and the main substrate.

The main substrate may have a third surface on which the control circuit unit is arranged and a fourth surface opposite to the third surface. In this case, the first sensor substrate may be arranged at a position facing the third surface or the fourth surface of the main substrate by bending the first flexible substrate. The second sensor substrate may be arranged at a position facing the third surface or the fourth surface of the main substrate by bending the second flexible substrate.

The second sensor substrate may be arranged at a position on a surface facing the first sensor substrate selected from the third surface and the fourth surface of the main substrate facing the first sensor substrate.

The second sensor substrate may be arranged at a position on an opposite surface facing the first sensor substrate selected from the third surface and the fourth surface of the main substrate opposite to a surface facing the first sensor substrate.

The sensor apparatus may further include a holding portion that holds the main substrate and the one or more sensor substrates arranged at predetermined positions with respect to the main substrate by bending the one or more flexible substrates.

In a case where the substrate having the first surface and the second surface is a sensor substrate, the sensor apparatus may further include a main substrate and a frame.

The main substrate is formed separately from the sensor substrate and includes the control circuit unit arranged thereon.

The frame has a connection wire and holds the sensor substrate and the main substrate such that the sensor substrate and the main substrate is electrically connected by the connection wire.

The main substrate may have a third surface on which the control circuit unit is arranged and a fourth surface opposite to the third surface. In this case, the frame may hold the sensor substrate and the main substrate such that the sensor substrate faces the third surface or the fourth surface of the main substrate.

In a case where a surface facing the main substrate selected from the first surface and the second surface of the sensor substrate is taken as a first opposing surface and in a case where a surface facing the sensor substrate selected from the third surface and the fourth surface of the main substrate is taken as a second opposing surface, the frame may include a partition wall portion arranged between the first opposing surface and the second opposing surface, one or more first contact portions extending from the partition wall portion to a sensor substrate side and in contact with the sensor substrate, and one or more second contact portions extending from the partition wall portion to a main substrate side and in contact with the main substrate.

The partition wall portion is formed of a flat plate shape and may have a fifth surface facing the sensor substrate and a sixth surface facing the sensor substrate. In this case, the one or more first contact portions may be formed in regions of a portion of a periphery of the fifth surface, and the one or more second contact portions may be formed in regions of a portion of a periphery of the sixth surface.

When viewed from a direction in which the sensor substrate and the main substrate face each other, positions of the regions in which the one or more first contact portions of the periphery of the fifth surface are formed and positions of regions in which the one or more second contact portions of the periphery of the sixth surface are formed may be different from each other.

When viewed from the direction in which the sensor substrate and the main substrate face each other, positions of one or more first void regions in which the one or more first contact portions of the periphery of the fifth surface are not formed and positions of one or more second void regions in which the one or more second contact portions of the periphery of the sixth surface are not formed may be different from each other.

When viewed from the direction in which the sensor substrate and the main substrate face each other, the one or more first contact portions may be formed in regions opposite to the one or more second void regions of the sixth surface. In this case, the one or more second contact portions may be formed in regions opposite to the one or more first void regions of the fifth surface.

In a case where the sensor substrate is held on the frame, by the partition wall portion, the first contact portion, and the sensor substrate, a first space may be formed in which the positions of the one or more first void regions of the fifth surface are open. In this case, in a case where the main substrate is held by the frame, by the partition wall portion, the second contact portion, and the main substrate, a second space may be formed in which the positions of the one or more second void regions of the sixth surface are open.

When viewed from the direction in which the sensor substrate and the main substrate face each other, an opening position of the first space and an opening position of the second space may be different from each other.

When viewed from the direction in which the sensor substrate and the main substrate face each other, the sensor substrate, the main substrate, and the partition wall may have the same shape each other.

When viewed from the direction in which the sensor substrate and the main substrate face each other, the sensor substrate, the main substrate, and the partition wall portion may have rectangular shapes. In this case, the first contact portion may be formed on two first side portions extending in the first direction of the fifth surface and facing each other. The second contact portion may be formed on two second side portions extending in a second direction orthogonal to the first direction of the sixth surface and facing each other.

The connection wire may include a first connection terminal portion formed on at least one of the one or more first contact surfaces in contact with the sensor substrate of the one or more first contact portions, a second connection terminal portion formed on at least one of the one or more second contact surfaces in contact with the main substrate of the one or more second contact portions, and a wire portion electrically connecting the first connection terminal portion and the second connection terminal portion.

On a surface in contact with the first contact surface of the sensor substrate, a connection terminal portion which is electrically connected to the first connection terminal portion may be formed. In this case, on a surface in contact with the second contact surface of the main substrate, a connection terminal portion which is electrically connected to the second connection terminal portion may be formed.

In a case where the sensor substrate is the first sensor substrate and the frame is a first frame, the sensor apparatus may include the second sensor substrate and a second frame. In this case, the first frame may have a first connection wire, and may hold the first sensor substrate and the main substrate such that the first sensor substrate and the main substrate are electrically connected by the first connection wire. The second frame may have a second connection wire and may hold the first sensor substrate and the second sensor substrate such that the second sensor substrate and the main substrate are electrically connected by the first connection wire and the second connection wire.

The sensor apparatus may further include one or more dummy components arranged on at least one of the first surface or the second surface.

A sensor apparatus according to other embodiment of the present technology includes a substrate, one or more first gyro sensors, and one or more second gyro sensors.

The substrate has a first surface and a second surface opposite to the first surface.

The one or more first gyro sensors are arranged on the first surface.

The one or more second gyro sensors are arranged on the second surface.

BRIEF DESCRIPTION OF DRAWINGS

FIGS. 7A and 7B are schematic diagrams showing arrangement examples of a dummy component.

FIGS. 16A and 16B are schematic diagrams showing other configuration example of the sensor apparatus (lower holder arrangement).

MODE(S) FOR CARRYING OUT THE INVENTION

Embodiments according to the present technology will now be described below with reference to the drawings.

[Functional Outline of Sensor Apparatus]

Figure 1:
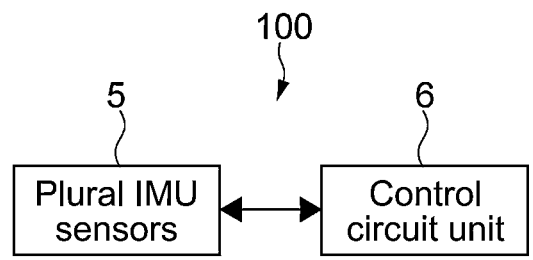
FIG. 1 is a block diagram for explaining a functional outline of a sensor apparatus according to an embodiment of the present technology.

FIG. 1 is a block diagram for explaining a functional outline of a sensor apparatus according to an embodiment of the present technology.

As shown in FIG. 1, a sensor apparatus 100 includes a plurality of IMU (Inertial Measurement Unit) sensors 5, and a control circuit unit 6. The IMU sensor 5 is also referred to as an inertial measuring apparatus.

Each of the plurality of IMU sensors 5 is capable of detecting angular velocity and acceleration. Typically, it is possible to detect angular velocity and acceleration for three axes orthogonal to each other.

The specific configuration of the plurality of IMU sensors 5 is not limited. For example, corresponding to each of the three axes, a gyro sensor (angular velocity sensor) and an acceleration sensor is arranged.

In the present embodiment, each of the plurality of IMU sensors 5 is an MEMS (Micro Electro Mechanical System)

sensor. That is, an MEMS-IMU sensor is taken as an example. By using the MEMS-IMU sensor, it is very advantageous to reduce a size of the apparatus.

It should be appreciated that the application of the present technology is not limited to the case where each of the plurality of IMU sensors 5 is the MEMS sensor.

Furthermore, the present technology is applicable to any of the cases where each of the plurality of IMU sensors 5 has the same configuration or different configurations.

A control circuit unit 6 is configured to control an operation of each of the plurality of IMU sensors 5.

For example, the control circuit unit 6 can be realized by a processor, e.g., a CPU or a DSP, an FPGA, an ASIC, or the like. Any other programmable logic devices, etc. may be used.

In the present embodiment, a detection result (sensing result) output from each of the plurality of IMU sensors 5 is output to the control circuit unit 6. Then, by the control circuit unit 6, the angular velocity and the acceleration are calculated based on a plurality of detection results.

Since the angular velocity and the acceleration are calculated based on the plurality of detection results, it is possible to achieve high measurement accuracy, for example, even when a small IMU sensor 5 configured as an MEMS sensor is used.

A method of calculating the angular velocity and the acceleration based on the plurality of detection results output from the plurality of IMU sensors 5 is not limited, and any algorithm or the like may be employed.

A configuration may be employed such that the plurality of detection results output from the plurality of IMU sensors 5 is transmitted to an external computer or the like by the control circuit unit 6 and the angular velocity and the acceleration are calculated by the external computer or the like.

The sensor apparatus 100 shown in FIG. 1 can also be said to be a sensor apparatus having a multi-IMU sensor configuration. The sensor apparatus 100 itself shown in FIG. 1 can also be referred to as an IMU sensor (inertial measuring apparatus).

[Example of Multiple IMU Sensor Arrangements]

Figure 2A:
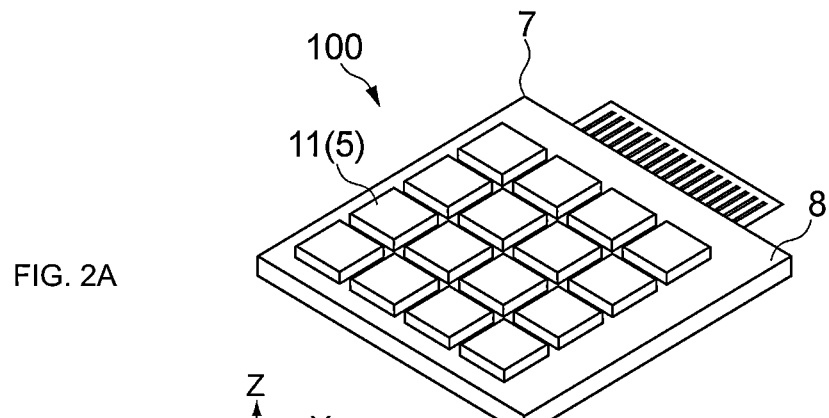
FIGS. 2A and 2B are schematic diagrams showing arrangement examples of a plurality of IMU sensors.
Figure 2B:
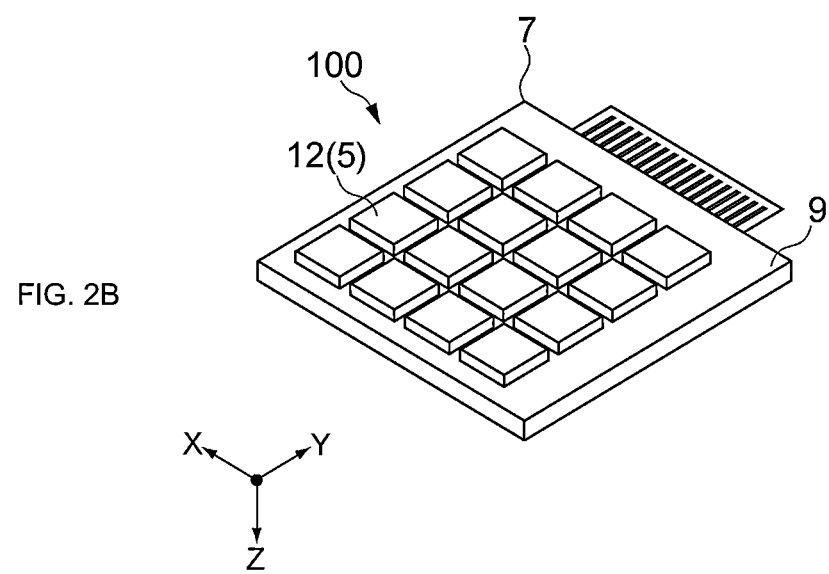

FIGS. 2A and 2B are schematic diagrams showing arrangement examples of the plurality of IMU sensors 5.

In the example shown in FIGS. 2A and 2B, the sensor apparatus 100 includes a sensor substrate 7 and the plurality of IMU sensors 5.

The sensor substrate 7 is a rigid substrate in which the plurality of IMU sensors 5 is arranged (mounted).

As shown in FIGS. 2A and 2B, the sensor substrate 7 has a first surface 8 and a second surface 9 opposite to the first surface 8. The first surface 8 and the second surface 9 faced each other.

A method of defining the first surface 8 and the second surface 9 with respect to the sensor substrate 7 is not limited, and the surfaces may be arbitrarily defined. For example, the present technology is applicable to a substrate having a front surface and a back surface by defining one surface as the first surface 8 and the opposite surface as the second surface 9.

The size, the material, the external shape (shape when viewed along the Z direction) and the like of the sensor substrate 7 are not limited. For example, a substrate of any material such as a glass epoxy substrate may be used. For example, a ceramic material having a small coefficient of linear expansion may be used. It should be appreciated that a substrate made of a metal material such as aluminum and copper may be used.

The present technology is also applicable to a substrate having any external shape such as a rectangular substrate as shown in FIGS. 2A and 2B, a circular substrate, a polygonal substrate, and the like.

In the present embodiment, the sensor substrate 7 corresponds to the substrate having the first surface and the second surface opposite to the first surface.

The plurality of IMU sensors 5 is arranged on both the first surface 8 and the second surface 9.

Among the plurality of IMU sensors 5, the IMU sensors 5 arranged on the first surface 8 are referred to as first IMU sensors 11. Among the plurality of IMU sensors 5, the IMU sensors 5 arranged on the second surface 9 are referred to as second IMU sensors 12.

The number of the first IMU sensors 11 arranged on the first surface 8 and the number of the second IMU sensors 12 arranged on the second surface 9 are not limited. It is also possible for one first IMU sensor 11 to be arranged on the first surface 8 and/or for one second IMU sensor 12 to be arranged on the second surface 9.

Therefore, it can be said that the sensor apparatus 100 according to the present embodiment includes one or more first IMU sensors 11 arranged on the first surface 8 and one or more second IMU sensors 12 arranged on the second surface 9.

As shown in FIG. 2A, in the present embodiment, the plurality of first IMU sensors 11 are arranged on the first surface 8. Specifically, 16 first IMU sensors 11 are arranged.

As shown in FIG. 2B, 16 second IMU sensors 12 are arranged on the second surface 9.

Thus, in the example shown in FIGS. 2A and 2B, the same number of IMU sensors 5 are arranged on the first surface 8 and the second surface 9, respectively.

Since the plurality of IMU sensors 5 are arranged on both the first surface 8 and the second surface 9 of the sensor substrate 7, it is possible to increase the number of IMU sensors 5 without increasing the size of the apparatus. Thus, while reducing the size of the apparatus, it is possible to improve the measurement accuracy.

Figure 3:
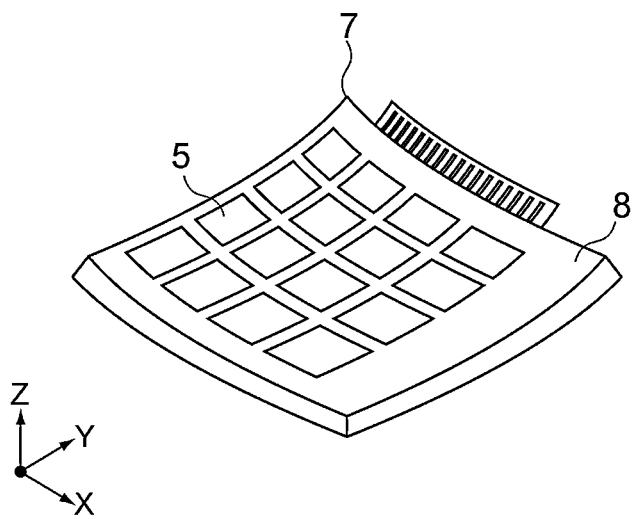
FIG. 3 is a diagram for explaining an effect of heat on the sensor substrate.

FIG. 3 is a diagram for explaining an effect of heat on the sensor substrate 7.

For example, the plurality of IMU sensors 5 is arranged only on the first surface 8 of the sensor substrate 7 (in FIG. 3, IMU sensors 5 is simplified and shown).

In this case, due to a difference between a coefficient of linear expansion of the sensor substrate 7 and a coefficient of linear expansion of each of the plurality of IMU sensors 5, there is a possibility that the sensor substrate 7 is deformed.

For example, the coefficient of linear expansion of the sensor substrate 7 is greater than the coefficient of linear expansion of each IMU sensor 5. In this case, the sensor substrate 7 has a greater coefficient of thermal expansion than each IMU sensor 5, there is a possibility that the sensor substrate 7 is bent toward the side where the IMU sensors 5 are arranged.

Then, as shown in FIG. 3, the posture of each of the plurality of IMU sensors 5 arranged on the first surface 8 of the sensor substrate 7 is inclined. The inclination is generated depending on a deformation state of the sensor substrate 7 and a position of each IMU sensor 5.

Then, an error is included in the detection result detected by each IMU sensor 5. As a result, the angular velocity and the acceleration calculated based on the plurality of detection results have values with low accuracy including errors.

Incidentally, in FIG. 3, so as to easily visually grasp the effect of heat, it is illustrated emphasizing the deformation of the sensor substrate 7. In practice, the thermal deformation may be of a magnitude that is not visible to the human eyes. Even such a microscopic deformation will affect the accuracy of the detection result of each IMU sensor 5, thereby reducing the accuracy of the angular velocity and the acceleration calculated based on the plurality of detection results.

In the present embodiment, as shown in FIGS. 2A and 2B, the plurality of IMU sensors (first IMU sensors 11, second IMU sensors 12) is arranged on both the first surface 8 and the second surface 9 of the sensor substrate 7.

Therefore, stresses generated in the sensor substrate 7 by heat, i.e., a stress to bend the sensor substrate 7 toward a first surface 8 side (hereinafter, referred to as a first stress) and a stress to bend sensor substrate 7 toward a second surface 9 side (hereinafter, referred to as a second stress) cancel each other. That is, it is possible to be offset (cancel) the first stress and the second stress.

As a result, it is possible to sufficiently suppress the effect of heat due to the difference between the coefficient of linear expansion of the sensor substrate 7 and the coefficient of linear expansion of each of the plurality of IMU sensors (first IMU sensors 11, second IMU sensors 12).

For example, when the IMU sensors 5 each having an equal configuration are used as the first IMU sensors 11 and the second IMU sensors 12, a magnitude relationship between the coefficient of linear expansion of each first IMU sensor 11 and the coefficient of linear expansion of the sensor substrate 7 and a magnitude relationship between the coefficient of linear expansion of each second IMU sensor 12 and the coefficient of linear expansion of the sensor substrate 7 is equal to each other. Therefore, it is possible to cancel the first stress and the second stress generated depending on the difference in coefficients of linear expansion.

Needless to say, it is not limited thereto, and the IMU sensors 5 having different configurations from each other are used as the first IMU sensors 11 and the second IMU sensors 12. Even in this case, by equalizing the magnitude relationships of the coefficients of linear expansion with respect to the sensor substrate 7, it is possible to sufficiently suppress the effect of heat due to the difference in the coefficients of linear expansion.

Distribution of heat of the sensor substrate 7 in which the plurality of first IMU sensors 11 and the plurality of second IMU sensors 12 are arranged depends on a use state of the sensor apparatus 100, an external temperature, an internal configuration for realizing the control circuit unit 6 or the like. For example, when the FPGA (control circuit unit 6) or the like is arranged on the sensor substrate 7, heat generated from the FPGA or the like may affect thereon, and the distribution of heat generated is changed by the position, etc. of the FPGA or the like.

In the sensor apparatus 100 according to the present embodiment, not depending on the distribution of heat of the sensor substrate 7, it is possible to cancel the stresses from both the first surface 8 and the second surface 9, thereby sufficiently suppressing the deformation of the sensor substrate 7.

Thus, it is possible to sufficiently suppress the inclination of the posture of each of the plurality of IMU sensors 5. As a result, based on the plurality of detection results outputted from the plurality of IMU sensors 5, it is possible to realize a highly accurate inertial measurement.

[Arrangement Configuration of First IMU Sensor and Second IMU Sensor]

Specific examples of an arrangement configuration of the plurality of first IMU sensors 11 arranged on the first surface 8 (hereinafter, referred to as a first arrangement configuration) and an arrangement configuration of the plurality of second IMU sensors 12 arranged on the second surface 9 (hereinafter, referred to as a second arrangement configuration) will be described.

The "arrangement configuration" includes the number of the IMU sensors 5 arranged on arrangement surfaces (first surface 8, second surface 9), the positions of the IMU sensors 5 in the arrangement surfaces, various parameters and states relating to the arrangements, etc. For example, the position of each of the plurality of IMU sensors 5 in the arrangement surface, a positional relationship between each other, arrangement states, etc. are also included in the "arrangement configuration".

For example, by corresponding the first arrangement configuration and the second arrangement configuration to each other, it is possible to cancel the first stress and the second stress and to improve an effect of suppressing the deformation of the sensor substrate 7 (hereinafter referred to as a deformation suppressing effect).

In addition, when the first arrangement configuration and the second arrangement configuration are equal to each other, it is possible to improve the deformation suppressing effect. Note that a configuration in which the first arrangement configuration and the second arrangement configuration are equal to each other is included in a configuration in which the first arrangement configuration and the second arrangement configuration correspond to each other.

[Number of IMU Sensors]

By corresponding the number of the first IMU sensors 11 arranged on the first surface 8 and the number of the second IMU sensors 12 arranged on the second surface 9 each other, it is possible to correspond the first arrangement configuration and the second arrangement configuration to each other.

For example, when the plurality of first IMU sensors 11 are arranged on the first surface 8, the plurality of second IMU sensors 12 are arranged on the second surface 9 in the number corresponding to the number of the plurality of first IMU sensors 11.

For example, as shown in FIGS. 2A and 2B, when the number of the plurality of second IMU sensors 12 is the same as the number of the plurality of first IMU sensors 11, it can be said that the number of the first IMU sensors 11 and the number of the second IMU sensors 12 correspond to each other. When the number of the first IMU sensors 11 is the same as the number of the second IMU sensors 12, it is possible to exhibit a high deformation suppressing effect.

The configuration in which the number of the first IMU sensors 11 and the number of the second IMU sensors 12 correspond to each other is not limited to the case where the number of the first IMU sensor 11 is the same as the number of the second IMU sensors 12.

For example, 16 first IMU sensors 11 are arranged on the first surface 8, and 15 (or 17) second IMU sensors 12 are correspondingly arranged on the second surface 9. Even in such a configuration, it is possible to cancel the first stress and the second stress, it is possible to exert the deformation suppressing effect.

The configuration in which the number of the first IMU sensors 11 and the number of the second IMU sensors 12 correspond to each other includes any configuration in which the number of the second IMU sensors 12 is defined with reference to the number of the first IMU sensors 11 in a range in which the deformation suppressing effect is exhibited. It should be appreciated that any configuration in which the number of first IMU sensors 11 is defined with reference to the number of second IMU sensors 12 is also included.

[Position of IMU Sensor]

By corresponding the positions of the first IMU sensors 11 arranged on the first surface 8 and the positions of the second IMU sensors 12 arranged on the second surface 9 correspond to each other, it is possible to correspond the first arrangement configuration and the second arrangement configuration to each other.

For example, the plurality of first IMU sensors 11 are arranged at predetermined positions on the first surface 8. The plurality of second IMU sensors 12 are arranged on the second surface 9 at the positions corresponding to the positions of the plurality of first IMU sensors 11 on the first surface 8.

Hereinafter, the configuration example in which the positions of the plurality of first IMU sensors 11 and the positions of the plurality of second IMU sensors 12 correspond.

Configuration Example A

The positions of the plurality of first IMU sensors 11 on the first surface 8 and the positions of the plurality of second IMU sensors 12 on the second surface 9 are equal to each other.

For example, as shown in FIGS. 2A and 2B, when the sensor substrate 7 is turned over, the configuration in which the positions of the first IMU sensors 11 and the positions of the second IMU sensors 12 are equal to each other is exemplified.

Incidentally, it also includes the case that, by changing the direction after turning over the sensor substrate 7, the positions of the first IMU sensors 11 and the positions of the second IMU sensors 12 are equal.

Configuration Example B

Figure 4A:
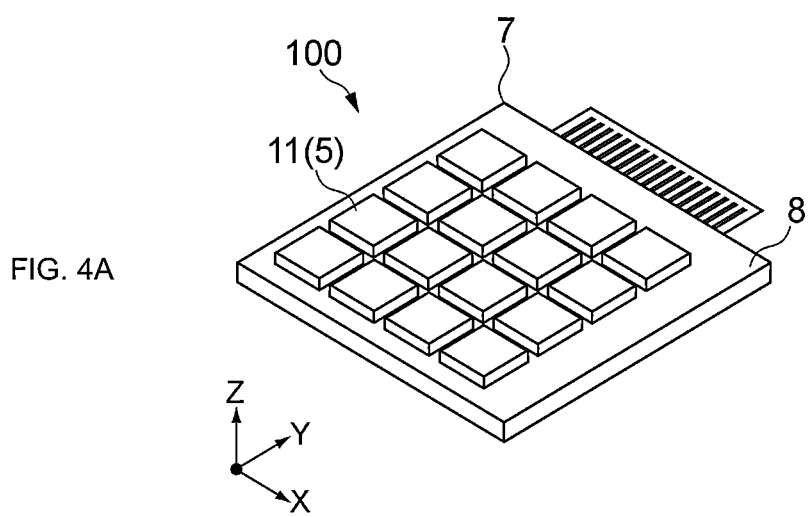
FIGS. 4A and 4B are schematic diagrams showing arrangement examples of a plurality of IMU sensors.
Figure 4B:
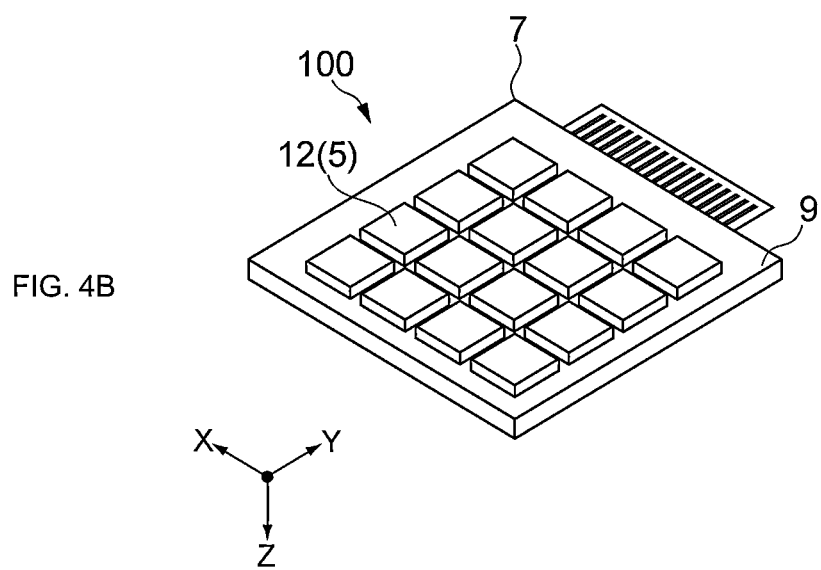

As shown in FIGS. 4A and 4B, the plurality of second IMU sensors 12 are arranged on the second surface 9 at the positions opposite to the positions of the plurality of first IMU sensors 11 on the first surface 8. That is, the second IMU sensors 12 are arranged opposite to (back side) the first IMU sensors 11.

Configuration Example C

The following configuration can also be included: i.e., when viewing the first surface 8 side and the second surface 9 side by turning over the sensor substrate 7 in a state of being inverted from each other, the positions of the first IMU sensors 11 and the positions of the second IMU sensors 12 are equal to each other.

It should be noted that there may be cases where two or more of the configuration examples A to C are established at the same time.

For example, when the number of the first IMU sensors 11 and the number of the second IMU sensors 12 are equal to each other and any one of the configuration examples A to C is established, it can be said that the first arrangement configuration and the second arrangement configuration are equal to each other.

Even when the number of the first IMU sensors 11 and the number of the second IMU sensors 12 are different, for example, when the configuration example B is established, the case is included in the configuration in which the positions of the plurality of first IMU sensors 11 and the positions of the plurality of second IMU sensors 12 correspond.

It should be appreciated that the configuration in which the positions of the plurality of first IMU sensors 11 and the positions of the plurality of second IMU sensors 12 correspond to each other is not limited to the configuration examples A to C. For example, any configuration called front-back symmetry may be employed. Note that the configuration examples A to C may be referred to as the front-back symmetry in some cases.

By corresponding or equalizing the arrangement configuration of the first IMU sensors 11 with respect to the first surface 8 and the arrangement configuration of the second IMU sensors 12 with respect to the second surface 9 to each other, it is possible to sufficiently cancel the first stress and the second stress and to sufficiently exhibit the deformation suppressing effect on the sensor substrate 7.

As a result, it is possible to improve the measurement accuracy while reducing the size of the apparatus.

[Arrangement Configuration for Each Surface]

For each of the first surface 8 and second surface 9, it is also effective to arrange the first IMU sensors 11 and second IMU sensors 12 in a balanced manner, in order to increase the deformation suppressing effect.

For example, the plurality of IMU sensors 5 is arranged so as to be symmetrical with respect to predetermined reference positions of the arrangement surfaces (first surface 8, second surface 9). The predetermined reference positions, for example, include center positions of the arrangement surfaces and positions in the vicinity of the center positions. In addition, the reference positions may be arbitrarily set based on shapes (external shapes) of the arrangement surfaces or the like.

In addition, as the configuration in which the IMU sensors 5 are symmetrically arranged (herein referred to as symmetry arrangement), for example, the following examples are given.

Linear symmetry: Arrangement that is linear symmetric with respect to a predetermined line passing through a reference position.

Point symmetry: Arrangement having similar arrangement when rotating 180° around the reference position.

Rotation symmetry: Arrangement having similar arrangement when rotating (360/n)° (n is an integer of 2 or more) around the reference position. When n=1, it is equivalent to linear symmetry. When n=2, it is equivalent to point symmetry.

In addition, various configurations may be employed including a configuration in which the plurality of IMU sensors 5 are arranged in a balanced manner with respect to the arrangement surface such as a radially arranging configuration and a configuration in which dispersion of density distribution is small.

Figure 5A:
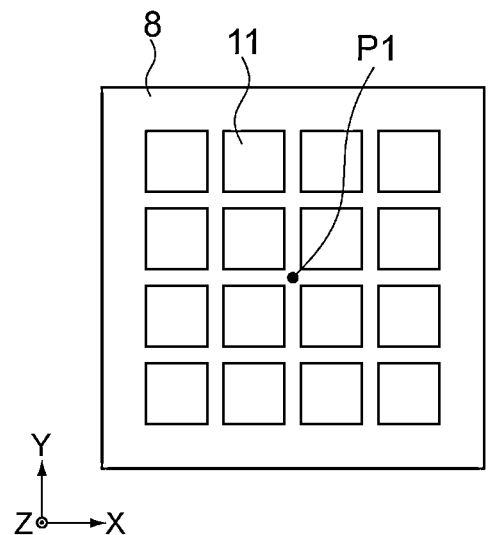
FIGS. 5A, 5B, and 5C are schematic diagrams showing examples of a symmetry arrangement.
Figure 5B:
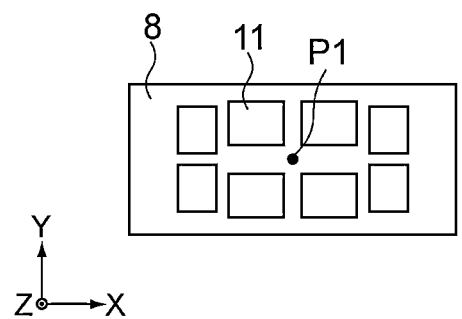
Figure 5C:
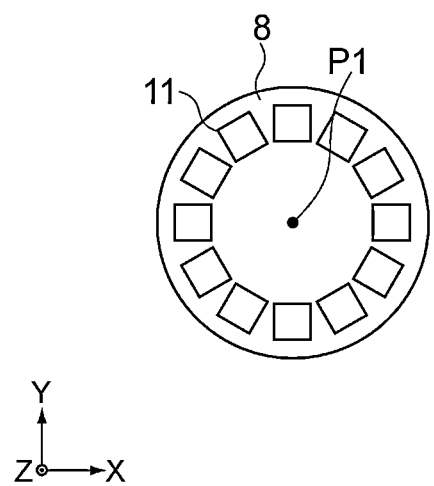

FIGS. 5A, 5B, and 5C are schematic diagrams showing examples of the symmetry arrangement.

For example, a predetermined reference position (hereinafter, referred to as a first reference position P1) is set on the first surface 8. Then, the plurality of first IMU sensors 11 are arranged symmetrically with reference to the first reference position P1.

In the example shown in FIG. 5A, the first reference position P1 is set at the center of the first surface 8, and the first IMU sensors 11 are arranged so as to be linear symmetrical with respect to a line parallel to the X-axis passing through the first reference position P1. In the example shown in FIG. 5A, it also has an arrangement which is linear symmetrical with respect to a line parallel to the Y-axis passing through the first reference position P1. Furthermore, when rotated by 90° around the first reference position P1, it has the same arrangement configuration.

Therefore, it can be said that the first arrangement configuration shown in FIG. 5A is a linear symmetry, point symmetry, rotation symmetry arrangement configuration with reference to the first reference position P1.

It can also be said that, in the arrangement configuration shown in FIG. 5A, the same number of the first IMU sensors 11 is arranged along the two axes perpendicular to each other (X-axis and Y-axis) through the first reference position P1.

In the example shown in FIG. 5B, the first reference position P1 is set at the center of the first surface 8, the first IMU sensors 11 are arranged so as to be linear symmetrical with respect to a line parallel to the X-axis passing through the first reference position P1. In the example shown in FIG. 5B, it also has an arrangement which is linear symmetrical with respect to a line parallel to the Y-axis passing through the first reference position P1. Furthermore, when rotated by 180° around the first reference position P1, it has the same arrangement configuration.

Therefore, it can be said that the first arrangement configuration shown in FIG. 5B is a linear symmetry, point symmetry, and rotation symmetry arrangement configuration with reference to the first reference position P1.

In the example shown in FIG. 5C, the first reference position P1 is set at the center of the first surface 8, when rotated by 30° around the first reference position P1, the first IMU sensors 11 are arranged such that it has the same arrangement configuration.

Therefore, it can be said that the first arrangement configuration shown in FIG. 5C is a point symmetry and rotation symmetry arrangement configuration with reference to the first reference position P1.

It can also be said that, in the arrangement configuration shown in FIG. 5C, the first IMU sensors 11 are arranged at equal intervals on a circumference around the first reference position P1.

Alternatively, an arbitrary symmetry arrangement may be employed.

It is possible to arrange the second IMU sensors 12 in a similar symmetry arrangement with respect to the second surface 9. For example, a predetermined reference position (hereinafter, referred to as a second reference position P2) is set on the second surface 12. Then, the plurality of second IMU sensors 12 are arranged symmetrically with reference to the second reference position P2.

For example, the symmetry arrangement of the second IMU sensors 12 is set so as to correspond to the symmetry arrangement of the first IMU sensors 11. Thus, as described above, the first arrangement configuration and the second arrangement configuration correspond to each other.

For example, the second reference position P2 is set on the second surface 9 so as to correspond to the first reference position P1 set on the first surface 8. Then, with reference to the second reference position P2, the second IMU sensors 12 are arranged symmetrically.

For example, it is assumed that the first IMU sensors 11 are arranged in the symmetry arrangement as shown in FIG. 5A. In this case, the second reference position P2 is set at the center of the second surface 9 as the reference position corresponding to the first reference position P1. The second IMU sensors 12 are arranged so as to have the same configuration as the first arrangement configuration shown in FIG. 5A. This realizes a configuration in which the first arrangement configuration and the second arrangement configuration are equal to each other.

Similarly, in the examples shown in FIGS. 5B and 5C, the second reference position P2 is set at the center of the second surface 9. The second IMU sensors 12 are arranged on the second surface 9 such that the symmetry arrangement shown in FIGS. 5B and 5C are provided.

Thus, by arranging a balanced IMU sensors 5 with respect to the first surface 8 and second surface 9, it is possible to suppress variations in the stresses generated by the difference in the coefficients of linear expansion of the sensor substrate 7 and the IMU sensors 5. For example, it is possible to suppress the stress that causes a complicated deformation such that the sensor substrate 7 is twisted. As a result, it is possible to increase a cancellation effect of the first stress and the second stress and to improve the deformation suppressing effect.

[Electronic Components Other than IMU Sensor]

On the first surface 8 and the second surface 9 of the sensor substrate 7, electronic components other than the IMU sensors 5 (first IMU sensor 11, second IMU sensor 12) are often arranged. For example, an active component such as a diode and a transistor (active element), a passive component such as a resistor and a coil (passive element), or auxiliary components such as a relay and a switch may be arranged.

An arrangement configuration of these other electronic components is appropriately set. For example, other electronic components are arranged in a balanced manner with respect to the arrangement surface. Thus, it is possible to suppress variations in the stresses generated by the difference in the coefficients of linear expansion of the sensor substrate 7 and other electronic components, and to improve the deformation suppressing effect on the sensor substrate 7.

Figure 6A:
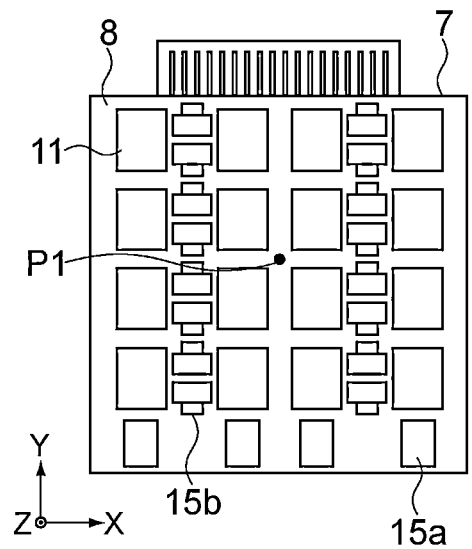
FIGS. 6A, 6B, and 6C are schematic diagrams showing arrangement examples of other electronic component.
Figure 6B:
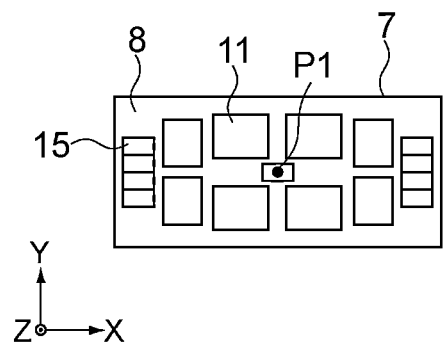
Figure 6C:
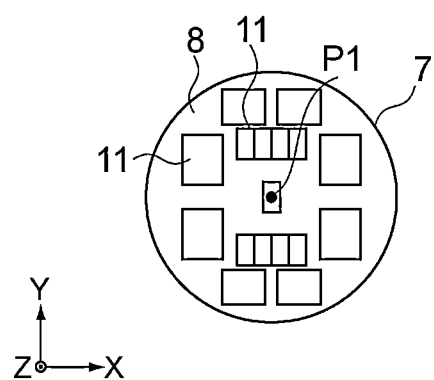

FIGS. 6A, 6B, and 6C are schematic diagrams showing an arrangement examples of other electronic component.

In the example shown in FIG. 6A, 16 first IMU sensors 11 are symmetrically arranged on the first surface 8 with respect to the first reference position P1. As the other electronic components 15, four electronic components 15a and 16 electronic components 15b are arranged.

For example, the four electronic components 15a and the 16 electronic components 15b are arranged symmetrically with reference to the first reference position P1.

The four electronic components 15a are arranged so as to be linear symmetrical with respect to a line parallel to the Y-axis through the first reference position P1. The 16 electronic components 15b are arranged so as to be point symmetry (rotation symmetry) with reference to the first reference position P1 (linear symmetry also holds).

Thus, by arranging the electronic components 15a and the electronic components 15b, it is possible to improve the deformation suppressing effect on the sensor substrate 7. Also, with respect to the second surface 9, the electronic components 15a and the electronic components 15b are similarly arranged. Thus, it is possible to increase the cancellation effect of the first stress and the second stress, and to improve the deformation suppressing effect.

In the example shown in FIG. 6B, eight first IMU sensors 11 are arranged symmetrically with reference to the first reference position P1. As the other electronic components, nine electronic components 15 are arranged.

Eight of the nine electronic components 15 are arranged four by four so as to be point symmetry (rotation symmetry) at left and right ends of the first surface 8 with reference to the first reference position P1. One extra electronic component 15 is arranged on the first reference position P1. Such an arrangement is also included in the symmetry arrangement. That is, in the example shown in FIG. 6B, in order to realize the symmetry arrangement, it can be said that the position of the extra one electronic component 15 is appropriately set.

With such an arrangement, it is possible to improve the effect of suppressing deformation of the sensor substrate 7. Similarly, by arranging the other electronic components 15 on the second surface 9, a high deformation suppressing effect can be exhibited.

In the example shown in FIG. 6C, eight first IMU sensors 11 are arranged symmetrically with reference to the first reference position P1. As the other electronic components, nine electronic components 15 are arranged.

Eight of the nine electronic components 15 are arranged four by four so as to be point symmetry (rotational symmetry) at inner positions from the first IMU sensors 11 with reference to the first reference position P1. One extra electronic component 15 is arranged on the first reference position P1. Such an arrangement is also included in the symmetry arrangement. That is, in the example shown in FIG. 6C, in order to realize the symmetry arrangement, it can be said that the position of the extra one electronic component 15 is appropriately set.

With such an arrangement, it is possible to improve the effect of suppressing deformation of the sensor substrate 7. Similarly, by arranging the other electronic components 15 on the second surface 9, a high deformation suppressing effect can be exhibited.

In addition, for other electronic components, any symmetry arrangements may be employed.

[Dummy Components]

FIGS. 7A and 7B are schematic diagrams showing arrangement examples of dummy components 17.

The dummy components 17 are components that can be regarded as equivalent to the IMU sensors 5 in terms of the stress generated due to heat. For example, components each having a coefficient of linear expansion equal to that of each IMU sensor 5 may be used. Alternatively, electronic components or the like that can be made structurally equivalent to the IMU sensors 5 may be used.

Components or the like that do not have any particular function with respect to the operation of the sensor apparatus 100 may be used as the dummy members. Alternatively, electronic components or the like each having a predetermined function with respect to the operation of the sensor apparatus 100 may be used as the dummy components 17.

For example, it is also possible to arrange the electronic components 15 that can be made to be equivalent to the IMU sensors 5 as the dummy components 17 among the other electronic components 15 described above. The specific configuration of the other dummy components 17 is not limited and the other dummy components 17 may be arbitrarily designed.

For example, the dummy components 17 are arranged so as to be a feasible symmetry arrangement by matching with the IMU sensors 5 arranged on the arrangement surface (first surface 8, second surface 9). Thus, it is possible to suppress variations in the stresses due to heat, and to improve the deformation suppressing effect. Needless to say, the arrangement configuration of the dummy components 17 is not limited.

In the example shown in FIG. 7A, the plurality of first IMU sensors 11 is arranged on the first surface 8. Specifically, 16 first IMU sensors 11 are arranged.

Corresponding to the first arrangement configuration, one or more second IMU sensors 12 and one or more dummy components 17 are arranged on the second surface 9 as shown in FIG. 7B. Specifically, 12 second IMU sensors 12 and four dummy components 17 are arranged.

The 12 second IMU sensors 12 and the four dummy components 17 are arranged on the second surface 9 so as to be at positions equal to the positions of each of the plurality of first IMU sensors 11 on the first surface 8. That is, by combining the 12 second IMU sensors 12 and the four dummy components 17, the IMU sensors 12 and the dummy components 17 are arranged so as to have the same configuration as the first arrangement configuration with respect to the first surface 8.

Incidentally, so as to correspond to the first arrangement configuration of the first IMU sensors 11, the second arrangement configuration and the arrangement configuration of the dummy components 17 of the second IMU sensors 12 (hereinafter referred to as dummy arrangement configuration) are appropriately designed. In this case, each of the second arrangement configuration and the dummy arrangement configuration is also included in the arrangement configuration corresponding to the first arrangement configuration.

Figure 12:
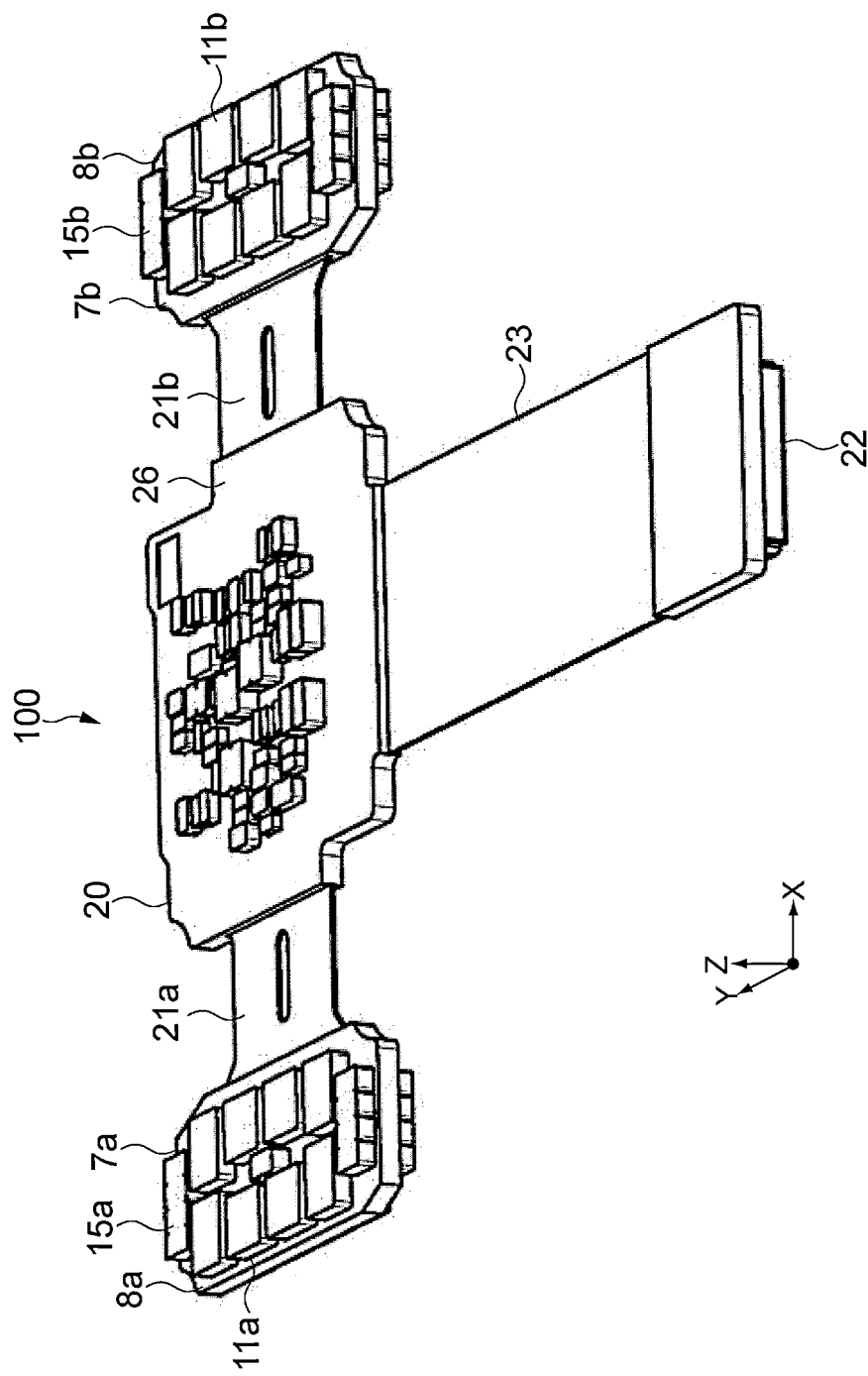
FIG. 12 is a schematic diagram showing other configuration example of the sensor apparatus (before bending).

For example, as in the example shown in FIGS. 7A and 7B, 12 second IMU sensors 12 and four dummy components 17 are arranged corresponding to 16 first IMU sensors 11 so as to have the same total number. That is, the sum of the number of each of the one or more second IMU sensors 12 and the one or more dummy components 17 is the same number as the plurality of first IMU sensors 11.

In this case, the number (12) of the second IMU sensors 12 is included in the number corresponding to the number (16) of the first IMU sensors 11. The number (4) of the dummy components 17 is also included in the number corresponding to the number (16) of the first IMU sensors 11.

It should be appreciated that the dummy components 17 may be arranged on the first surface 8. Also, the dummy components 17 may be arranged on both the first surface 8 and the second surface 9.

That is, any configuration in which one or more dummy components 17 are arranged on at least one of the first surface 8 and the second surface 9 may be employed.

[Separation between Sensor Circuit and Main Substrate]

Figure 8A:
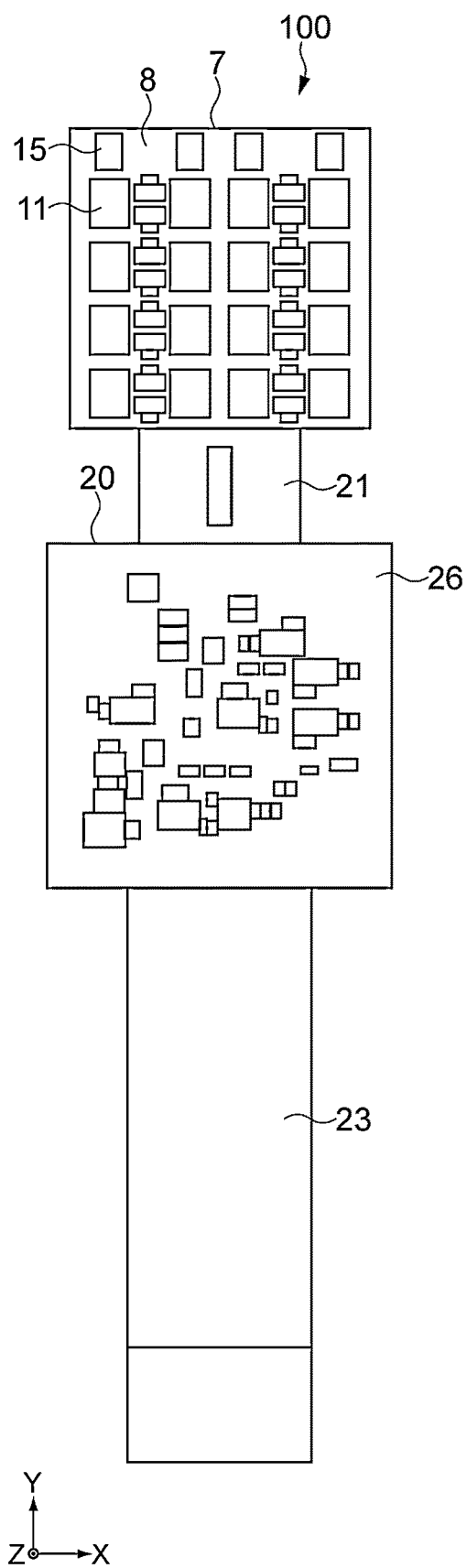
FIGS. 8A and 8B are schematic diagrams showing other configuration example of the sensor apparatus.
Figure 8B:
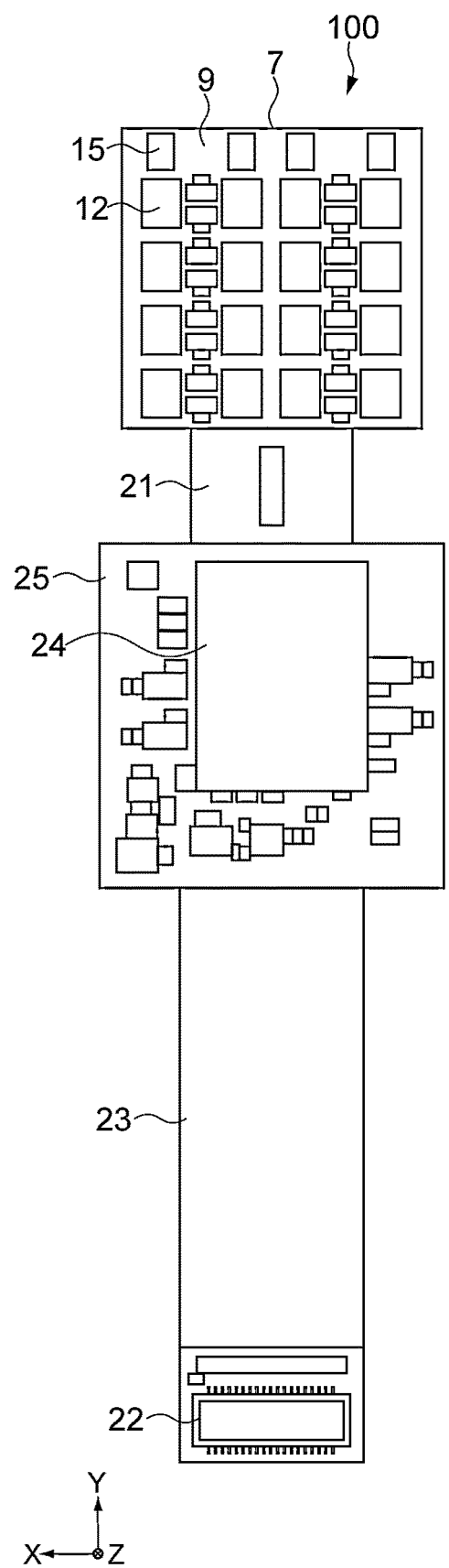

FIGS. 8A and 8B are schematic diagrams showing other configuration example of the sensor apparatus 100.

The sensor apparatus 100 shown in FIGS. 8A and 8B include the sensor substrate 7, the main substrate 20, the flexible substrate (FPC: Flexible Printed Circuit) 21, an external connector 22, and a connector-side flexible substrate 23.

In the present embodiment, each of the sensor substrate 7 and the main substrate 20 is a rigid substrate. Therefore, the sensor apparatus 100 shown in FIGS. 8A and 8B can be said to be formed of a rigid flexible substrate as a whole. Note the main substrate 20 can also be called as a main control substrate.

As the sensor substrate 7, the sensor substrate 7 shown in FIG. 6A is used.

The 16 first IMU sensors 11 and 20 other electronic components 15 (15a and 15b shown in FIG. 6A) are arranged on the first surface 8 of the sensor substrate 7. Similar to the first surface 8, the 16 second IMU sensors 12 and 20 other electronic components 15 are arranged on the second surface 9.

The first arrangement configuration of the first IMU sensors 11 with respect to the first surface 8 and the second arrangement configuration of the second IMU sensors 12 with respect to the second surface 9 are equal to each other.

On the main substrate 20, an FPGA 24 is arranged. That is, on the main substrate 20, the control circuit unit 6 for controlling the operation of each of the plurality of first IMU sensors 11 and the plurality of second IMU sensors 12 is arranged.

The surface on which the FPGA (control circuit unit) 24 of the main substrate 20 is called as a third surface 25. The surface opposite to the third surface 25 is called as a fourth surface 26.

In the example shown in FIGS. 8A and 8B, the sensor substrate 7 and the main substrate 20 are arranged so as to be aligned in one direction (Y direction). The third surface 25 of the main substrate 20 is a surface on the same side as the second surface 9 of the sensor substrate 7. The fourth surface 26 of the main substrate 20 is a surface on the same side as the first surface 8 side of the sensor substrate 7. Needless to say, the present invention is not limited to such a configuration.

The flexible substrate 21 electrically connects the sensor substrate 7 and the main substrate 20. In the present embodiment, the flexible substrate 21 is arranged so as to extend in the Y direction.

A specific configuration of the flexible substrate 21 is not limited, and any configuration may be employed.

The external connector 22 is a connector for connecting the sensor apparatus 7 to an external device or the like. A specific configuration of the external connector 22 is not limited.

A connector-side flexible substrate 23 electrically connects the main substrate 20 and the external connector 22. In the present embodiment, the connector-side flexible substrate 23 is arranged so as to extend in the Y direction.

As shown in FIGS. 8A and 8B, the main substrate 20 and the sensor substrate 7 are separated from each other. That is, the main substrate 20 is formed separately from the sensor substrate 7.

Thus, heat generated from the FPGA 24 or the like of the main substrate 20 is transferred to the sensor substrate 7, it is possible to sufficiently suppress a temperature increase of the sensor substrate 7. As a result, it is possible to sufficiently suppress the generation of stress on the sensor substrate 7 due to heat and to improve the deformation suppressing effect. As a result, it is possible to improve the measurement accuracy of the sensor apparatus 100.

Instead of the FPC, an FFC (Flexible Flat Cable) may be used.

Figure 9A:
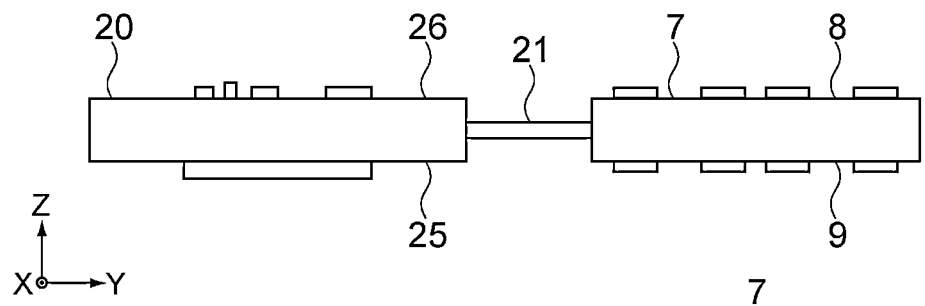
FIGS. 9A, 9B, and 9C are schematic diagrams showing an arrangement example of a sensor substrate 7 with respect to a main substrate.
Figure 9B:
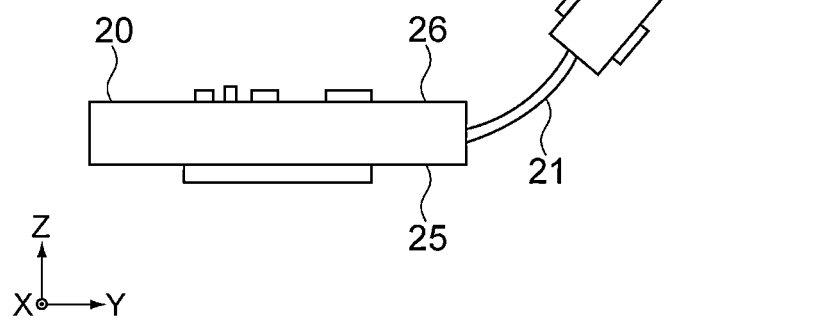
Figure 9C:
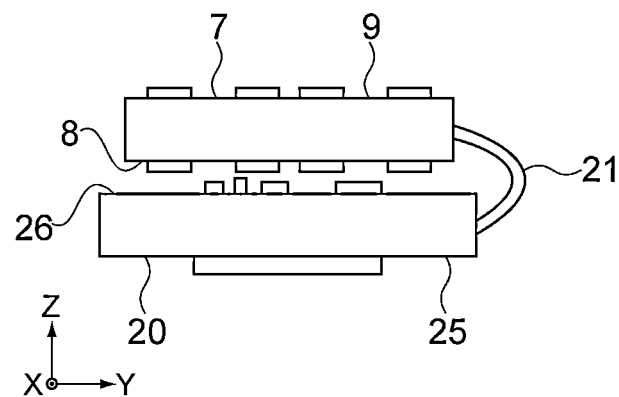

FIGS. 9A, 9B, and 9C are schematic diagrams showing an arrangement example of the sensor substrate 7 with respect to the main substrate 20. In FIGS. 9A, 9B, and 9C, other electronic components 15, the connector-side flexible substrate 23, and the external connector 22 and the like are not shown.

For example, as shown in FIGS. 9A, 9B, and 9C, by bending the flexible substrate 21, the sensor substrate 7 can be arranged at a predetermined position with respect to the main substrate 20.

In the example shown in FIG. 9C, the sensor substrate 7 is arranged at the position where the first surface 8 of the sensor substrate 7 faces the fourth surface 26 of the main substrate 20.

Thus, connecting the main substrate 20 and the sensor substrate 7 which are formed separately by the flexible substrate 21. By bending the flexible substrate 21, the positional relationship between the main substrate 20 and the sensor substrate 7 can be flexibly designed. As a result, it is very advantageous to reduce the size of the sensor apparatus 100.

Figure 10:
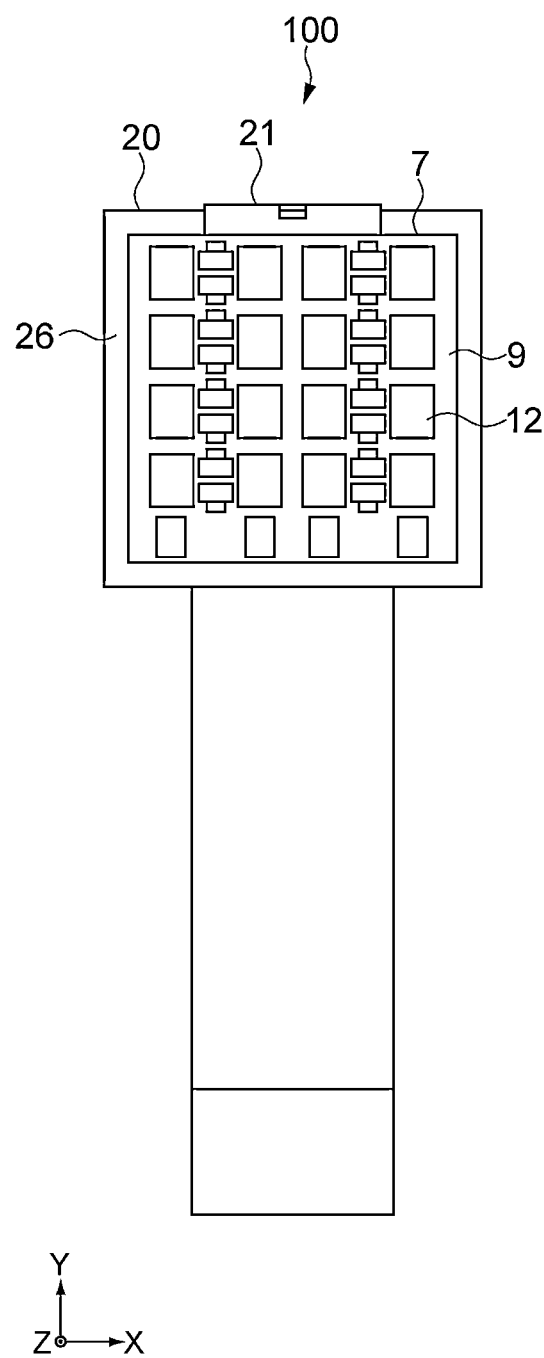
FIG. 10 is a schematic diagram showing the sensor apparatus in the state shown in FIG. 9C.

FIG. 10 is a schematic diagram showing the sensor apparatus 100 in the state shown in FIG. 9C.

As shown in FIG. 10, the sensor substrate 7 is arranged with respect to the main substrate 20 when viewed from a front of the fourth surface 26 of the main substrate 20 such that the entire sensor substrate 7 is included in the region in the fourth surface 26 (such that entire sensor substrate 7 overlaps). Thus, it is possible to sufficiently reduce the size of the sensor apparatus 100 in a plane direction of the main substrate 20 (plane direction of third surface 25 and fourth surface 26 (XY plane direction)).

Also, by sufficiently reducing a distance between the fourth surface 26 of the main substrate 20 and the first surface 8 of the sensor substrate 7 (see FIG. 9C), it is also possible to sufficiently reduce the size of the main substrate 20 in a vertical direction (vertical direction of third surface 25 and fourth surface 26 (Z direction)). As a result, it is possible to reduce an entire size of the sensor apparatus 100.

Note that the arrangement configuration of the main substrate 20 and the sensor substrate 7 realized by bending the flexible substrate 21 is not limited.

For example, the sensor substrate 7 may be arranged such that the first surface 8 of the sensor substrate 7 faces the third surface 25 of the main substrate 20. Also, the sensor substrate 7 may be arranged such that the second surface 9 of the sensor substrate 7 faces the third surface 25 or the fourth surface 26 of the main substrate 20.

In addition, the main substrate 20 and the sensor substrate 7 may be arranged facing each other so as to displace the positions with respect to each other as viewed from the vertical direction of the main substrate 20 (Z direction). For example, the main substrate 20 and the sensor substrate 7 are arranged facing each other as viewed from the Z direction, so as to partially overlap each other. Alternatively, the main substrate 20 and the sensor substrate 7 may be arranged facing each other without overlapping each other when viewed from the Z direction.

Furthermore, a surface direction of the main substrate 20 (surface directions of third surface 25 and fourth surface 26) and a surface direction of the sensor substrate 7 (surface directions of first surface 8 and second surface 9) are not parallel and may be arranged respectively along directions intersecting each other.

For example, the sensor apparatus 100 may be realized in an arrangement relation as shown in FIG. 9B. Since the flexible substrate 21 is used, for example, by a configuration as shown in FIG. 9B, it is also possible to arrange the sensor apparatus 100 in a narrow space.

Furthermore, as shown in FIG. 9A, a configuration that the flexible substrate 21 does not bend may be employed.

Referring to FIGS. 11, 12, 13, 14, 15, 16A, 16B, 17A, and 17B, other configuration examples of the sensor apparatus will be described.

Hereinafter, as to XYZ directions shown in each figure, a description is made taking the X direction as a lateral direction, the Y direction as a depth direction, and the Z direction as a vertical direction. Furthermore, in each figure, a description is made taking a side facing an arrow in the X direction as a right side (opposite side as a left side), a side facing an arrow in the Y direction as a back side (opposite side as a front side), a side facing an arrow in the Z direction as an upper side (opposite side as a lower side).

Needless to say, an orientation in which the sensor apparatus 100 is used is not limited.

Figure 11:
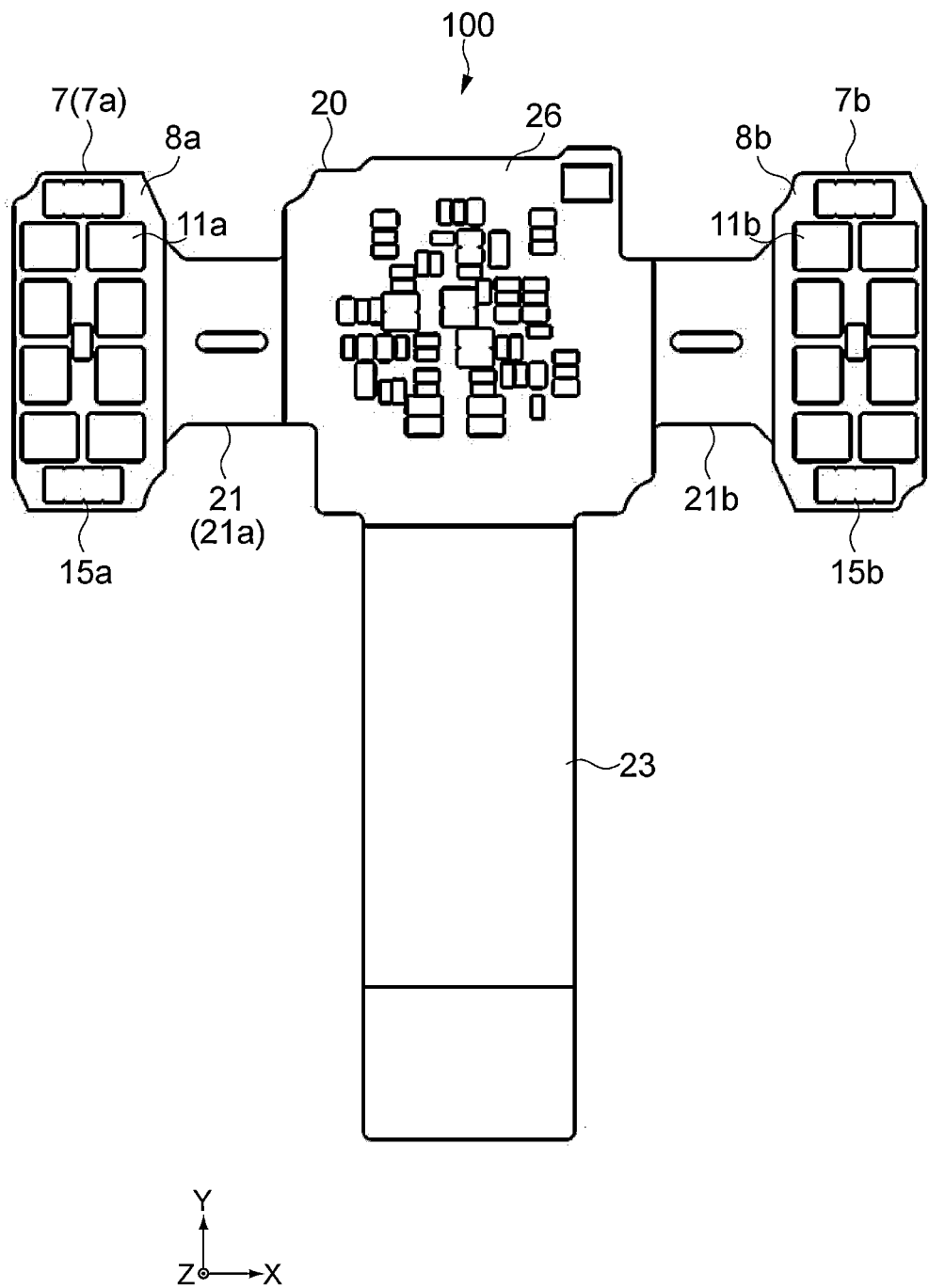
FIG. 11 is a schematic diagram showing other configuration example of the sensor apparatus (before bending).

As shown in FIGS. 11 and 12, the sensor apparatus 100 according to the present embodiment includes the substrate 20, the plurality of sensor substrates 7, the plurality of flexible substrates 21, the external connector 22, and the connector-side flexible substrate 23.

Figure 14:
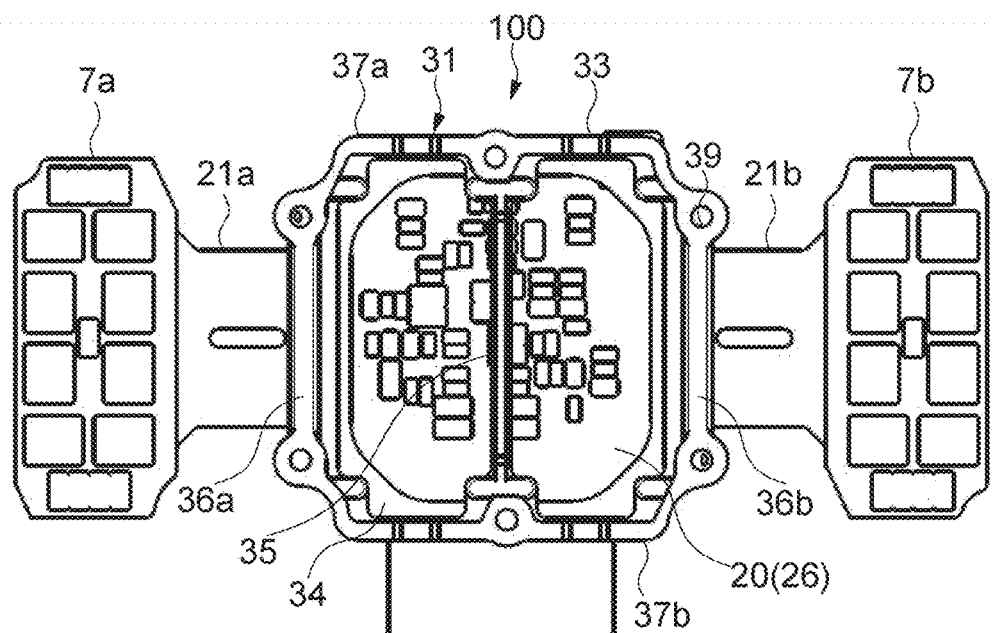
FIG. 14 is a schematic diagram showing other configuration example of the sensor apparatus (lower holder arrangement).
Figure 17B:
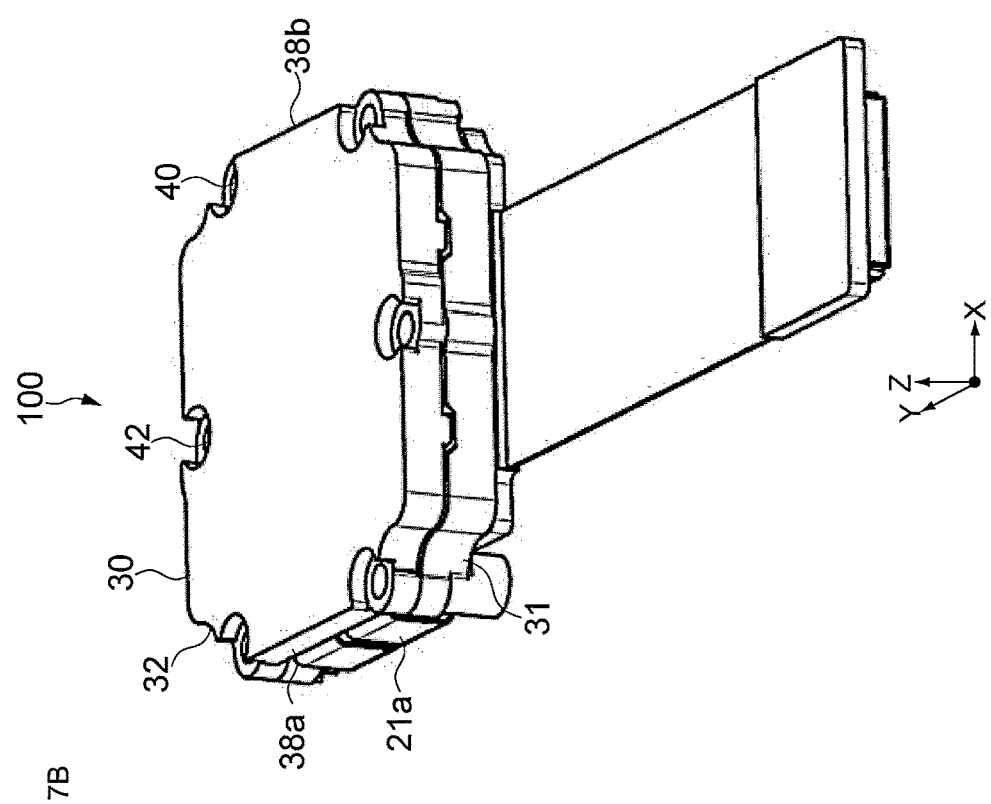
FIGS. 17A and 17B are schematic diagrams showing other configuration example of the sensor apparatus (upper holder arrangement).
Figure 17A:
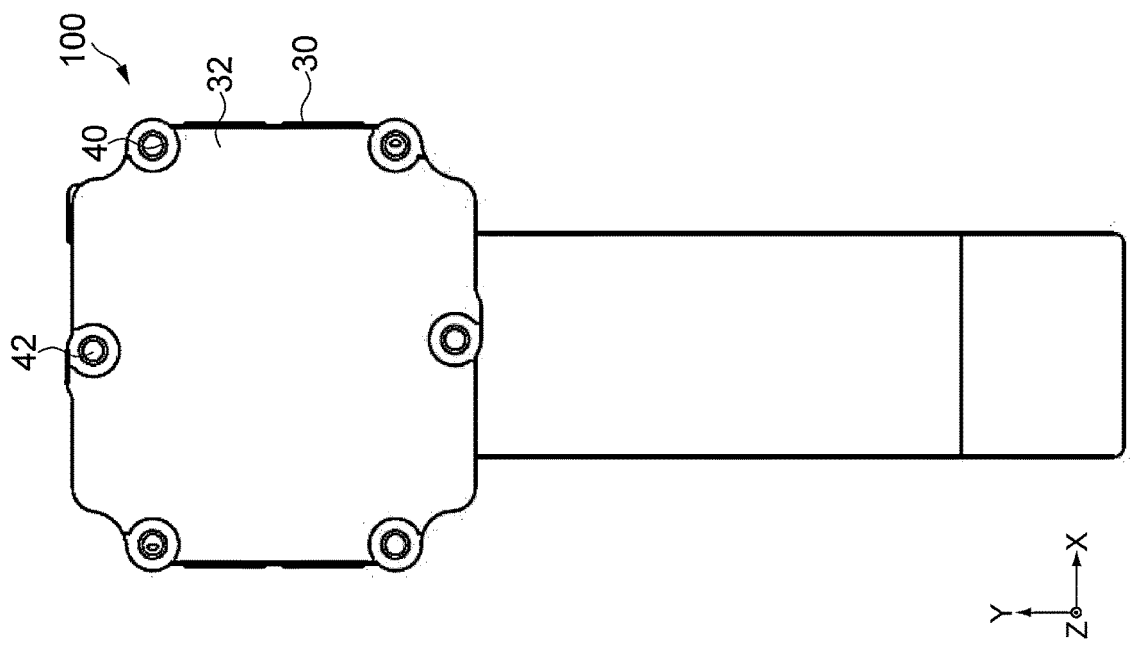

Furthermore, as shown in FIGS. 14, 17A, and 17B, the sensor apparatus 100 has a holder portion 30.

The main substrate 20 and the two sensor substrates 7 are rigid substrates.

Figure 13:
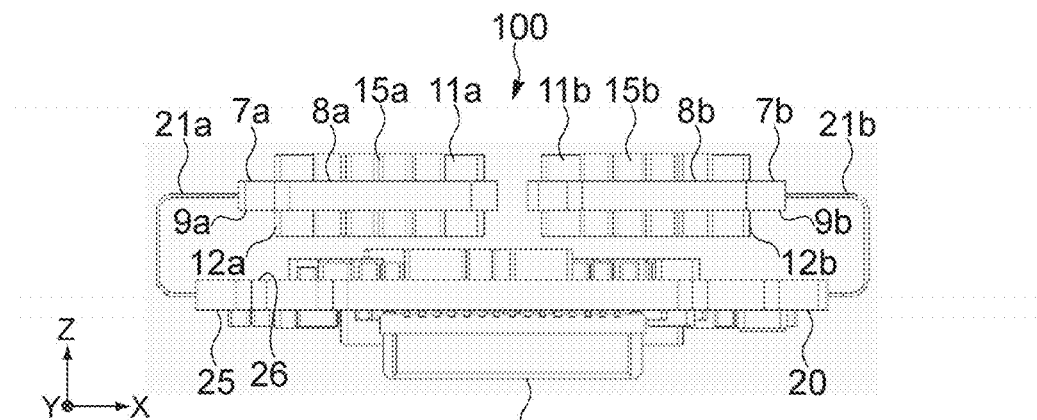
FIG. 13 is a schematic diagram showing other configuration example of the sensor apparatus (after bending).

The main substrate 20 has the third surface 25 on which the FPGA 24 is arranged, and the fourth surface 26 opposite thereto (see FIG. 13).

The two sensor substrates 7 include a first sensor substrate 7a and a second sensor substrate 7b.

In the present embodiment, the first sensor substrate 7a and the second sensor substrate 7b have the same configuration. Furthermore, as the first sensor substrate 7a and the second sensor substrate 7b, the sensor substrate 7 shown in FIG. 6B is used.

On a first surface 8a of the first sensor substrate 7a, eight first IMU sensors 11a and nine other electronic components 15a are arranged. Also, on a second surface 9a of the first sensor substrate 7a, similar to the first surface 8a, eight second IMU sensors 12a and nine other electronic components 15a are arranged (see FIG. 13).

The first arrangement configuration of the first IMU sensors 11a with respect to the first surface 8a and the second arrangement configuration of the second IMU sensors 12a with respect to the second surface 9a are equal to each other.

The second sensor substrate 7b also employs the same configuration as that of the first sensor substrate 7a. As shown in FIG. 11 and the like, the second sensor substrate 7b has a first surface 8b, a second surface 9b, first IMU sensors 11b, second IMU sensors, and other electronic components 15b.

As shown in FIGS. 11 and 12, the first sensor substrate 7a, the main substrate 20, and the second sensor substrate 7b are arranged so as to be aligned in this order along one direction (X direction). The first sensor substrate 7a and the second sensor substrate 7b are arranged at positions being equal distance from the main substrate 20 so as to sandwich the main substrate 20 therebetween.

The first flexible substrate 21a electrically connects the first sensor substrate 7a and the main substrate 20. The second flexible substrate 21b electrically connects the second sensor substrate 7b and the main substrate 20.

The first flexible substrate 21a and the second flexible substrate 21b are arranged so as to extend in the X direction.

As shown in FIG. 11, the first sensor substrate 7a and the second sensor substrate 7b are arranged so as to be symmetrical with respect to the main substrate 20 when viewed from a front of the fourth surface 26 of the main substrate 20. Thus, it is possible to simplify the configuration and the like of a wire and the configuration of the sensor apparatus 100.

The external connector 22 is arranged at a position along the Y direction with respect to the main substrate 20. Therefore, the connector-side flexible substrate 23 is arranged so as to extend in the Y direction.

FIG. 13 is a schematic diagram showing an example of the arrangement of the first sensor substrate 7a and the second sensor substrate 7b with respect to the main substrate 20. FIG. 13 is a diagram viewed from a front of the sensor apparatus 100, and the connector-side flexible substrate 23, the external connector 22 and the like are not shown.

In this embodiment, the first flexible substrate 21a and the second flexible substrate 21b are bent toward a fourth surface 26 side (upper side) of the main substrate 20. The first sensor substrate 7a is arranged such that the first surface 8a of the first sensor substrate 7a faces the fourth surface 26 of the main substrate 20. The second sensor substrate 7b is arranged such that the first surface 8a of the second sensor substrate 7b faces the fourth surface 26 of the main substrate 20.

When viewed from a front of the fourth surface 26 of the main substrate 20, the first sensor substrate 7a and the second sensor substrate 7b are arranged with respect to the main substrate 20 such that the entire the first sensor substrate 7a and the second sensor substrate 7b are included in the region in the fourth surface 26. The first sensor substrate 7a and the second sensor substrate 7b are arranged so as to be symmetrical in the fourth surface 26 of the main substrate 20 (see FIGS. 16A and 16B).

Figure 32:
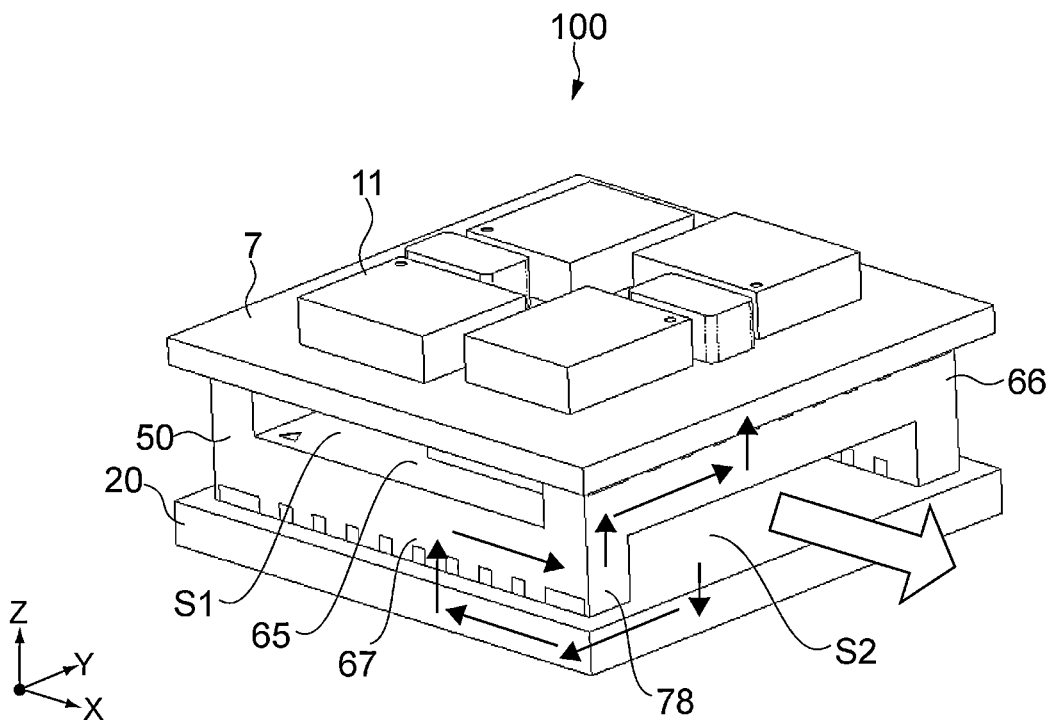
FIG. 32 is a schematic diagram for explaining an effect of heat on the sensor apparatus.

In the configuration shown in FIGS. 8A, 8B, and 32 (16 on each surface) IMU sensors 5 of are arranged on both sides of one sensor substrate 7. On the other hand, in the configuration shown in FIGS. 11, 16A, and 16B (eight on each surface) IMU sensors 5 are arranged on each of the first sensor substrate 7a and the second sensor substrate 7b each having a small size.

By arranging the IMU sensors 5 on the plurality of sensor substrates 7, it is possible to reduce the size of each sensor substrate 7. The smaller the size of the sensor substrate 7 is, the less likely to deform with respect to the stress acting on the sensor substrate 7. As a result, a high deformation suppressing effect is exhibited, which is advantageous for improving the measurement accuracy.

As shown in FIGS. 14, 15, 16A, 16B, 17A, and 17B, the holder portion 30 includes a lower holder 31 and an upper holder 32.

As the lower holder 31 and the upper holder 32, a material which is hardly deformed due to heat is used. For example, a material having a small coefficient of linear expansion, or the like is used. For example, by using a metal material such as aluminum and stainless steel, durability of the sensor apparatus 100 can be improved. It should be appreciated that it is not limited thereto, and a ceramic material, a resin material, or the like may be used.

Figure 15:
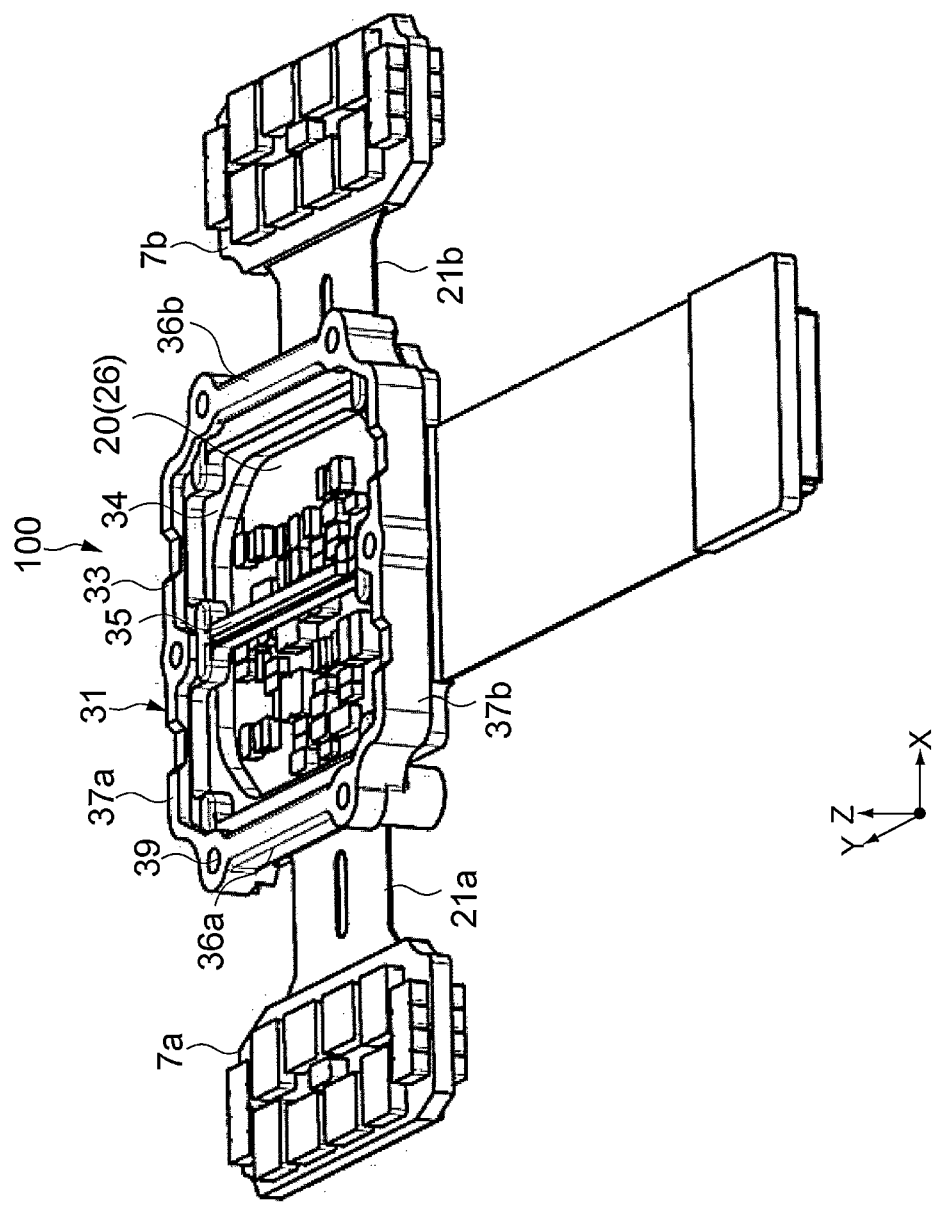
FIG. 15 is a schematic diagram showing other configuration example of the sensor apparatus (lower holder arrangement).

As shown in FIGS. 14 and 15, the lower holder 31 has a frame portion 33 having a hollow inner side, a partition portion 34, and a central pillar portion 35.

As shown in FIG. 14, the frame portion 33 has a substantially rectangular shape when viewed from the Z direction. The frame portion 33 is configured to accommodate the main substrate 20 in a space of an inner side.

The frame portion 33 has a configuration that a first bent portion 36a and a second bent portion 36b facing along the lateral direction (X direction) and a first connection portion 37a and a second connection portion 37b facing along the depth direction (Y direction) are integrally connected.

As shown in FIGS. 14 and 15, the partition portion 34 is configured to extend from an inner peripheral surface toward the inner side of the frame portion 33. In the space of the inner side of the frame portion 33 (space surrounded by frame portion 33), a space of a lower side partitioned by the partition portion 34 becomes a space in which the main substrate 20 is arranged. A space of an upper side partitioned by the partition portion 34 becomes a space in which the first sensor substrate 7a and the second sensor substrate 7b are arranged.

The central pillar portion 35 is arranged in the space of the upper side partitioned by the partition portion 34 of the space inside the frame portion 33. The center pillar portion 35 is provided so as to extend along the depth direction (Y direction) at a center position in the lateral direction (X direction) of the first coupling portion 37a and the second coupling portion 37b of the frame portion 33.

As shown in FIG. 14, the first sensor substrate 7a is arranged in the space between the first bent portion 36a and the central pillar portion 35 of the left side. The second sensor substrate 7b is arranged in the space between the second bent portion 36b and the central pillar portion 35 of the right side.

Six screw holes 39 are formed in the frame portion 33. The screw holes 39 are formed in both ends of the first bent portion 36a in the depth direction, both ends of the second bent portion 36b in the depth direction, and both ends of the central pillar portion 35 in the depth direction.

As shown in FIGS. 14 and 15, the lower holder 31 is attached from an upper side of the fourth surface 26 of the main substrate 20. Conversely, the main substrate 20 is attached from the fourth surface 26 side at a lower side of the lower holder 31.

The main substrate 20 is arranged at a space of a lower side of the frame portion 33 (space of lower side below partition portion 34). The frame portion 33 holds an edge portion of the main substrate 20.

A method of holding the main substrate 20 by the frame portion 33 is not limited, and any method such as fitting, bonding, connecting by screws, and the like may be employed.

As shown in FIGS. 16A and 16B, the first flexible substrate 21a and the second flexible substrate 21b are bent to an upper side.

The first flexible substrate 21a is bent in contact with the first bent portion 36a on the left side of the frame portion 33. Then, the first sensor substrate 7a is arranged in a space of an upper side of the frame portion 33 (space above partition portion 34) and a space between the first bent portion 36a and the central pillar portion 35.

The second flexible substrate 21b is bent in contact with the second bent portion 36b on the right side of the frame portion 33. Then, the second sensor substrate 7b is arranged in the space of the upper side of the frame portion 33 (space above partition portion 34) and the space between the second bent portion 36b and the central pillar portion 35.

As shown in FIGS. 17A and 17B, the upper holder 32 has an external shape equal to the lower holder 31 when viewed from the Z direction. The upper holder 32 has a container shape in which one side is closed in the Z direction and the other side is open.

An inner space of the container shape is configured to be able to accommodate the first sensor substrate 7a and the second sensor substrate 7b held by the frame portion 33. Six screw holes 40 are formed in the edge portion of the upper holder 32 so as to correspond to the six screw holes 39 formed in the frame portion 33.

As shown in FIGS. 17A and 17B, the upper holder 32 is arranged such that the inner space is oriented from the upper side with respect to the lower holder 31. The six screw holes 39 of the frame portion 33 and the six screw holes 40 of the upper holder 32 are aligned and fixed by screws 42.

Thus, the holder portion 30 sufficiently holds the main substrate 20, and the first sensor base 7a and the second sensor substrate 7b.

The first flexible substrate 21a is sufficiently held sandwiched between the first bent portion 36a of the frame portion 33 and the first substrate holding portion 38a corresponding to the left side of the upper holder 32. The second flexible substrate 21b is sufficiently held sandwiched between the second bent portion 36b of the frame portion 33 and the second substrate holding portion 38b corresponding to the right side of the upper holder 32.

For example, when it is desired to fix portions corresponding to four corners of the first sensor substrate 7a and fix portions corresponding to four corners of the second sensor substrate 7b, eight screws (screw holes) are required.

In the sensor apparatus 100 according to the present embodiment, the first sensor substrate 7a and the second sensor substrate 7b are arranged so as to be aligned at left and right of the central pillar portion 35 of the lower holder 31.

Therefore, by screwing at both ends in the depth direction of the central pillar portion 35, it is possible to realize both functions of fixing of the two corners of the right side of the first sensor substrate 7a and fixing of the two corners of the left side of the second sensor substrate 7b. By screwing at both ends of the central pillar portion 35, it is possible to fix both the first sensor substrate 7a and the second sensor substrate 7b in common. As a result, it is possible to sufficiently fix with only six screws and to reduce the number of parts and a cost of parts. In addition, it is very advantageous to reduce the size of the apparatus.

In the sensor apparatus 100 shown in FIGS. 11, 12, 13, 14, 15, 16A, 16B, 17A, and 17B, the first sensor substrate 7a and the second sensor substrate 7b correspond to one or more sensor substrates.

The first flexible substrate 21a and the second flexible substrate 21b correspond to one or more flexible substrates electrically connecting the one or more sensor substrates and the main substrate 20.

The holder portion 30 functions as a holding portion for holding the main substrate 20 and the one or more sensor substrates arranged at the predetermined positions with respect to the main substrate 20 by bending the one or more flexible substrates.

In the sensor apparatus 100 shown in FIGS. 11, 12, 13, 14, 15, 16A, 16B, 17A, and 17B, the first flexible substrate 21a and the second flexible substrate 21b are bent in the same direction (upper side). Then, on the same surface (fourth surface 26) of the main substrate 20, the first sensor substrate 7a and the second sensor substrate 7b are arranged to face each other.

The arrangement configuration of the first sensor substrate 7a and the second sensor substrate 7b with respect to the main substrate 20 is not limited and may be arbitrarily set.

For example, a configuration may be employed in which the first sensor substrate 7a and the second sensor substrate 7b face each other on different surfaces (third surface 25 and the fourth surface 26) of the main substrate 20.

For example, instead of the configuration as shown in FIG. 13, the second flexible substrate 21b may be bent on a third surface 25 side (lower side). The second sensor substrate 7b may be arranged such that the second surface 9b faces the third surface 25 of the main substrate 20.

That is, any configuration may be employed such that the first sensor substrate 7a is arranged at a position facing the third surface 25 and the fourth surface 26 of the main substrate 20 by bending the first flexible substrate 21a, and the second sensor substrate 7b is arranged at a position facing the third surface 25 and the fourth surface 26 of the main substrate 20 by bending the second flexible substrate 21b.

For example, the second sensor substrate 7b is arranged at a position on a surface facing the first sensor substrate 7a selected from the third surface 25 and the fourth surface 26 of the main substrate 20.

For example, the configuration shown in FIG. 13 corresponds to such an arrangement.

Alternatively, the second sensor substrate 7b may be arranged at a position on an opposite surface facing the first sensor substrate 7a selected from the third surface 25 and the fourth surface 26 of the main substrate 20. For example, instead of the configuration shown in FIG. 13, a configuration in which the second sensor substrate 7b faces the third surface 25 of the main substrate 20 corresponds to the configuration.

It should be appreciated that a configuration or the like may be employed such that both or either one of the first sensor substrate 7a and the second sensor substrate 7b do/does not face the main substrate 20. For example, a configuration or the like is also conceivable such that both or either one of the first flexible substrate 21a and the second flexible substrate 21b is not bent.

Figure 18:
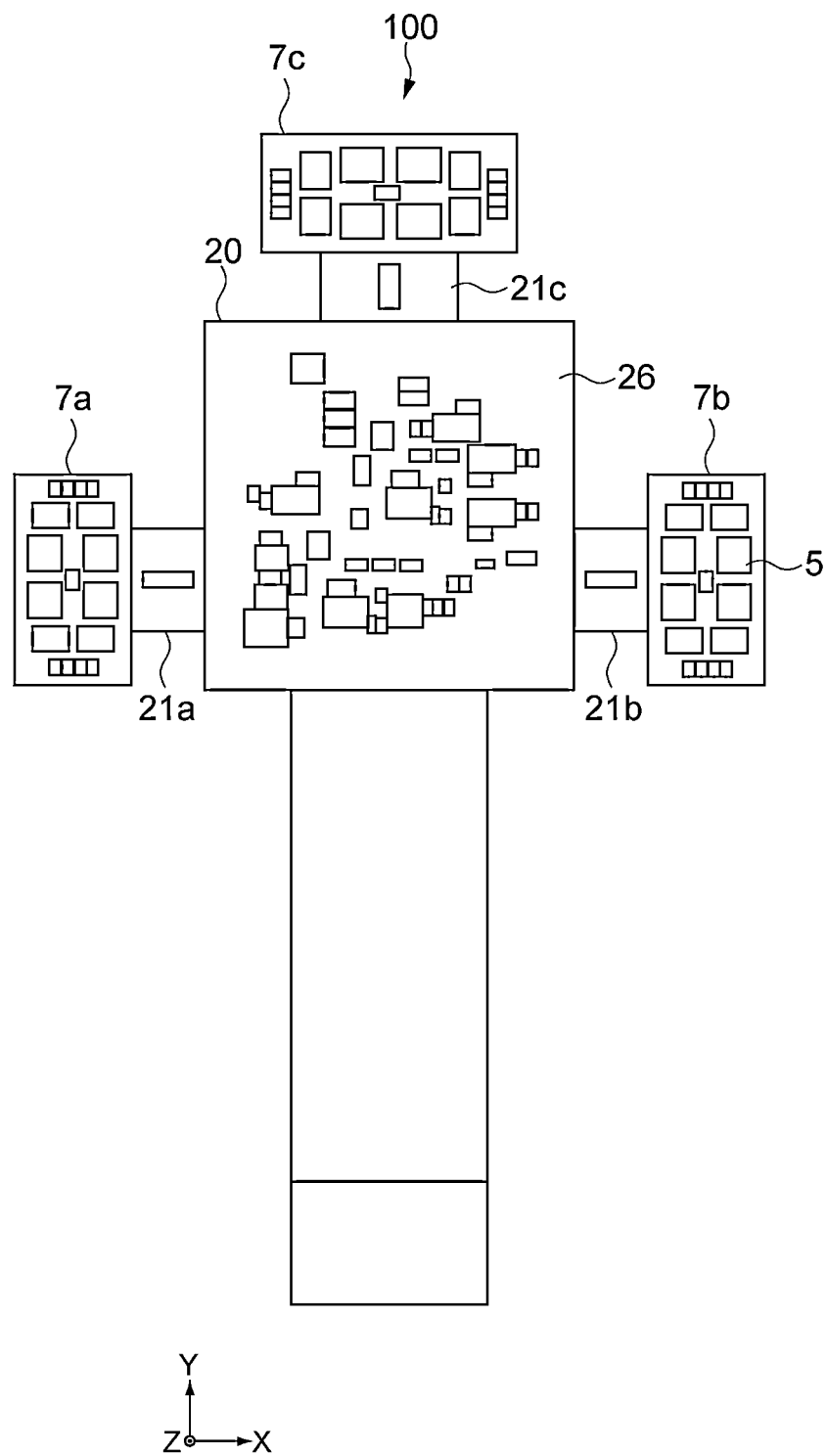
FIG. 18 is a schematic diagram showing other configuration example of the sensor apparatus (before bending).
Figure 19:
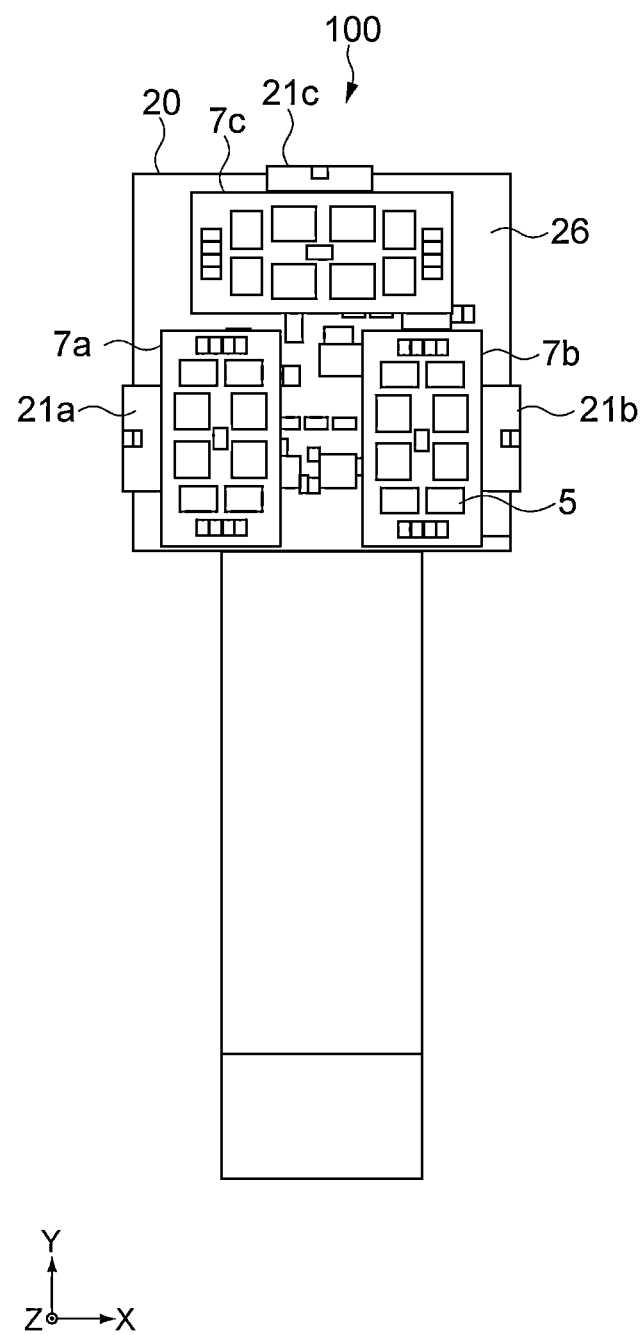
FIG. 19 is a schematic diagram showing other configuration example of the sensor apparatus (after bending).

FIGS. 18 and 19 are schematic diagrams showing other configuration examples of the sensor apparatus.

Each sensor apparatus 100 shown in FIGS. 18 and 19 has one main substrate 20 and three sensor substrates 7a to 7c.

At left and right of the main substrate 20, the first sensor substrate 7a and the second sensor substrate 7b are arranged. The third sensor substrate 7c is arranged on the back side of the main substrate 20. Each of the first to third sensor substrates 7a to 7c is electrically connected to the main substrate 20 by the first to third flexible substrates 21a to 21c.

As shown in FIG. 18, the first to third sensor substrates 7a to 7c are arranged symmetrically with respect to the main substrate 20 when viewed from the Z direction. Thus, it is possible to simplify the configuration and the like of the wire and the configuration of the sensor apparatus 100.

As shown in FIG. 19, the first to third sensor substrates 7a to 7c are arranged so as to face the fourth surface 26 of the main substrate 20 by bending the first to third flexible substrates 21a to 21c.

Thus, it is possible to increase the number of IMU sensors 5 without increasing the size of the sensor apparatus 100. As a result, while reducing the size of the sensor apparatus 100, it is possible to improve the measurement accuracy.

Figure 20:
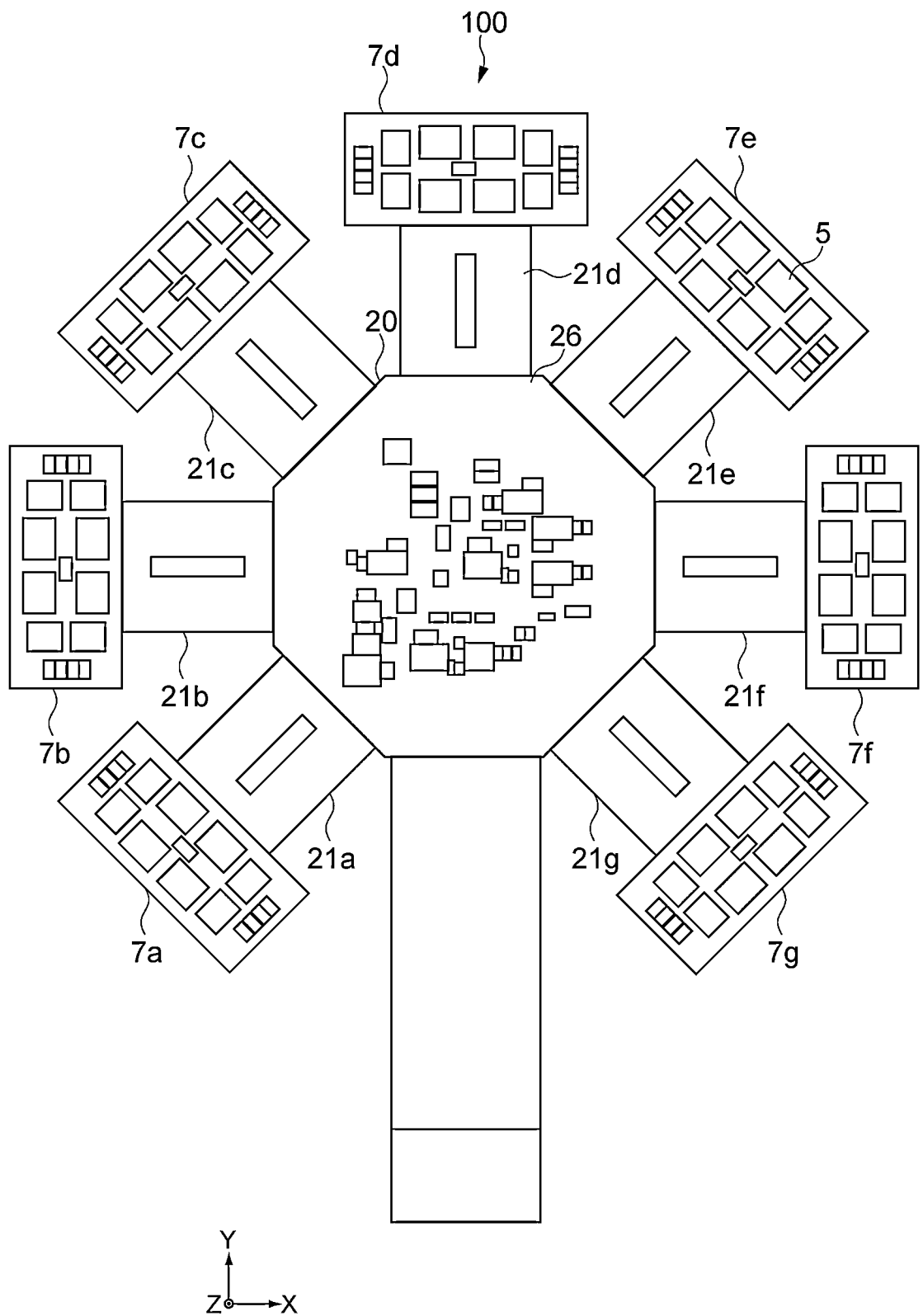
FIG. 20 is a schematic diagram showing other configuration example of the sensor apparatus (before bending).
Figure 21:
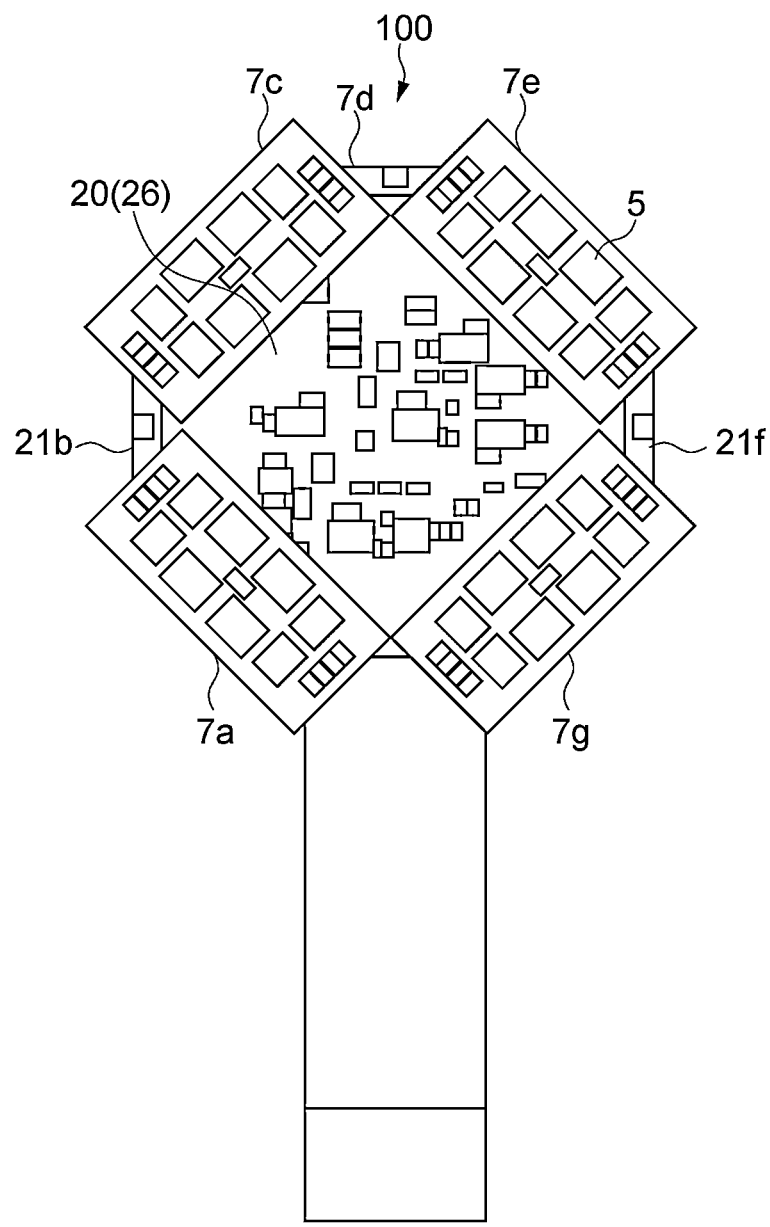
FIG. 21 is a schematic diagram showing other configuration example of the sensor apparatus (after bending).
Figure 22:
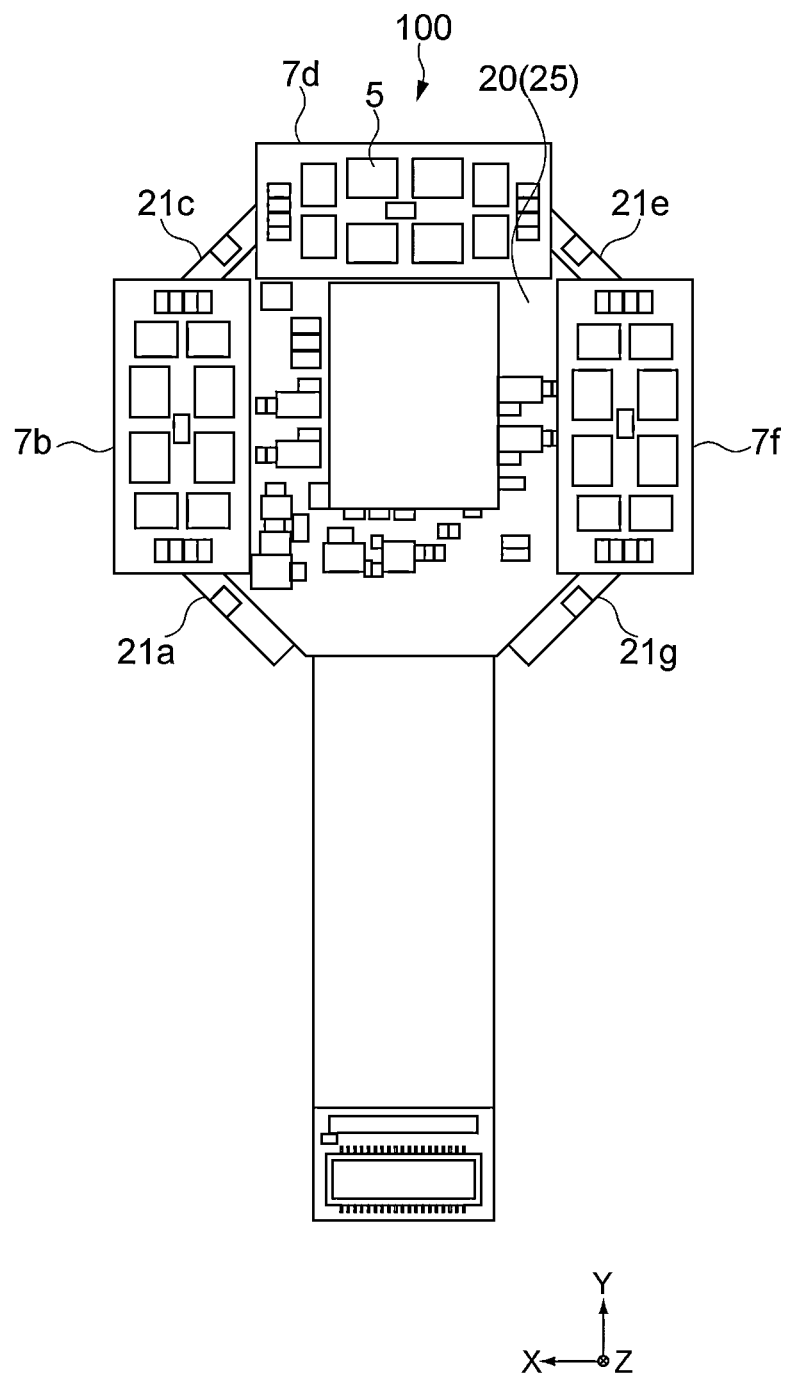
FIG. 22 is a schematic diagram showing other configuration example of the sensor apparatus (after bending).

FIGS. 20 to 22 are schematic diagrams showing other configuration examples of the sensor apparatus.

Each sensor apparatus 100 shown in FIGS. 20 to 22 includes one main substrate 20 and seven sensor substrates 7a to 7g.

The main substrate 20 has a polygonal shape when viewed from the Z direction. Specifically, it has an eight-corner shape. First to seventh flexible substrates 21a to 21g are connected to seven sides of the main substrate 20. First to seventh sensor substrates 7a to 7g are connected to the first to seventh flexible substrates 21a to 21g.

As shown in FIG. 21, each of the first flexible substrate 21a, the third flexible substrate 21c, the fifth flexible substrate 21e, and the seventh flexible substrate 21g is bent toward the fourth surface 26 side of the main substrate 20. The first sensor substrate 7a, the third sensor substrate 7c, the fifth sensor substrate 7e, and the seventh sensor substrate 7g are arranged to face the fourth surface 26 of the main substrate 20.

As shown in FIG. 22, the second flexible substrate 21b, the fourth flexible substrate 21d, and the seventh flexible substrate 21f are bent to the third surface 25 side of the main substrate 20. Then, the second sensor substrate 7b, the fourth sensor substrate 7d, and the sixth sensor substrate 7f are arranged so as to face the third surface 25 of the main substrate 20.

Thus, it is possible to increase the number of IMU sensors 5 without increasing the size of the sensor apparatus 100. As a result, while reducing the size of the sensor apparatus 100, it is possible to improve the measurement accuracy.

In this manner, three or more sensor substrates 7 may be arranged. If at least two of the three or more sensor substrates 7 are configured as the "first sensor substrate" and the "second sensor substrate" according to the present technology, the sensor apparatus according to the present technology can be implemented, and the above-mentioned effects can be exhibited.

Figure 23A:
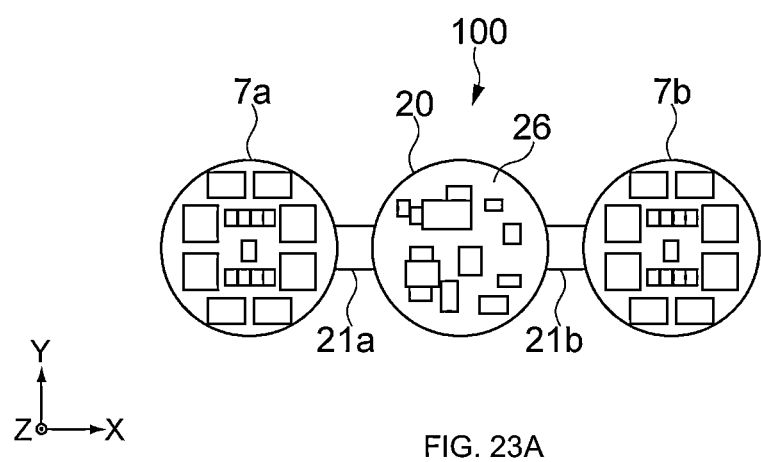
FIGS. 23A and 23B are schematic diagrams showing other configuration examples of the sensor apparatus.
Figure 23B:
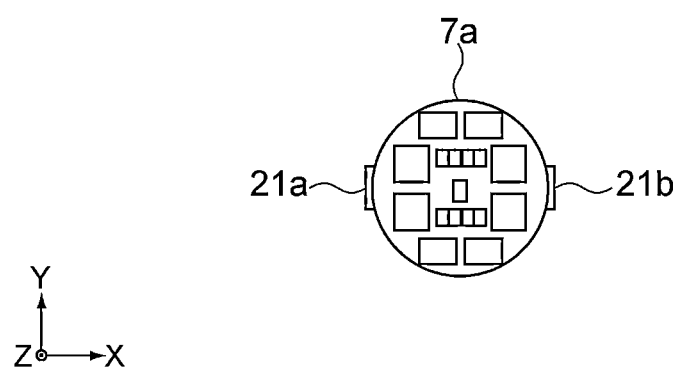

FIGS. 23A and 23B are schematic diagrams showing other configuration example of the sensor apparatus.

The sensor apparatus 100 shown in FIGS. 23A and 23B has one main substrate 20 and two sensor substrates 7a and 7b.

The main substrate 20, the first sensor substrate 7a, and the second sensor substrate 7b each has a circular external shape when viewed from the Z direction. Furthermore, the main substrate 20, the first sensor substrate 7a, and the second sensor substrate 7b have the same external shape and the same size to each other.

As shown in FIG. 23A, the first sensor substrate 7a, the main substrate 20, and the second sensor substrate 7b are arranged so as to be aligned in this order along one direction (X direction). The first sensor substrate 7a and the second sensor substrate 7b are arranged at positions being equal distance from the main substrate 20 so as to sandwich the main substrate 20 therebetween.

Each of the first sensor substrate 7a and the second sensor substrate 7b is electrically connected to the main substrate 20 by the first flexible substrate 21a and the second flexible substrate 21b arranged extending in the X direction.

As shown in FIG. 23B, the first flexible substrate 21a is bent to the fourth surface 26 side of the main substrate 20. The first sensor substrate 7a is arranged so as to face the fourth surface 26 of the main substrate 20.

On the other hand, the second flexible substrate 21b is bent to the third surface 25 side (no reference number) of the main substrate 20. The second sensor substrate 7b is arranged so as to face the third surface 25 of the main substrate 20.

Thus, as shown in FIG. 23B, it is possible to easily realize a small sensor apparatus 100 made of a cylindrical shape extending in the Z direction. It is also possible to realize a sensor apparatus 100 high measurement accuracy is exhibited.

[Holding Flexible Substrate]

If the flexible substrate 21 for electrically connecting the sensor substrate 7 and the main substrate 20 is held bent, by suppressing the effect of a reaction force of the flexible substrate 21 bent (force to try to return to a state that is not bent), it is possible to improve the measurement accuracy.

For example, in the sensor apparatus 100 shown in FIGS. 17A and 17B, the first flexible substrate 21a and the second flexible substrate 21b is sufficiently held by the first bent portion 36a and the second bent portion 36b of the frame portion 33, and the first substrate holding portion 38a and the second substrate holding portion 38b of the upper holder 32. Thus, the reaction force of the first flexible substrate 21a and the second flexible substrate 21b can prevent a variation, a deformation or the like of the position of the first sensor substrate 7a and the second sensor substrate 7b. As a result, it is possible to improve the measurement accuracy.

As a method of suppressing the effect of the reaction force of the flexible substrate 21, a method of improving a strength of the holding portion of a side receiving the reaction force (side for pressing flexible substrate 21) is exemplified. Thus, without deformation or the like, it is possible to sufficiently hold the flexible substrate 21 and to sufficiently suppress the effect of the reaction force.

For example, by appropriately designing a material, a shape, a size, a cross-sectional area, etc. of the holding portion, it is possible to improve the strength of the holding portion. For example, a metal material having a high strength such as stainless steel, a ceramic material and the like is used. Furthermore, it is also conceivable that the cross-sectional area of the portion that receives the reaction force is increased and thickened.

Note that a method of improving the strength of the holding portion may be appropriately selected in consideration of a balance with mass productivity, a cost, and the like of the sensor apparatus 100.

In addition, any method may be employed as a method of suppressing the effect of the reaction force of the flexible substrate 21.

Referring to FIGS. 24, 25, 26, 27A, 27B, 28, 29, 30A, 30B, 30C, 31A, 31B, 31C, and 32, other configuration example of the sensor apparatus will be described.

Again, as to the XYZ direction shown in FIGS. 24, 25, 26, 27A, 27B, 28, 29, 30A, 30B, 30C, 31A, 31B, 31C, and 32, a description is made taking the X direction as a lateral direction, the Y direction as a depth direction, and the Z direction as a vertical direction. Furthermore, in each figure, a description is made taking a side facing an arrow in the X direction as a right side (opposite side as a left side), a side facing an arrow in the Y direction as a back side (opposite side as a front side), a side facing an arrow in the Z direction as an upper side (opposite side as a lower side).

Needless to say, an orientation in which the sensor apparatus 100 is used is not limited.

In the embodiment shown in FIG. 11 or the like, the flexible substrate 21 electrically connects the sensor substrate 7 and the main substrate 20.

In this embodiment, a frame having a connection wire holds the sensor substrate 7 and the main substrate 20. The frame holds the sensor substrate 7 and the main substrate 20 such that the sensor substrate 7 and the main substrate 20 are electrically connected by the connection wire, which will be described in detail below.

Figure 24:
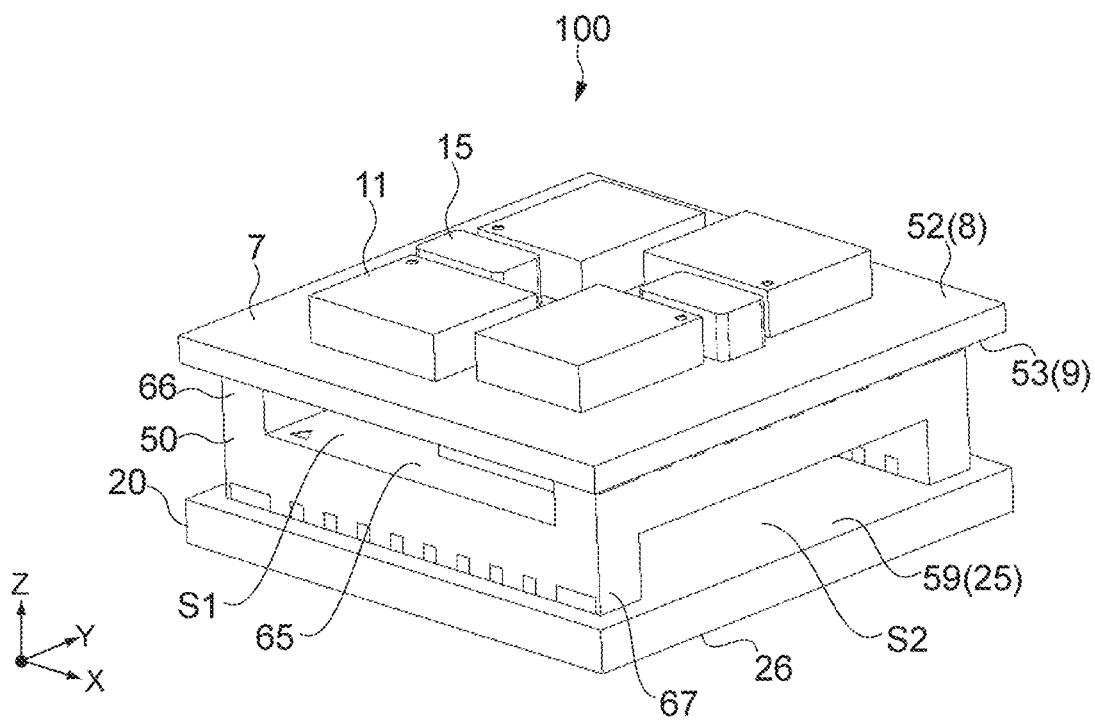
FIG. 24 is a schematic diagram showing other configuration example of the sensor apparatus (perspective diagram).

FIG. 24 is a perspective diagram of the sensor apparatus 100.

Figure 25:
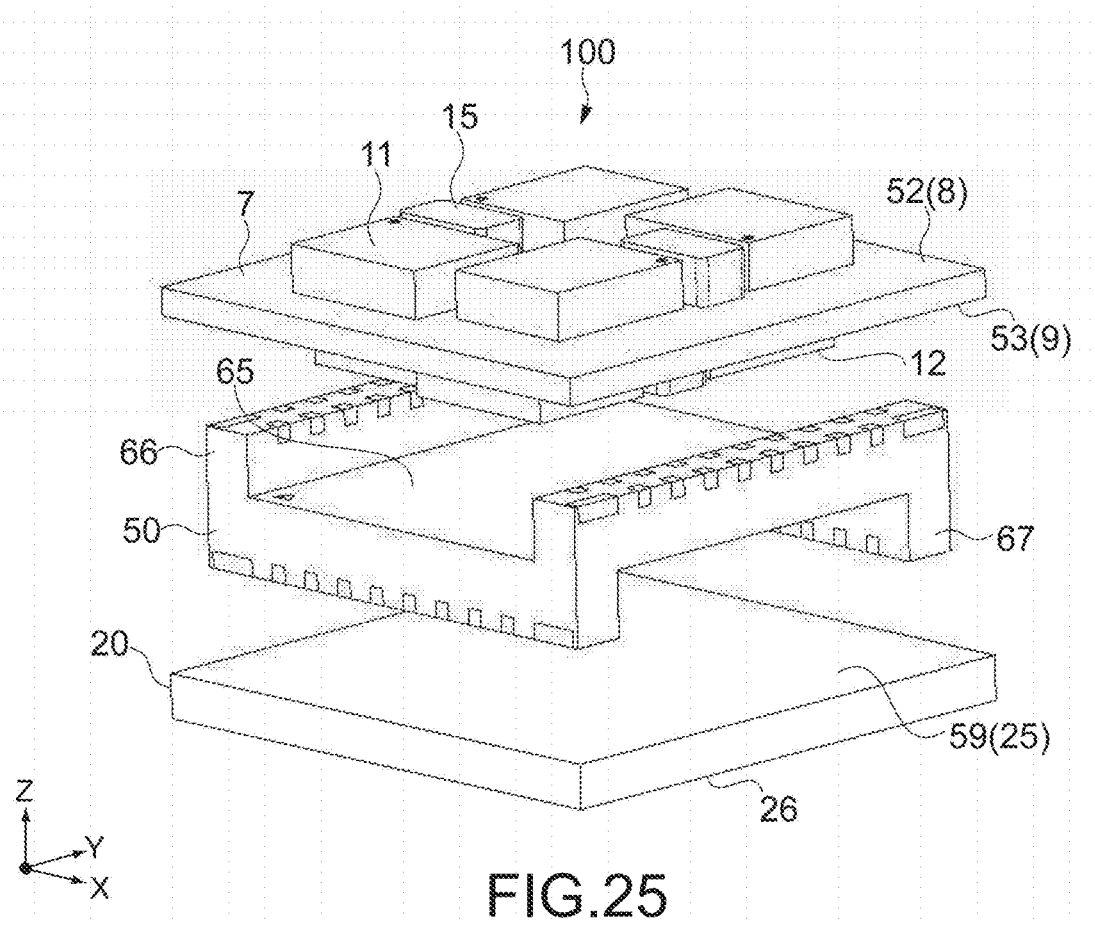
FIG. 25 is a schematic diagram showing other configuration example of the sensor apparatus (exploded perspective diagram).

FIG. 25 is an exploded perspective diagram of the sensor apparatus 100.

Figure 26:
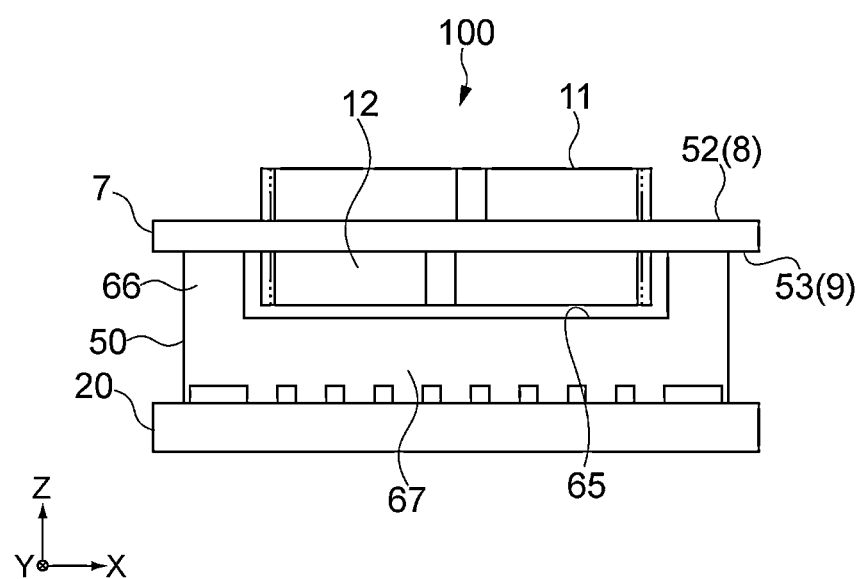
FIG. 26 is a schematic diagram showing other configuration example of the sensor apparatus (side diagram).

FIG. 26 is a side diagram of the sensor apparatus 100.

As shown in FIGS. 24 and 25, the sensor apparatus 100 according to the present embodiment includes the sensor substrate 7, the main substrate 20, and the frame 50.

The sensor substrate 7 and the main substrate 20 are arranged so as to face along the vertical direction.

The frame 50 is arranged between the sensor substrate 7 and the main substrate 20. The sensor substrate 7 is in contact with an upper side of the frame 50, and the main substrate 20 is in contact with a lower side of the frame 50.

Thus, the frame 50 holds the sensor substrate 7 at the upper side of the frame 50. In addition, the frame 50 holds the main substrate 20 at the lower side of the frame 50.

Figure 27A:
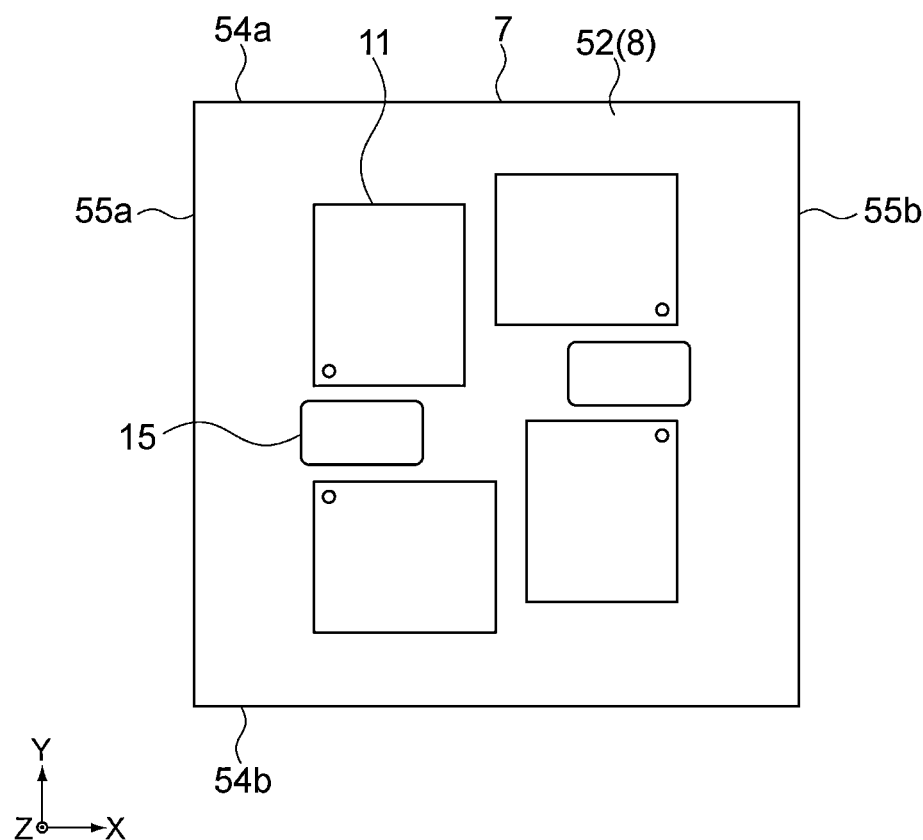
FIGS. 27A and 27B are schematic diagrams showing a configuration example of the sensor substrate.
Figure 27B:
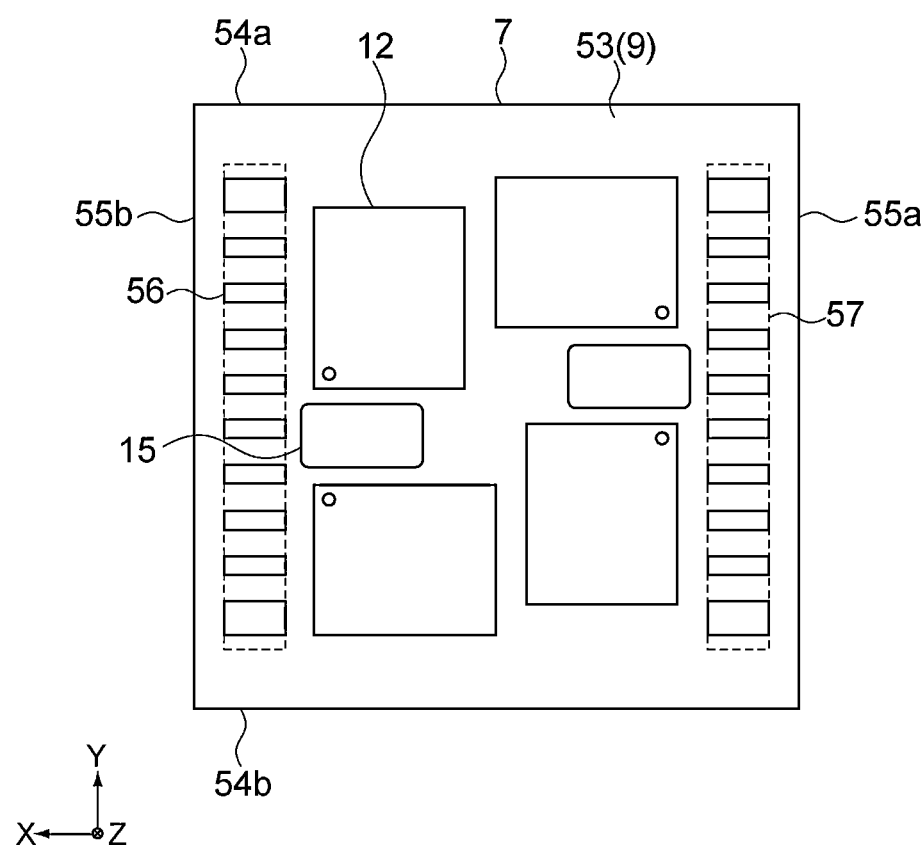

FIGS. 27A and 27B are diagrams showing a configuration example of the sensor substrate 7.

FIG. 27A is a front diagram of a surface 52 facing an upper side (hereinafter referred to as upper surface) of the sensor substrate 7.

FIG. 27B is a front diagram of a surface 53 of the sensor substrate 7 facing the main substrate 20 (hereinafter referred to as a first opposing surface).

The upper surface 52 and the first opposing surface 53 of the sensor substrate 7 correspond to the first surface 8 and the second surface 9 of the sensor substrate 7 shown in FIGS. 4A and 4B or the like. That is, of the first surface 8 and the second surface 9 of the sensor substrate 7, a surface facing the main substrate 20 is the first opposing surface 53. Of the first surface 8 and the second surface 9, the surface opposite to the first opposing surface 53 is the upper surface 52.

In the following description, the upper surface 52 is taken as the first surface 8, and the first opposing surface 53 is taken as the second surface 9. It should be appreciated that it is also possible to apply the present technology by taking the upper surface 52 as the second surface 9 and taking the first opposing surface 53 as the first surface 8.

On the upper surface 52 (first surface 8) of the sensor substrate 7, the four first IMU sensors 11 and two other electronic components 15 are arranged. On the first opposing surface 53 (second surface 9) of the sensor substrate 7, the four second IMU sensors 12 and two other electronic components 15 are arranged.

The first arrangement configuration of the first IMU sensors 11 with respect to the upper surface 52 and the second arrangement configuration of the second IMU sensors 12 with respect to the first opposing surface 53 are equal to each other (which corresponds to configuration example A described above). In addition, the arrangement configuration of the other electronic components 15 with respect to the upper surface 52 and the arrangement configuration of the other electronic components 15 with respect to the first opposing surface 53 are also equal to each other.

Incidentally, a label (nameplate) may be provided on the upper surface 52 of the sensor substrate 7.

As shown in FIGS. 27A and 27B, when viewed from the Z direction in which the sensor substrate 7 faces the main substrate 20, the sensor substrate 7 has a rectangular shape. Accordingly, the sensor substrate 7 has four side portions of two side portions 54a and 54b extending in a predetermined direction and facing each other, and two side portions 55a and 55b extending in a direction orthogonal to the predetermined direction and facing each other.

Incidentally, the four side portions of the sensor substrate 7 can also be referred to as four side portions of the upper surface 52. The four side portions of the sensor substrate 7 can also be referred to as four side portions of the first opposing surface 53.

In the present embodiment, the sensor substrate 7 is arranged such that the extending directions of the two side portions 54a and 54b are in the X direction and the extending directions of the two side portions 55a and 55b are in the Y direction.

As shown in FIG. 27B, inside of the two side portions 55a and 55b of the first opposing surface 53, connection terminal portions 56 are formed along the two side portions 55a and 55b.

The connection terminal portions 56 are formed on left and right sides of the second IMU sensors 12 and other electronic components 15 arranged on the first opposing surface 53. In addition, the connection terminal portions 56 are formed on a contact surface 57 in contact with the frame 50 of the first opposing surface 53.

For example, a plurality of lands is formed as the connection terminal portions 56. It should be appreciated that it is not limited thereto.

Figure 28:
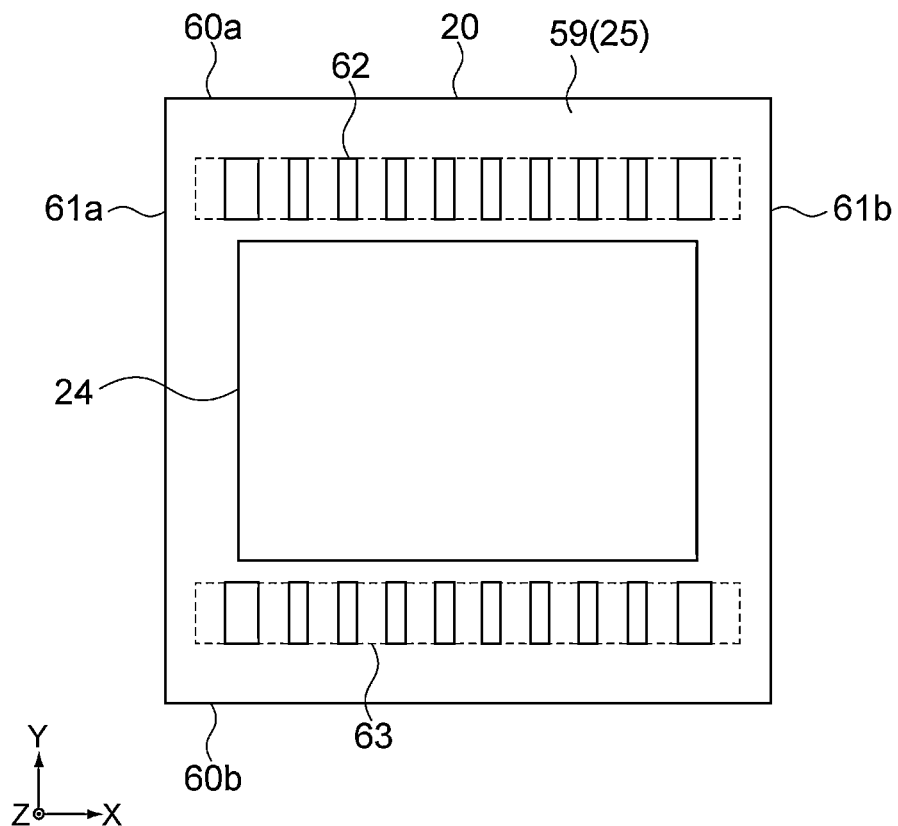
FIG. 28 is a schematic diagram showing a configuration example of the main substrate.

FIG. 28 is a diagram showing a configuration example of the main substrate 20. FIG. 28 is a front diagram of a surface 59 of the main substrate 20 facing the sensor substrate 7 (hereinafter referred to as a second opposing surface).

On the second opposing surface 59 of the main substrate 20, the FPGA 24 (control circuit unit) is arranged. Therefore, the second opposing surface 59 corresponds to the third surface 25 of the main substrate 20. The opposite surface of the second opposing surface 59 corresponds to the fourth surface 26 of the main substrate 20.

A configuration may be employed such that the fourth surface 26 of the main substrate 20 is the second opposing surface 59 facing the sensor substrate 7. That is, the sensor substrate 7 and the main substrate 20 may be held by the frame 50 such that the sensor substrate 7 faces the third surface 25 or the fourth surface 26 of the main substrate 20.

It should be appreciated that a custom processor such as a DSP and the like may be arranged instead of the FPGA 24 to realize the control circuit unit.

As shown in FIG. 28, when viewed from the Z direction in which the sensor substrate 7 faces the main substrate 20, the main substrate 20 has a rectangular shape. Accordingly, the main substrate 20 has four side portions of two side portions 60*a* and 60*b* extending in a predetermined direction and facing each other, and two side portions 61*a* and 61*b* extending in a direction orthogonal to the predetermined direction and facing each other.

The four side portions of the main substrate 20 can also be referred to as the four side portions of the second opposing surface 59. The four side portions of the main substrate 20 can also be referred to as four side portions of the fourth surface 26.

In the present embodiment, the main substrate 20 is arranged such that the extending directions of the two side portions 60*a* and 60*b* are in the X direction and the extending directions of the two side portions 61*a* and 61*b* are in the Y direction. That is, in the present embodiment, the sensor substrate 7 and the main substrate 20 are arranged such that the extending directions of the four side portions are aligned.

As shown in FIG. 28, inside the two side portions 60*a* and 60*b* which extend in the X direction and face each other of the second opposing surface 59, connection terminal portions 62 are formed along the two side portions 60*a* and 60*b*.

The connection terminal portions 62 are formed on the back side and the front side of the FPGA 24 arranged on the second opposing surface 59. In addition, the connection terminal portions 62 are formed on a contact surface 63 in contact with the frame 50 of the second opposing surface 59.

For example, a plurality of lands is formed as the connection terminal portions 62. It should be appreciated that it is not limited thereto. Incidentally, the connection terminal portions for mounting the sensor apparatus 100 may be formed on the fourth surface 26 opposite to the second opposing surface 59. For example, the position opposite to (back side) the connection terminal portions 62 shown in FIG. 28, the connection terminal portions for mounting are formed. It should be appreciated that it is not limited to such an arrangement.

Incidentally, in FIGS. 24 and 25, the FPGA 24 and the connection terminal portions 62 are not shown.

FIGS. 29, 30A, 30B, and 300 are schematic diagrams showing configuration examples of the frame 50.

Figure 29:
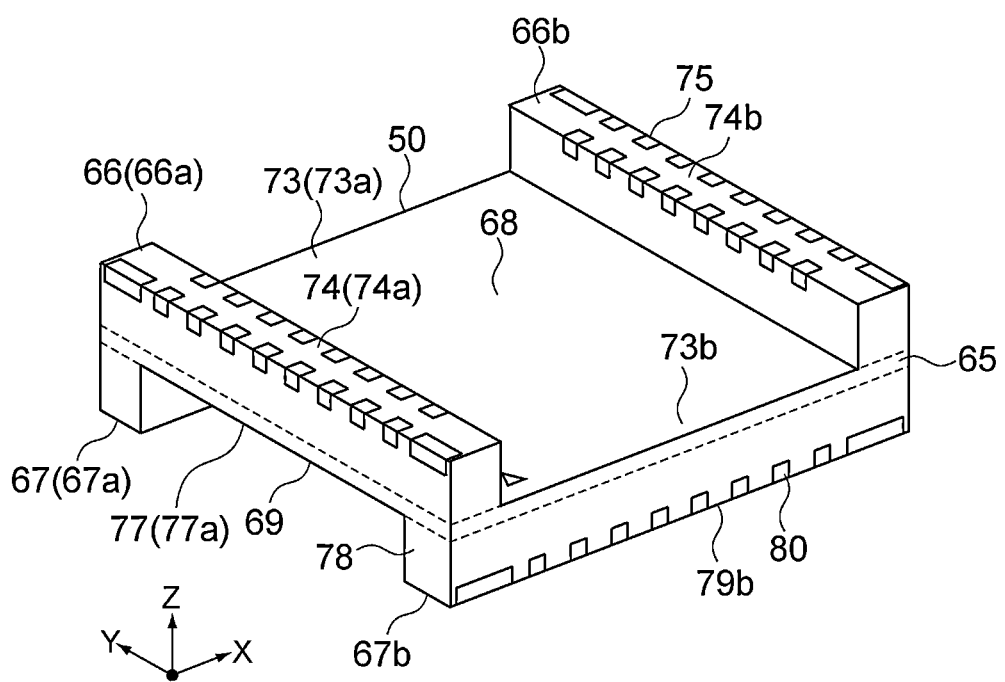
FIG. 29 is a schematic diagram showing a configuration example of a frame (perspective diagram).
Figure 30A:
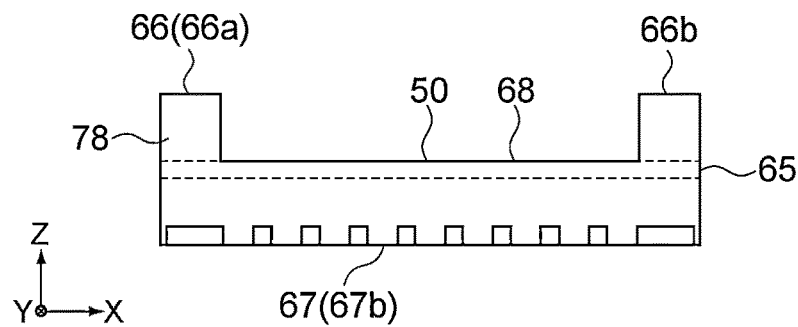
FIGS. 30A, 30B, and 30C are schematic diagrams showing a configuration example of a frame (side diagram, top diagram, bottom diagram).

FIG. 29 is a perspective diagram of the frame 50. FIG. 30A is a side diagram of the frame 50.

Figure 30B:
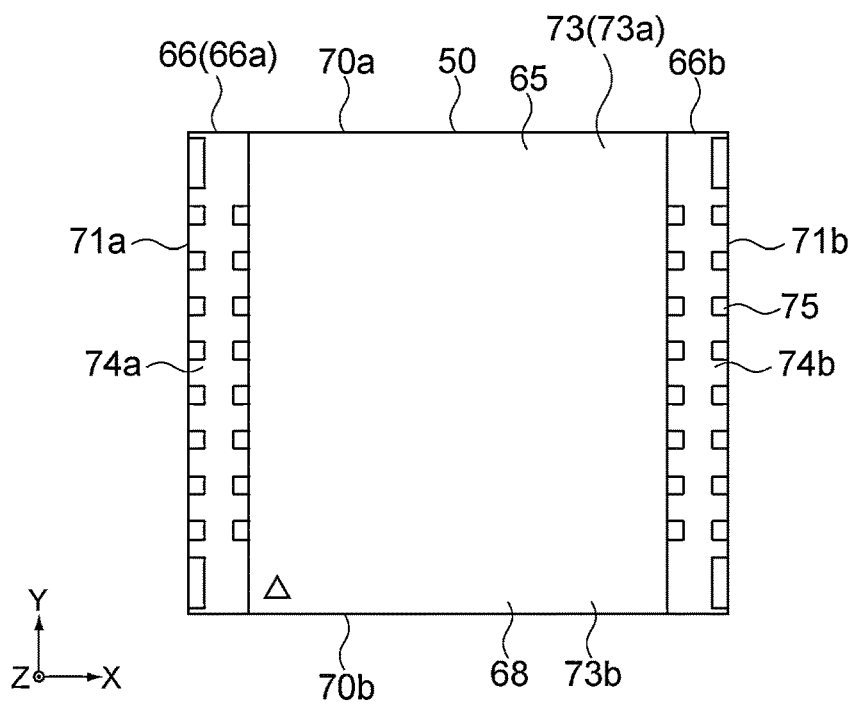

FIG. 30B is a front diagram of a side (upper side) facing the sensor substrate 7 of the frame 50.

Figure 30C:
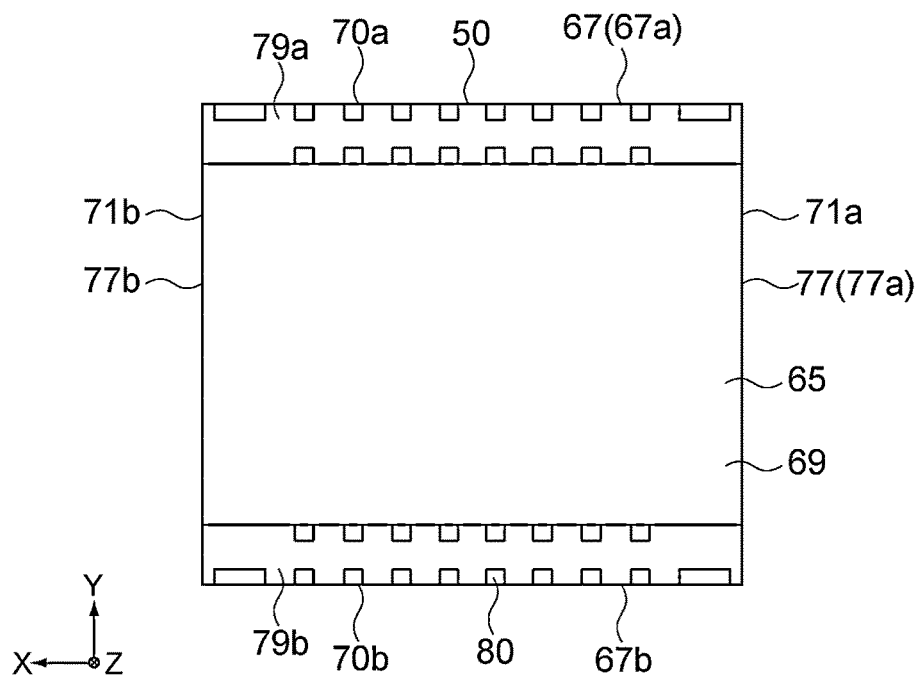

FIG. 30C is a front diagram of a side (lower side) facing the main substrate 20 of the frame 50.

The frame 50 has a partition wall portion 65, one or more first contact portions 66, and one or more second contact portions 67.

The partition wall portion 65 is arranged between the first opposing surface 53 of the sensor substrate 7 and the second opposing surface 59 of the main substrate 20.

As shown in FIGS. 29, 30A, 30B, and 30C, in the present embodiment, the partition wall portion 65 has a flat plate shape. For example, the partition wall portion 65 is configured such that the thickness in the vertical direction is a thin flat plate shape of about 0.2 mm. It should be appreciated that the thickness or the like of the partition wall portion 65 is not limited.

Hereinafter, the surface of the partition wall portion 65 facing the sensor substrate 7 is referred to as a fifth surface 68. The surface of the partition wall portion 65 facing the main substrate 20 is defined as a sixth surface 69.

Along the Z direction, the first opposing surface 53 of the sensor substrate 7 faces the fifth surface 68 of the partition wall portion 65. Also, along the Z direction, the second opposing surface 59 of the main substrate 20 faces the sixth surface 69 of the partition wall portion 65.

As shown in FIGS. 30B and 30C, when viewed from the Z direction in which the sensor substrate 7 faces the main substrate 20, the partition wall portion 65 has a rectangular shape. Accordingly, the partition wall portion 65 has four side portions of two side portions 70*a* and 70*b* extending in a predetermined direction and facing each other, and two side portions 71*a* and 71*b* extending in a direction orthogonal to the predetermined direction and facing each other.

The four side portions of the partition portion 65 can also be referred to as four side portions of the fifth surface 68. The four side portions of the partition portion 65 can also be referred to as four side portions of the sixth surface 69.

In the present embodiment, the frame 50 is arranged such that the extending directions of the two side portions 70*a* and 70*b* of the partition wall portion 65 are in the X direction and the extending directions of the two side portions 71*a* and 71*b* are in the Y direction. That is, in the present embodiment, the sensor substrate 7, the main substrate 20, and the partition wall portion 65 of the frame 50 are arranged such that the extending directions of the four side portions are aligned.

As described above, in the present embodiment, when viewed from the Z direction, the sensor substrate 7, the main substrate 20, and the partition wall portion 65 have the same shape each other. The size of each of the sensor substrate 7, the main substrate 20, and the partition wall portion 65 may be equal to each other. It should be appreciated that it is not limited thereto.

The one or more first contact portions 66 extend from the partition wall portion 65 to a sensor substrate 7 side and are in contact with the sensor substrate 7. In the present embodiment, the one or more first contact portions 66 include two first contact portions 66*a* and 66*b*.

The first contact portions 66*a* and 66*b* are formed in regions of a portion of a periphery of the fifth surface 68 of the partition wall portion 65.

In the present embodiment, the first contact portions 66*a* and 66*b* are formed on the two side portions 71*a* and 71*b* extending in the Y direction of the fifth surface 68 and facing each other.

The regions of the periphery of the fifth surface 68 where the one or more first contact portions 66 are not formed are one or more first void regions 73. In the present embodiment, two regions extending in the X direction of the fifth surface 68 and along the two side portions 70*a* and 70*b* facing each other are first void regions 73*a* and 73*b*. Accordingly, in the present embodiment, the one or more first void regions 73 include the two first void regions 73*a* and 73*b*.

As shown in FIGS. 29 and 30B, the upper surface portions of the sensor substrate 7 side of the two first contact portion 66*a* and 66*b* are the first contact surfaces 74*a* and 74*b* in contact with the sensor substrate 7.

First connection terminal portions 75 are formed on at least one of the two first contact surfaces 74*a* and 74*b*. For example, a plurality of lands is formed as the first connection terminal portions 75. It should be appreciated that it is not limited thereto.

In the present embodiment, the first connection terminal portions 75 are formed on both of the two first contact surfaces 74*a* and 74*b*. Without being limited thereto, a configuration that the first connection terminal portions 75 are formed on only one of the first contact surfaces 74 may be employed.

When the sensor substrate 7 is held by the frame 50, the first contact surfaces 74*a* and 74*b* are into contact with the contact surface 57 of the first opposing surface 53 shown in FIG. 27B.

Then, the connection terminal portions 56 formed on the first opposing surface 53 are electrically connected with the first connection terminal portions 75 formed on the first contact surfaces 74*a* and 74*b*.

Furthermore, as shown in FIG. 24, when the sensor substrate 7 is held in the frame 50, the partition wall portion 65 of the frame 50, the first contact portions 66, and the sensor substrate 7 form a first space S1 in which the positions of the one or more first void regions 73 of the fifth surface 68 are open.

The first space S1 opens on the back side and the front side along the Y direction.

The second IMU sensors 12 and other electronic components 15 arranged on the first opposing surface 53 of the sensor substrate 7 are accommodated in the first space S1.

The one or more second contact portions 67 extend from the partition wall portion 65 toward a main substrate 20 side and are in contact with the main substrate 20. In the present embodiment, the one or more second contact portions 67 include two second contact portions 67*a* and 67*b*.

The second contact portions 67*a* and 67*b* are formed in regions of a portion of a periphery of the sixth surface 69 of the partition wall portion 65.

In the present embodiment, the second contact portions 67*a* and 67*b* are formed on the two side portions 70*a* and 70*b* extending in the X direction of the sixth surface 69 and facing each other.

The regions of the periphery of the sixth surface 69 where one or more second contact portions 67 are not formed are one or more second void regions 77. In the present embodiment, two regions extending in the Y direction of the sixth surface 69 and extending along the two opposing side portions 71*a* and 71*b* are the second void regions 77*a* and 77*b*. In other words, in this embodiment, the one or more second void regions 77 include the two second void regions 77*a* and 77*b*.

In the present embodiment, when viewed from the Z direction, the positions of the first contact portions 66 on the fifth surface 68 and the positions of the second contact portions 67 on the sixth surface 69 are different from each other.

As shown in FIGS. 30A, 30B, and 30C and the like, when viewed from the Z direction, the first contact portions 66 and the second contact portions 67 are formed at positions rotated by 90 degrees with respect to each other. In other words, the direction (Y direction) in which the first contact portions 66*a* and 66*b* extend and the direction (X direction) in which the second contact portions 67*a* and 67*b* extend intersect at an angle of 90 degrees.

When viewed from the Z direction, the positions of the first void regions 73 of the fifth surface 68 and the positions of the second void regions 77 of the sixth surface 69 are different from each other.

As shown in FIGS. 30A, 30B, and 30C and the like, when viewed from the Z direction, the first void region 73 and the second void region 77 are formed at positions rotated by 90 degrees with respect to each other. In other words, the direction in which the first void regions 73*a* and 73*b* extend (X direction) and the direction in which the second void regions 77*a* and 77*b* extend (Y direction) intersect at an angle of 90 degrees.

The first contact portions 66*a* and 66*b* are formed in regions of the sixth surface 69 opposite to (back sides) the second void regions 77*a* and 77*b*. The second contact portions 67*a* and 67*b* are formed in regions of the fifth surface 68 opposite to (back sides) the first void regions 73*a* and 73*b*.

Furthermore, as shown in FIG. 29 or the like, on portions of four corners of the partition wall portion 65, the first contact portions 66 are formed at the upper side and the second contact portions 67 are formed at the lower side. As described above, the first contact portions 66 and the second contact portions 67 constitute pillar portions 78 on the four corner portions of the partition wall portion 65.

The four pillar portions 78 on the four corners of the partition wall portion 65 hold the sensor substrate 7 at the upper side and hold the main substrate 20 at the lower side.

As shown in FIGS. 29 and 30C, lower surface portions of the two second contact portions 67*a* and 67*b* on the main substrate 20 side are second contact surfaces 79*a* and 79*b* in contact with the main substrate 20.

Second connection terminal portions 80 are formed on at least one of the two second contact surfaces 79*a* and 79*b*. For example, a plurality of lands is formed as the second connection terminal portions 80. It should be appreciated that it is not limited thereto.

In the present embodiment, the second connection terminal portions 80 are formed on both of the two second contact surfaces 79*a* and 79*b*. A configuration that the second connection terminal portions 80 are formed on only one of the first contact surfaces 79 may also be employed.

When the main substrate 20 is held by the frame 50, the second contact surfaces 79*a* and 79*b* are in contact with the contact surface 63 of the second opposing surface 59 shown in FIG. 28.

Then, the connection terminal portions 62 formed on the second opposing surface 59 are electrically connected with the second connection terminal portions 80 formed on the second contact surfaces 79*a* and 79*b*.

As shown in FIG. 24, when the main substrate 20 is held by the frame 50, the partition wall portion 65 of the frame 50, the second contact portion 67, and the main substrate 20 form a second space S2 in which the position of one or more second void regions 77 of the sixth surface 69 is open.

The second space S2 opens on the left and right side along the X direction.

The FPGA 24 arranged on the second opposing surface 59 of the main substrate 20 is accommodated in the second space S2.

As shown in FIG. 24, the opening position of the first space S1 (position of each first void region 73), and the opening position of the second space S2 (position of each second void region 77) are different from each other. Specifically, the opening position of the first space S1 and the opening position of the second space S2 are positions rotated by 90 degrees with respect to each other.

Therefore, an opening direction of the first space S1 (X direction) and an opening direction of the second space S2 (Y direction) intersect at an angle of 90 degrees.

In the present embodiment, the Y direction corresponds to the first direction. The X direction corresponds to the second direction.

The side portions 71a and 71b of the fifth surface 68 extending in the Y direction and facing each other correspond to two first side portions. The side portions 70a and 70b of the sixth surface 69 extending in the X direction and facing each other correspond to two second side portions.

Figure 31A:
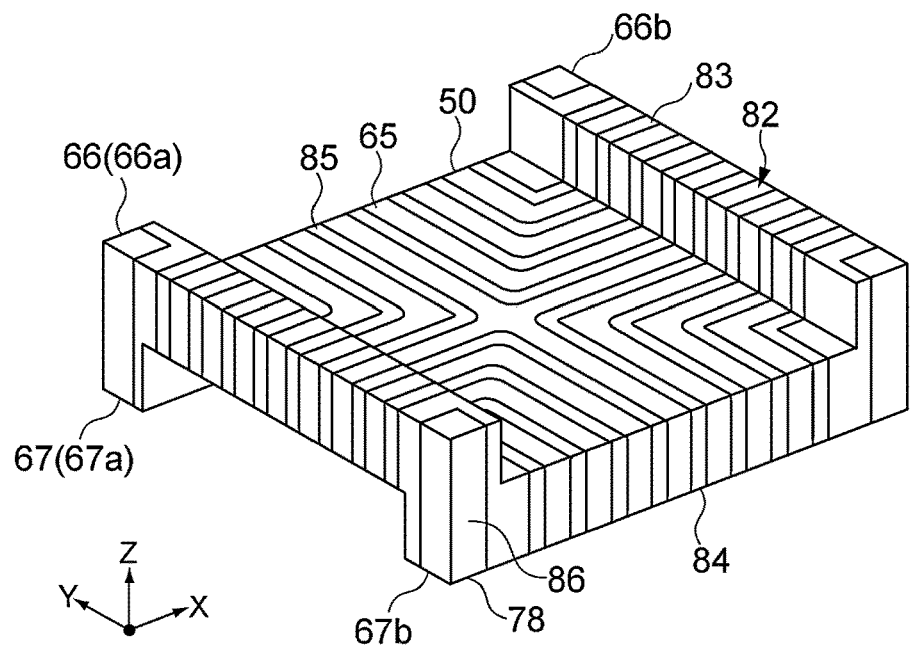
FIGS. 31A, 31B, and 31C are schematic diagrams showing a configuration example of a wire portion.
Figure 31B:
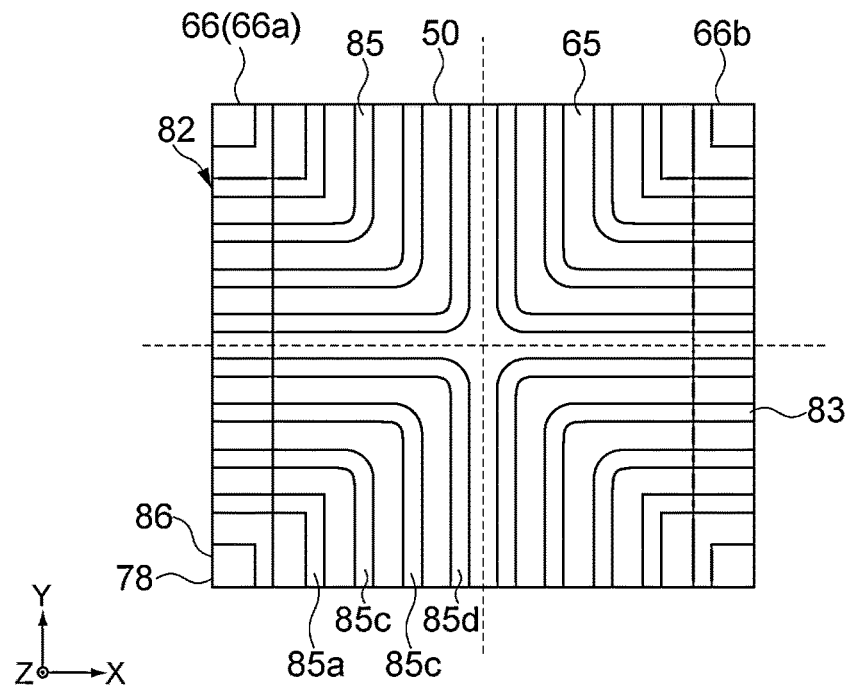
Figure 31C:
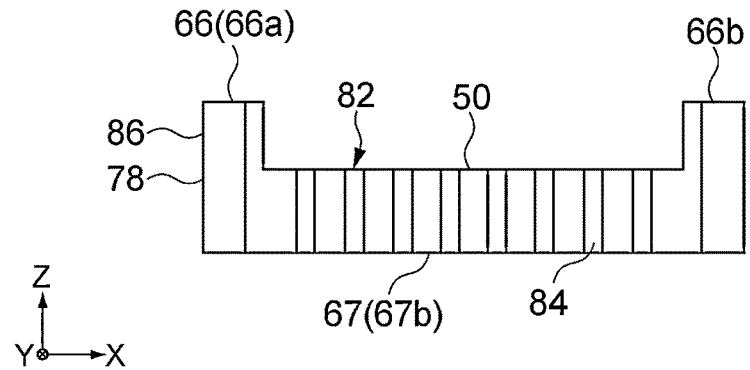

FIGS. 31A, 31B, and 31C are schematic diagrams showing configuration examples of the wire portions 82.

The wiring portions 82 electrically connect the first connection terminal portions 75 formed in the first contact portions 66a and 66b and the second connection terminal portions 80 formed in the second contact portions 67a and 67b.

In the present embodiment, the wire portions 82 are formed inside the frame 50. In other words, the frame 50 is formed by interpolating the wire portions 82.

In the present embodiment, the first connection terminal portions 75, the second connection terminal portions 80, and the wire portions 82 realize connection wires for electrically connecting the sensor substrate 7 and the main substrate 20.

As shown in FIGS. 31A and 31B, in the present embodiment, a plurality of first wires 83 are provided inside the first contact portions 66. The plurality of first wires 83 is arranged so as to be aligned at equal intervals along the extending direction of the first contact portions 66 (Y direction). Also in the Y direction, the positions where the plurality of first wires 83 is provided with respect to the two first contact portions 66a and 66b are equal to each other.

In the present embodiment, the plurality of first wires 83 is provided on the positions of respective connection terminals of the first connection terminal portions 75 formed in the first contact portion 66. It should be appreciated that it is not limited to such a configuration.

In the present embodiment, a plurality of first wires 84 is provided inside the second contact portions 67. The plurality of second wires 84 is arranged so as to be arranged at equal intervals along the extending direction of the second contact portions 67 (X direction). Also in the X direction, the positions where the plurality of second wires 84 is provided with respect to the two second contact portions 67a and 67b are equal to each other.

In the present embodiment, the plurality of second wires 84 is provided on the positions of respective connection terminals of the second connection terminal portions 80 formed in the second contact portions 67. It should be appreciated that it is not limited to such a configuration.

Inside the partition wall portion 65 of the frame 50, a plurality of intermediate wires 85 is formed for connecting the plurality of first wires 83 and the plurality of second wires 84.

As shown in FIG. 31B, the virtual axes are set along the X direction and the Y direction from the center of the partition wall portion 65, and the partition wall portion 65 is divided into four blocks. Then, the plurality of intermediate wires 85 is provided so as to be equal to each other for each block.

When one block is focused, the first wire 83 and the second wire 84 closest to the four corners of the partition wall portion 65 are connected to each other by an intermediate wire 85a. The first wire 83 and the second wire 84 close to the second from the four corners of the partition wall portion 65 is connected to each other by an intermediate wire 85b. The first wire 83 and the second wire 84 close to the third from the four corners of the partition wall portion 65 are connected to each other by an intermediate wire 85c. The first wire 83 and the second wire 84 farthest from the four corners of the partition wall portion 65 are connected to each other by an intermediate wire 85d.

Each of the intermediate wires 85a to 85d extends in the Y direction from each first wire 83 to be connected, bend in the X direction at the position of each second wire 84 to be connected and is connected to the second wire 84 along the X direction. Therefore, each of the intermediate wires 85a to 85d has a shape in which a central portion is bent by 90 degrees.

In each of the four blocks, the intermediate wires 85a to 85d are formed. The intermediate wires 85 are formed by the number of sets of the first wires 83 and second wires 84 to be connected.

The plurality of first wires 83, the plurality of intermediate wires 85, and the plurality of first wires 84 constitute the wire portions 82.

The plurality of first wires 83 formed in the first contact portions 66 is electrically connected to the first connection terminal portions 75 formed on the first contact surfaces 74.

The plurality of second wires 84 formed in the second contact portions 67 is electrically connected to the second connection terminal portions 80 formed on the second contact surfaces 79.

Thus, it is possible to electrically connect the sensor substrate 7 and the main substrate 20.

Incidentally, a portion of the plurality of first wires 83 formed in the first contact portions 66 may be used as the first connection terminal portions 75. Similarly, a portion of the plurality of second wires 84 formed in the second contact portions 67 may be used as the second connection terminal portions 80.

In this case, a portion of the wire portions 82 will be used as a portion of the first connection terminal portions 75 or the second connection terminal portions 80.

The configuration of the wire portions 82 is not limited, and any configuration may be employed as long as the first connection terminal portions 75 formed on the first contact surfaces 74 and the second connection terminal portions 80 formed on the second contact surfaces 79 are electrically connected.

Also as shown in FIGS. 31A, 31B, and 31C, in the present embodiment, inside of the pillar portions 78 constituted by the portions of the four corners of the partition wall portion 65, wires 86 penetrating the pillar portions 78 vertically are formed.

It is possible to form relatively thick wires in the pillar portions 78. Therefore, it is possible to design a small wire resistance by thickening the wires 86. Thus, for example, the wires 86 can be used as wires for power supply and wires for ground.

It should be appreciated that it is not limited thereto, and the wires 86 may be used to electrically connect the sensor substrate 7 and the main substrate 20.

Specific materials and the like of various connecting terminal portions and various wires described above are not limited. Any conductive material such as copper and silver may be used.

The frame 50 can be realized by, for example, an MID (Molded Interconnect Device: molded circuit component). That is, by forming an electric circuit (plating, etc.) to a resin molded product, it is possible to form the frame 50.

Alternatively, a method of manufacturing a ceramic substrate can be applied to the frame 50. For example, by laminating and sintering by combining the conductive and non-conductive layers, a ceramic sintered product in which electrical circuits are formed is manufactured. It is possible to use the ceramic sintered product as the frame 50.

Alternatively, a method of attaching a flexible substrate to a resin molded product or the like, a method of making a wire portion of sheet metal and insert molding, or the like may be used.

In addition, any method may be employed as a method of forming the frame 50.

For example, a method of forming the frame 50 may be appropriately selected based on structural requirements, electrical requirements, and the like required for the frame 50.

The structural requirements include, for example, whether or not the sensor substrate 7 and the main substrate 20 can be held in consideration of heights of mounting components, or whether or not the substrate can be permanently held with strength necessary for the structure, etc.

The electrical requirements include, for example, whether or not the sensor substrate 7 and the main substrate 20 can be connected electrically in a plurality of systems, whether or not it is permanently connectable below a resistance value required for a circuit, etc.

It is needless to say that it is not limited to the case where the method of forming the frame 50 is determined by focusing such requirements. Any forming method capable of realizing a three-dimensional shape and electrical wires may be appropriately employed.

FIG. 32 is a schematic diagram used to describe an effect of heat on the sensor apparatus.

In the sensor apparatus 100 according to the present embodiment, the partition wall portion 65 of the frame 50 is arranged between the sensor substrate 7 and the main substrate 20. As a result, it is possible to prevent radiant heat (blast) from the FPGA 24 or the like of the main substrate 20. It is also possible to prevent a transfer of heat to the sensor substrate 7 due to convection of air.

Furthermore, in the present embodiment, by arranging the frame 50, the space between the sensor substrate 7 and the main substrate 20 can be partitioned into the two spaces of the first space S1 and the second space S2. This makes it possible to sufficiently prevent the transfer of heat due to radiation and convection.

The first space S1 opens on the back side and the front side along the Y direction. Therefore, in the first space S1, an air passage is formed along the Y direction.

The second space S2 opens on the left side and the right side along the X direction. Therefore, in the second space S2, an air passage is formed along the X direction.

In this manner, each of the first space S1 and the second space S2 partially opens and the air passage is formed. Therefore, it is possible to prevent heat from being filled in the first space S1 and the second space S2 and to sufficiently suppress an increase in temperature of the sensor substrate 7 and the main substrate 20.

Furthermore, in the present embodiment, as shown in FIG. 32, the opening position of the first space S1 and the opening position of the second space S2 are rotated by 90 degrees with respect to each other. That is, the opening direction of the first space S1 (X direction) and the opening direction of the second space S2 (Y direction) intersect at an angle of 90 degrees.

Thus, it is possible to sufficiently prevent heat (warm air) discharged from the opening of the second space S2 to outside from entering inside of the first space S1. That is, it is possible to further prevent the transfer of heat due to convection.

Furthermore, in the present embodiment, it is possible to sufficiently suppress the transfer of heat due to conduction.

As shown schematically with arrows in FIG. 32, heat generated from the FPGA 24 or the like of the main substrate 20 is first conducted to the main substrate 20. Heat transferred to the main substrate 20 is conducted to the contact surface 63 with which the frame 50 is in contact (see FIG. 28).

Heat is conducted from the contact surface 63 of the main substrate 20 to the second contact portions 67 of the frame 50. Heat conducted to the second contact portions 67 is conducted to the pillar portions 78 of the frame 50. Heat conducted to the pillar portions 78 of the frame 50 is conducted to the first contact portions 66 of the frame 50 and to the sensor substrate 7.

Thus, by the frame 50, it is possible to lengthen a path to which heat is conducted from the FPGA 24 or the like of the main substrate 20 to the sensor substrate 7. This allows heat conducted to the sensor substrate 7 to be sufficiently suppressed.

Thus, in this embodiment, by using the frame 50, it is possible to sufficiently suppress the transfer of heat to the sensor substrate 7 due to radiation, convection, and conduction. Thus, it is possible to sufficiently suppress the increase in temperature of the sensor substrate 7.

As a result, it is possible to sufficiently suppress the generation of stress on the sensor substrate 7 due to heat and to improve the deformation suppressing effect. As a result, it is possible to improve the measurement accuracy of the sensor apparatus 100.

As described above, in the sensor apparatus 100 shown in FIGS. 24, 25, 26, 27A, 27B, 28, 29, 30A, 30B, 30C, 31A, 31B, 31C, and 32, the frame 50 having connection wires (first connection terminal portions 75, wire portions 82, second connection terminal portions 80) holds the sensor substrate 7 and the main substrate 20.

The sensor substrate 7 and the main substrate 20 are held in the frame 50 and are electrically connected by the connection wires of the frame 50.

Thus, as compared with the case where the sensor apparatus 100 is formed of a rigid flexible substrate, it is advantageous for reducing the size of the apparatus. In addition, since the apparatus configuration can be simplified, it is possible to realize simplification of a manufacturing process, shortening of a manufacturing time, and reduction of a manufacturing cost.

Furthermore, as described with reference to FIG. 32, it is possible to sufficiently suppress the effect of heat on the sensor substrate 7 and to realize an improvement in measurement accuracy of the sensor apparatus 100.

Incidentally, by forming the partition wall portion 65 in the frame 50, it is easy to route the wires in the horizontal direction (XY plane direction), which is advantageous for conduction of the sensor substrate 7 and the main substrate 20 arranged vertically.

For example, by employing the configuration shown in FIG. 24, a small and high-precision sensor apparatus 100 having each size of about 10 mm in the X direction and Y direction and the size of about 5 mm in the Z direction can be inexpensively mass-produced. It should be appreciated that the size of the sensor apparatus 100 is not limited.

As a material of the sensor substrate 7, a ceramic material having a small coefficient of linear expansion is used. Specifically, as the sensor substrate 7, a ceramic substrate is used. This makes it possible to improve the measurement accuracy.

In addition, by using a ceramic material for the materials of the main substrate 20 and the frame 50, it is possible to sufficiently prevent an effect of the difference in the coefficients of linear expansion between the members. As a result, it is possible to improve the measurement accuracy.

Aluminum or copper or the like may be used as a substrate material since it is hardly deformed because of a small coefficient of thermal expansion and large Young's modulus. The same material may be used for the main substrate 20 and the frame 50.

Incidentally, the configuration using the frame 50 shown in FIG. 24 is also applicable to apply to the sensor substrate on which the IMU sensor is mounted at only one side. Also in this case, it is possible to sufficiently prevent the transfer of heat to the sensor substrate.

Another configuration example of the sensor apparatus 100 using the frame 50 shown in FIG. 24 to FIG. 32 will be described. Different points from the sensor apparatus 100 shown in FIG. 24 and the like are mainly described below. Description of the similar configurations and actions of the sensor apparatus 100 shown in FIG. 24 and the like are omitted or simplified.

Figure 33:
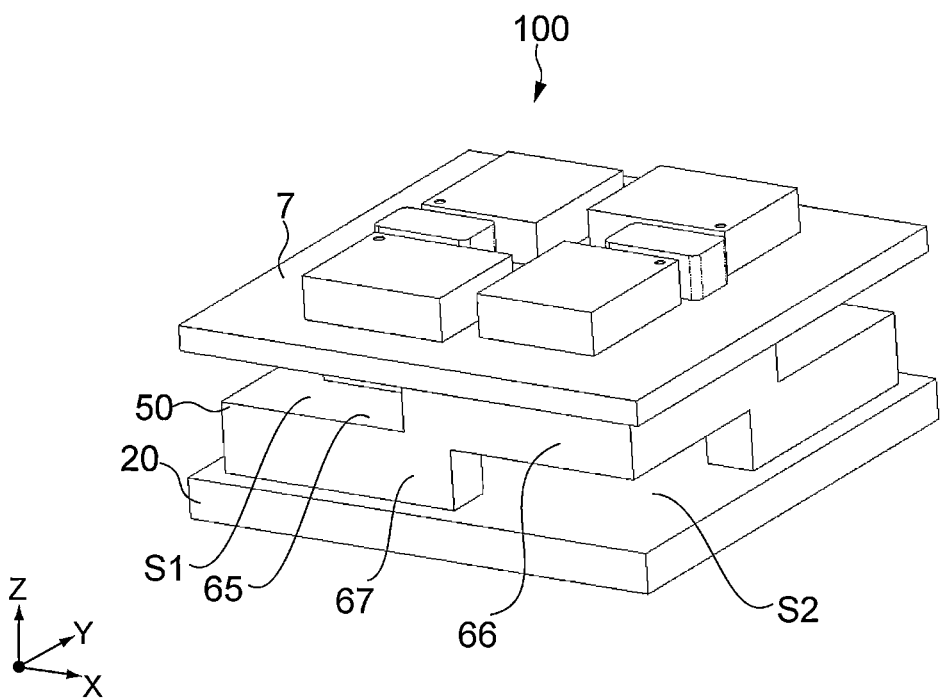
FIG. 33 is a schematic diagram showing other configuration example of the sensor apparatus (perspective diagram).

FIG. 33 is a perspective diagram showing other configuration example of the sensor apparatus 100.

Figure 34A:
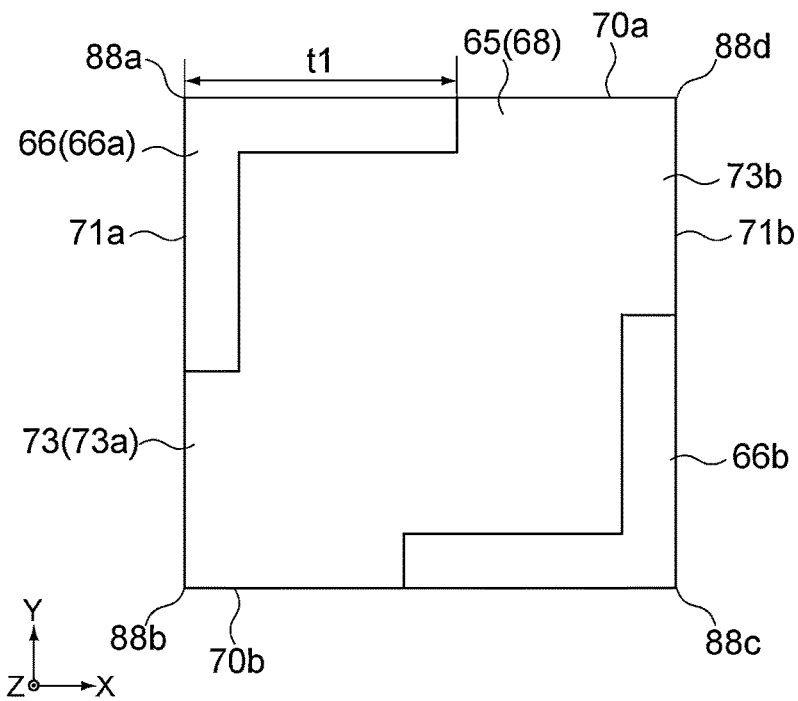
FIGS. 34A, 34B, and 34C are schematic diagrams showing a configuration example of a frame (side diagram, top diagram, lower side perspective diagram).

FIG. 34A is a front diagram of a side (upper side) facing the sensor substrate 7 of the frame 50.

Figure 34B:
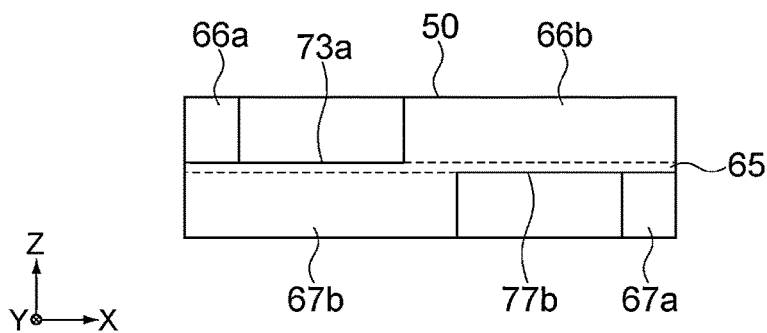

FIG. 34B is a side diagram of the frame 50.

Figure 34C:
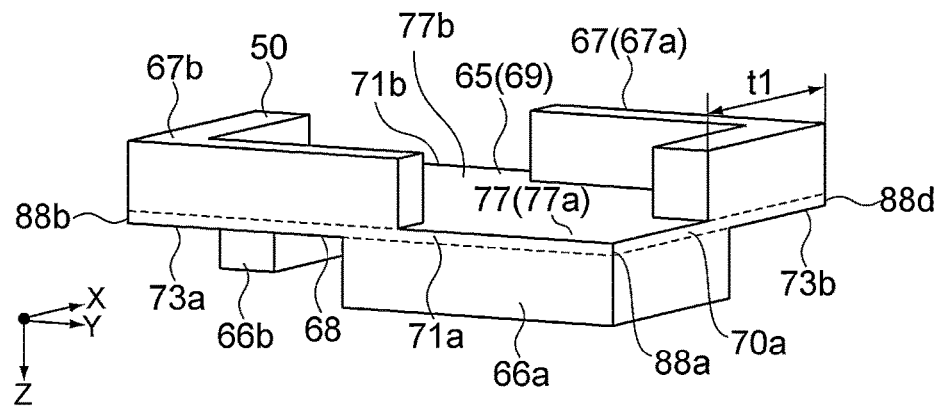

FIG. 34C is a perspective diagram of a side facing the main substrate 20 of the frame 50 (lower side).

As compared with the configuration shown in FIG. 24 and the like, in this example, the positions of the first contact portions 66 and the second contact portions 67 provided in the frame 50 are different.

First, as shown in FIG. 34A and the like, apexes of four corners of the fifth surface 68 of the partition wall portion 65 are defined as follows. The apexes of the four corners of the fifth surface 68 are also apexes of four corners of the sixth surface 69 of the partition wall portion 65.

Apex 88a . . . apex between the side portion 70a at the back side extending in the X direction and the side portion 71a at the left side extending in the Y direction.

Apex 88b . . . apex between the side portion 71a at the left side extending in the Y direction and the side portion 70b at the front side extending in the X direction.

Apex 88c . . . apex between the side portion 70b at the front side extending in the X direction and the side portion 71b at the right side extending in the Y direction.

Apex 88d . . . apex between the side portion 71b at the right side extending in the Y direction and the side portion 70a at the front side extending in the X direction.

Apex 88b . . . apex between the side portion 71a at the left side extending in the Y direction and the side portion 70b at the front side extending in the X direction.

As shown in FIG. 34A and the like, the first contact portions 66a and 66b are formed on the fifth surface 68 of the partition wall portion 65.

The first contact portion 66a has a shape bent by 90 degrees around the apex 88a as the center when viewed from the Z direction. Specifically, the first contact portion 66a is configured in a region from the apex 88a of the side portion 70a at the back side to a predetermined length t1 and a region from the apex 88a of the side portion 71a at the left side to the same length t1.

In the present embodiment, the length t1 is designed to be larger than half of the side portions 70a and 71a. Therefore, in the side portion 70a, the first contact portion 66a is formed from a left end to a region on the right side of the center. In the side portion 71a, the first contact portion 66a is formed from an upper end to a region lower than the center.

The first contact portion 66b has a shape bent by 90 degrees around the apex 88c as the center when viewed from the Z direction. Specifically, the first contact portion 66b is configured in a region from the apex 88c of the side portion 70b at the front side to the length t1 and a region from the apex 88c of the side portion 71b at the right side to the length t1.

Viewed from the Z direction, the first contact portions 66a and 66b are configured to be symmetrical with respect to the center of the partition wall portion 65.

In the periphery of the fifth surface 68 of the partition wall portion 65, regions where the first contact portions 66a and 66b are not formed become the first void regions 73a and 73b.

The first void region 73a has a shape bent by 90 degrees around the apex 88b as the center. The first void region 73b has a shape bent by 90 degrees around the apex 88d as the center.

FIG. 34C is a diagram when the frame 50 is turned upside down such that the apex 88a shown in FIG. 34A is positioned at the apex 88c.

As shown in FIG. 34C, the second contact portions 67a and 67b are formed on the sixth surface 69 of the partition wall portion 65.

The second contact portion 67a has a shape bent by 90 degrees around the apex 88d as the center when viewed from the Z direction. Specifically, the second contact portion 67a is configured in a region from the apex 88d of the side portion 70a to the length t1 and a region from the apex 88d of the side portion 71b to the length t1.

The second contact portion 67b has a shape bent by 90 degrees around the apex 88b as the center when viewed from the Z direction. Specifically, the second contact portion 67b is configured in a region from the apex 88b of the side portion 70b to the length t1 and a region from the apex 88b of the side portion 71a to the length t1.

The first contact portions 66a and 66b and the second contact portions 67a and 67b have different positions when viewed from the Z direction but have the same shape each other.

In the periphery of the sixth surface 69 of the partition wall portion 65, regions where the second contact portions 67a and 67b are not formed become the second void regions 77a and 77b.

The second void region 77a has a shape bent by 90 degrees with the apex 88a as the center. The second void region 77b has a shape bent by 90 degrees around the apex 88c as the center.

When viewed from the Z direction, the position of the first void region 73 of the fifth surface 68 and the position of the second void region 77 of the sixth surface 69 are different from each other.

At least one of the first contact portions 66*a* and 66*b* includes the first connection terminal portion (not shown).

At least one of the second contact portions 67*a* and 67*b* includes the second connection terminal portion (not shown).

The frame 50 includes the connection wires (not shown). By the connection wires, the sensor substrate 7 and the main substrate 20 held in the frame 50 are electrically connected.

As shown in FIG. 33, when the sensor substrate 7 is held in the frame 50, the first space S1 is formed. When the main substrate 20 is held by the frame 50, the second space S2 is formed.

The opening position of the first space S1 (position of each first void region 73) and the opening position of the second space S2 (position of each second void region 77) are configured to be different from each other.

The sensor apparatus 100 shown in FIGS. 33, 34A, 34B, and 34C also exhibits the effects described above.

Figure 35:
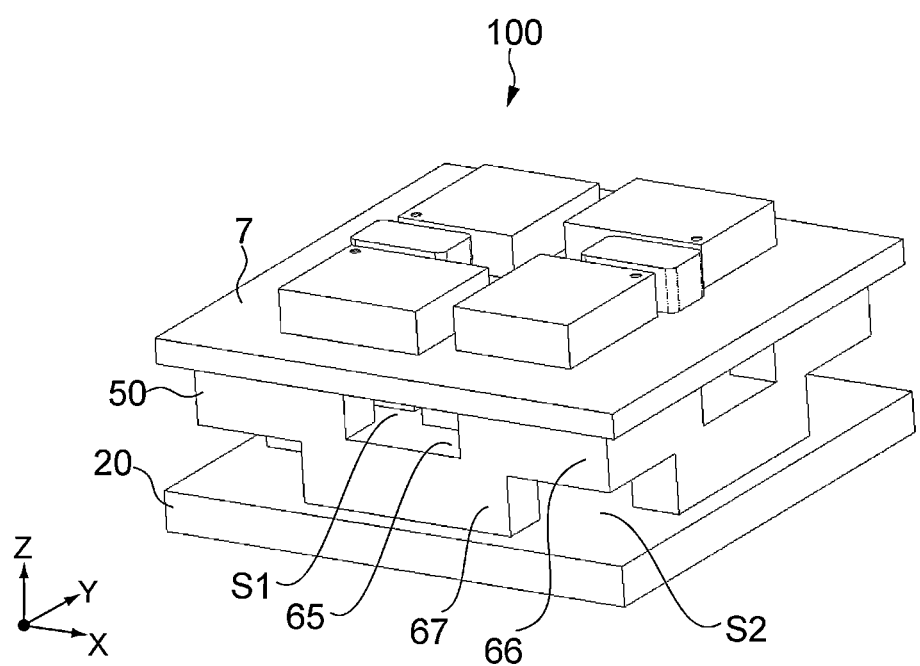
FIG. 35 is a schematic diagram showing other configuration example of the sensor apparatus (perspective diagram).

FIG. 35 is a perspective diagram showing other configuration example of the sensor apparatus 100.

Figure 36A:
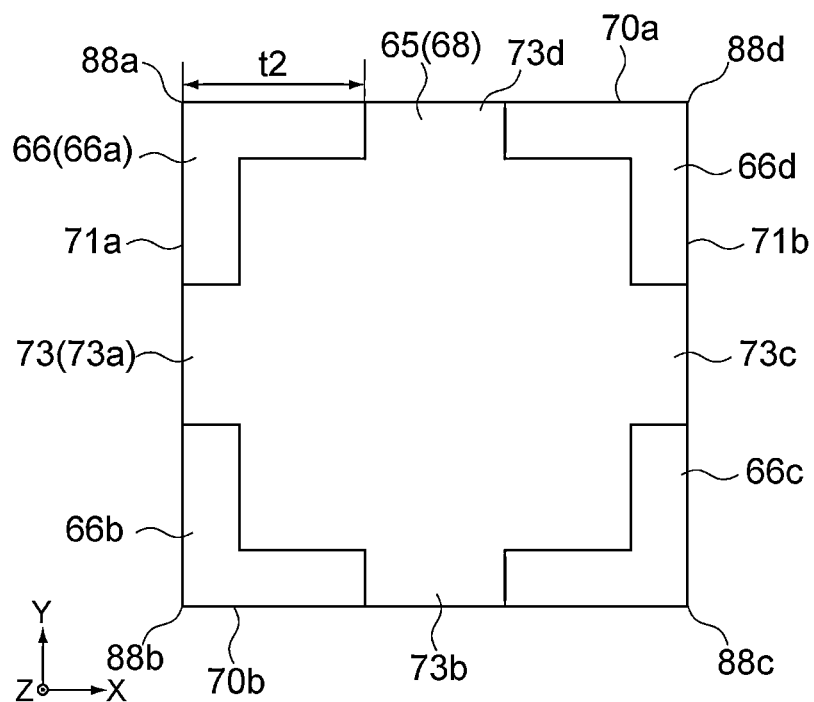
FIGS. 36A, 36B, and 36C are schematic diagrams showing a configuration example of a frame (side diagram, top diagram, lower side perspective diagram).

FIG. 36A is a front diagram of a side (upper side) facing the sensor substrate 7 of the frame 50.

Figure 36B:
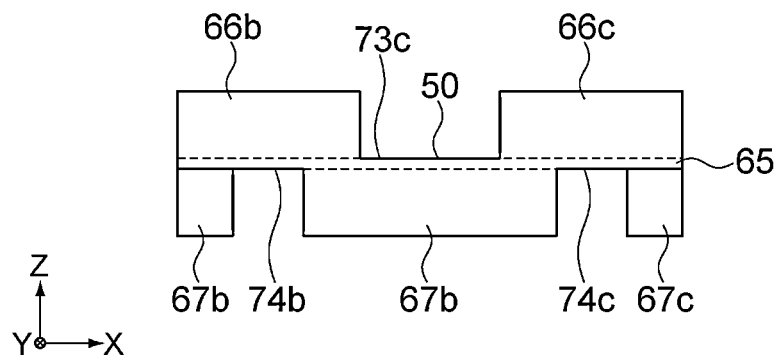

FIG. 36B is a side diagram of the frame 50.

Figure 36C:
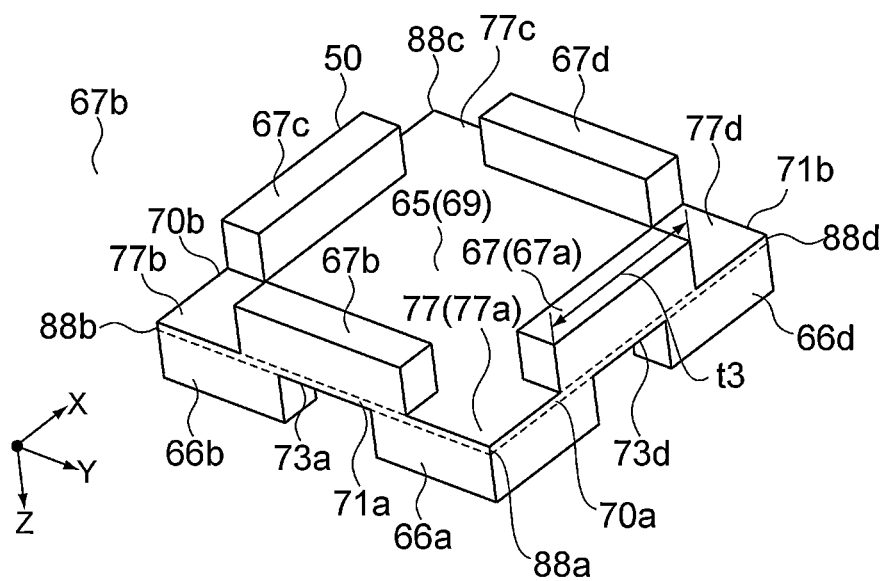

FIG. 36C is a perspective diagram of a side (lower side) facing the main substrate 20 of the frame 50.

As shown in FIG. 36A and the like, first contact portions 66*a* to 66*d* are formed on the fifth surface 68 of the partition wall portion 65.

The first contact portion 66*a* has a shape bent by 90 degrees around the apex 88*a* as the center when viewed from the Z direction. Specifically, the first contact portion 66*a* is configured in a region from the apex 88*a* of the side portion 70*a* at the back side to a predetermined length t2 and a region from the apex 88*a* of the side portion 71*a* at the left side to the same length t2.

In the present embodiment, the length t2 is designed to be smaller than half of the side portions 70*a* and 71*a*. Therefore, in the side portion 70*a*, the first contact portion 66*a* is formed from a left end to a region on the left side of the center. In the side portion 71*a*, the first contact portion 66*a* is formed from an upper end to a region on the upper side of the center.

Each of the first contact portions 66*b* to 66*d* is configured in the same shape as the first contact portion 66*a*. The first contact portion 66*b* is configured with the apex 88*b* as the center. The first contact portion 66*c* is configured with the apex 88*c* as the center. The first contact portion 66*d* is configured with the apex 88*d* as the center.

Viewed from the Z direction, the first contact portions 66*a* to 66*d* are configured to be symmetrical with respect to the center of the partition wall portion 65.

In the periphery of the fifth surface 68 of the partition wall portion 65, the regions where the first contact portions 66*a* to 66*d* are not formed become the first void regions 73*a* to 73*d*.

The region between the first contact portions 66*a* and 66*b* at the center of the side portion 71*a* is the first void region 73*a*.

The region between the first contact portions 66*b* and 66*c* at the center of the side portion 70*b* is the first void region 73*b*.

The region between the first contact portions 66*c* and 66*d* at the center of the side portion 71*b* is the first void region 73*c*.

The region between the first contact portions 66*d* and 66*a* at the center of the side portion 70*a* is the first void region 73*d*.

FIG. 36C is a diagram when the frame 50 is turned upside down such that the apex 88*a* shown in FIG. 36A is positioned at the apex 88*c*.

As shown in FIG. 36C, second contact portions 67*a* to 67*d* are formed on the sixth surface 69 of the partition wall portion 65.

The second contact portion 67*a* is formed in a region having a length t3 at the center of the side portion 70*a*. The length t3 is designed to be larger than half of the side portion 70*a*. The length t3 is designed to be larger than the length of the first void region 73 of the fifth surface 68.

The second contact portion 67*b* is formed in a region of the center of the side portion 71*a* where the length is t3.

The second contact portion 67*c* is formed in a region of the center of the side portion 70*b* where the length is t3.

The second contact portion 67*d* is formed in a region of the center of the side portion 71*b* where the length is t3.

When viewed from the Z direction, the positions of the first contact portions 66 of the fifth surface 68 and the positions of the second contact portions 67 of the sixth surface 69 are different from each other.

In the periphery of the sixth surface 69 of the partition wall portion 65, regions where the second contact portions 67*a* to 67*d* are not formed become second void regions 77*a* to 77*d*.

The second void region 77*a* has a shape bent by 90 degrees with the apex 88*a* as the center.

The second void region 77*b* has a shape bent by 90 degrees around the apex 88*b* as the center.

The second void region 77*c* has a shape center by 90 degrees around the apex 88*c* as the center.

The second void region 77*d* has a shape bent by 90 degrees around the apex 88*d* as the center.

When viewed from the Z direction, the positions of the first void regions 73 of the fifth surface 68 and the positions of the second void regions 77 of the sixth surface 69 are different from each other.

At least one of the first contact portions 66*a* to 66*d* includes the first connection terminal portion (not shown).

At least one of the second contact portions 67*a* to 67*d* includes the second connection terminal portion (not shown).

The frame 50 includes the connection wires (not shown). By the connection wires, the sensor substrate 7 and the main substrate 20 held in the frame 50 are electrically connected.

As shown in FIG. 35, when the sensor substrate 7 is held in the frame 50, the first space S1 is formed. When the main substrate 20 is held by the frame 50, the second space S2 is formed.

The opening position of the first space S1 (position of first void region 73) and the opening position of the second space S2 (position of second void region 77) are configured to be different from each other.

Also, in the sensor apparatus 100 shown in FIGS. 35, 36A, 36B, and 36C, the effects described above are exhibited.

Figure 37:
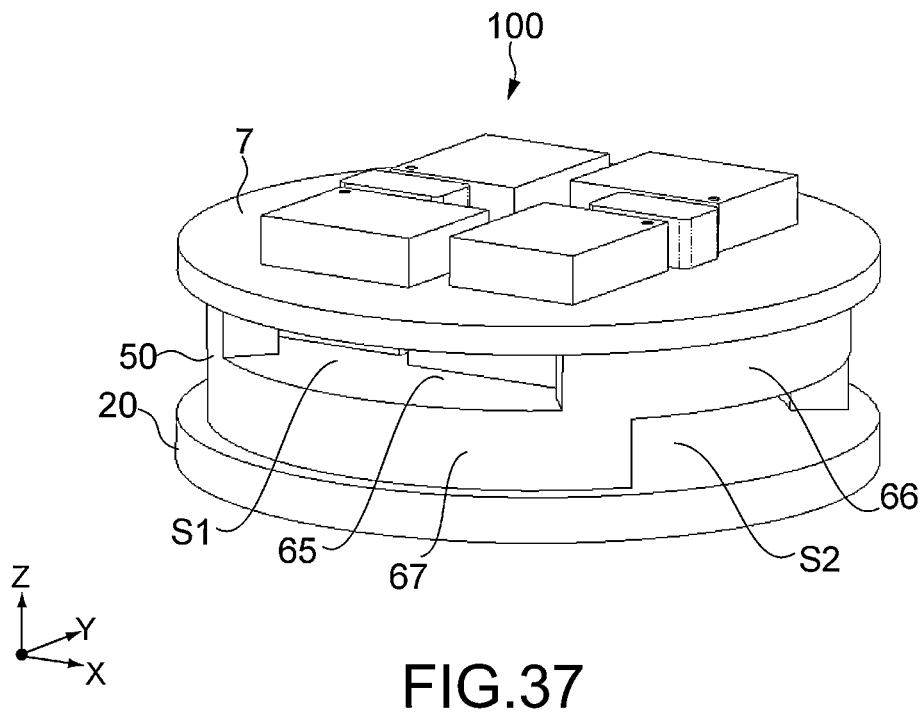
FIG. 37 is a schematic diagram showing other configuration example of the sensor apparatus (perspective diagram).

FIG. 37 is a perspective diagram showing other configuration example of the sensor apparatus 100.

Figure 38:
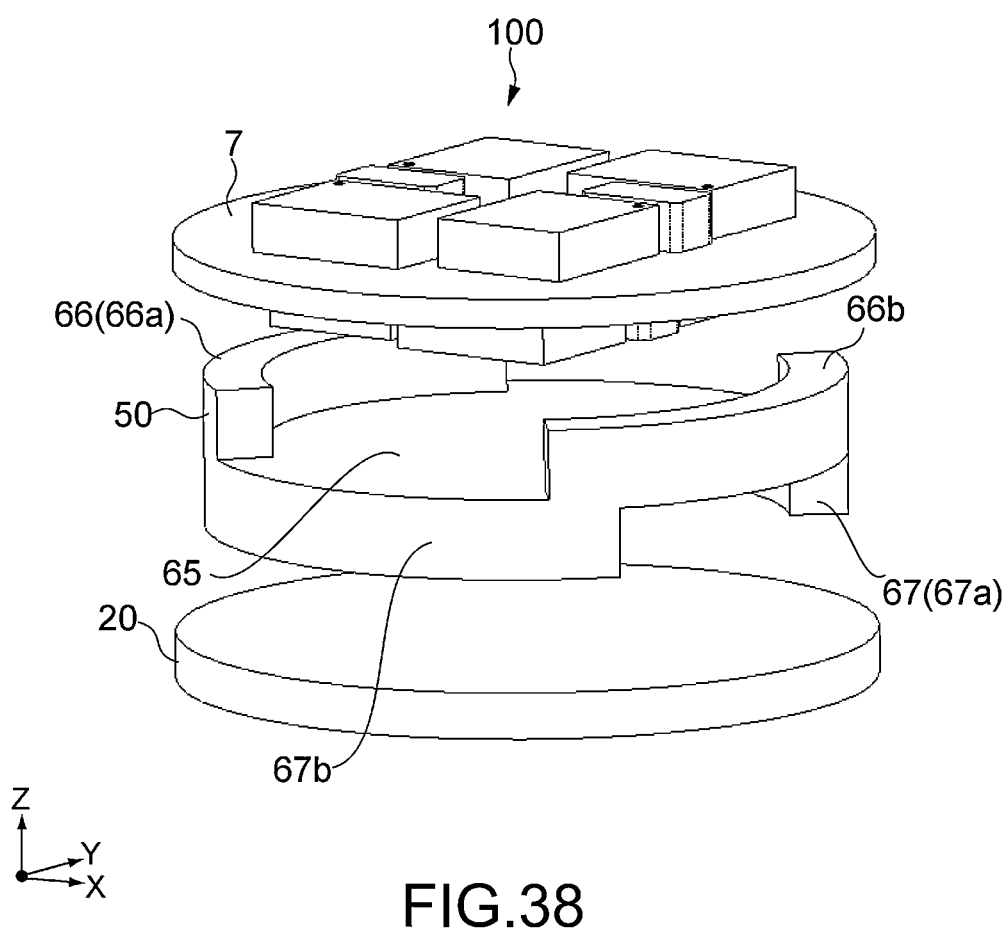
FIG. 38 is a schematic diagram showing other configuration example of the sensor apparatus (exploded perspective diagram).

FIG. 38 is an exploded perspective diagram of the sensor apparatus 100.

Figure 39A:
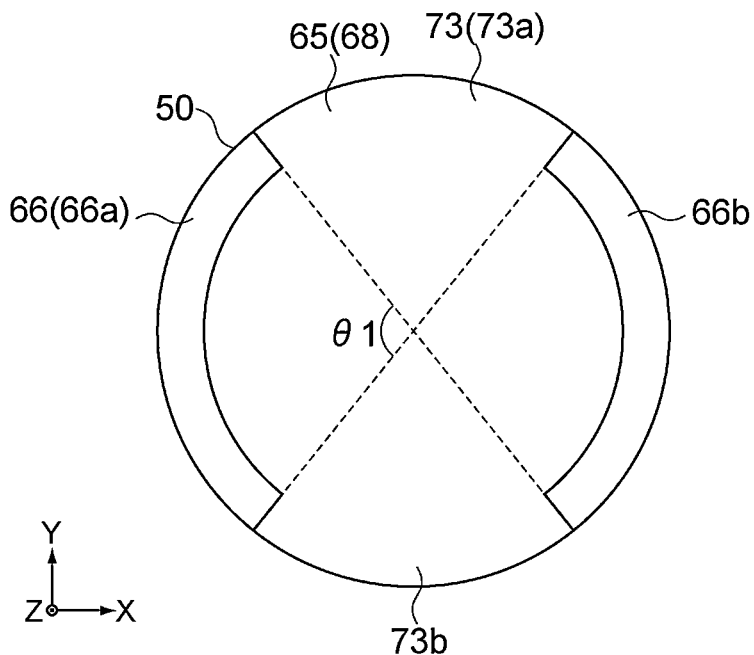
FIGS. 39A, 39B, and 39C are schematic diagrams showing a configuration example of a frame (side diagram, top diagram, lower side perspective diagram).

FIG. 39A is a front diagram of a side (upper side) facing the sensor substrate 7 of the frame 50.

Figure 39B:
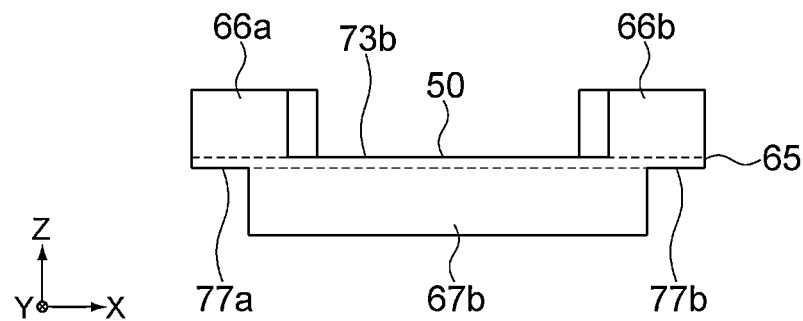

FIG. 39B is a side diagram of the frame 50.

Figure 39C:
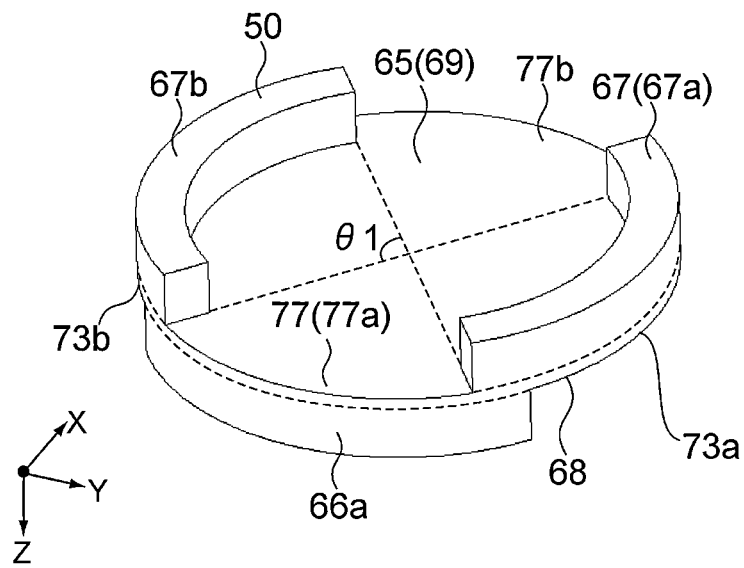

FIG. 39C is a perspective diagram of a side (lower side) facing the main substrate 20 of the frame 50.

As shown in FIG. 39A and the like, as viewed from the Z direction, each of the sensor substrate 7, the main substrate 20, and the partition wall portion 65 of the frame 50 has a circular shape.

The first contact portions 66a and 66b are formed on the fifth surface 68 of the partition wall portion 65 of the frame 50.

The first contact portion 66a is formed on a periphery of the circular partition wall portion 65 in a range of a predetermined angle θ1. Therefore, the first contact portion 66a has an arc shape, as viewed from the Z direction. Incidentally, the predetermined angle θ1 is designed to be smaller than 180 degrees.

The first contact portion 66b is formed at a position facing the first contact portion 66a. In the present embodiment, the first contact portions 66a and 66b face each other along the X direction.

The first contact portion 66b is formed on the periphery of the circular partition wall portion 65 in the range of the same angle θ1. Therefore, when viewed from the Z direction, the first contact portions 66a and 66b are formed to be symmetrical with respect to the center of the partition wall portion 65.

In the periphery of the fifth surface 68 of the partition wall portion 65, regions where the first contact portions 66a and 66b are not formed become the first void regions 73a and 73b.

The first void region 73a and 73b are at positions facing each other along the Y direction and have arc shapes when viewed from the Z direction.

FIG. 39C is a diagram when the frame 50 is turned upside down so that the first contact portion 66a shown in FIG. 39A is positioned on the front side.

As shown in FIG. 39C, the second contact portions 67a and 67b are formed on the sixth surface 69 of the partition wall portion 65.

Each of the second contact portions 67a and 67b is formed in the range of the angle θ1 of the periphery of the circular partition wall portion 65. The second contact portions 67a and 67b are arranged so as to face each other along the Y direction.

Accordingly, the second contact portions 67a and 67b are formed at positions obtained by rotating the first contact portions 66a and 66b formed on the fifth surface 68 at an angle of 90 degrees.

The first contact portions 66a and 66b and the second contact portions 67a and 67b have different positions when viewed from the Z direction but have the same shape each other.

In the periphery of the sixth surface 69 of the partition wall portion 65, the regions where the second contact portions 67a and 67b are not formed become the second void regions 77a and 77b.

The second void regions 77a and 77b are at positions facing each other along the X direction and have arc shapes when viewed from the Z direction.

When viewed from the Z direction, the position of the first void region 73 of the fifth surface 68 and the position of the second void region 77 of the sixth surface 69 are different from each other.

At least one of the first contact portions 66a and 66b includes the first connection terminal portion (not shown).

At least one of the second contact portions 67a and 67b includes the second connection terminal portion (not shown).

The frame 50 includes the connection wires (not shown). By the connection wires, the sensor substrate 7 and the main substrate 20 held in the frame 50 are electrically connected.

As shown in FIG. 37, when the sensor substrate 7 is held in the frame 50, the first space S1 is formed. When the main substrate 20 is held by the frame 50, the second space S2 is formed.

The opening position of the first space S1 (position of each first void region 73) and the opening position of the second space S2 (position of each second void region 77) are configured to be different from each other.

Also, in the sensor apparatus 100 shown in FIGS. 37, 38, 39A, 39B, and 39C, the effects described above are exhibited.

Figure 40:
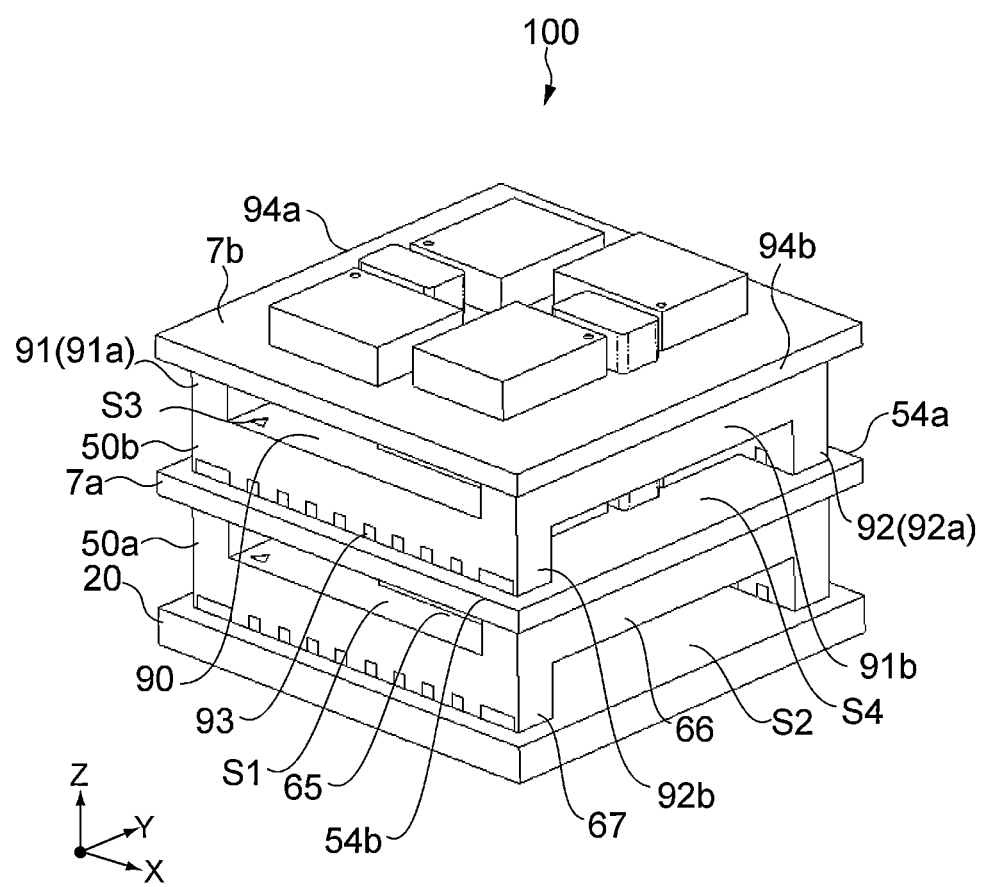
FIG. 40 is a schematic diagram showing other configuration example of the sensor apparatus (perspective diagram).

FIG. 40 is a perspective diagram showing other configuration example of the sensor apparatus 100.

Figure 41:
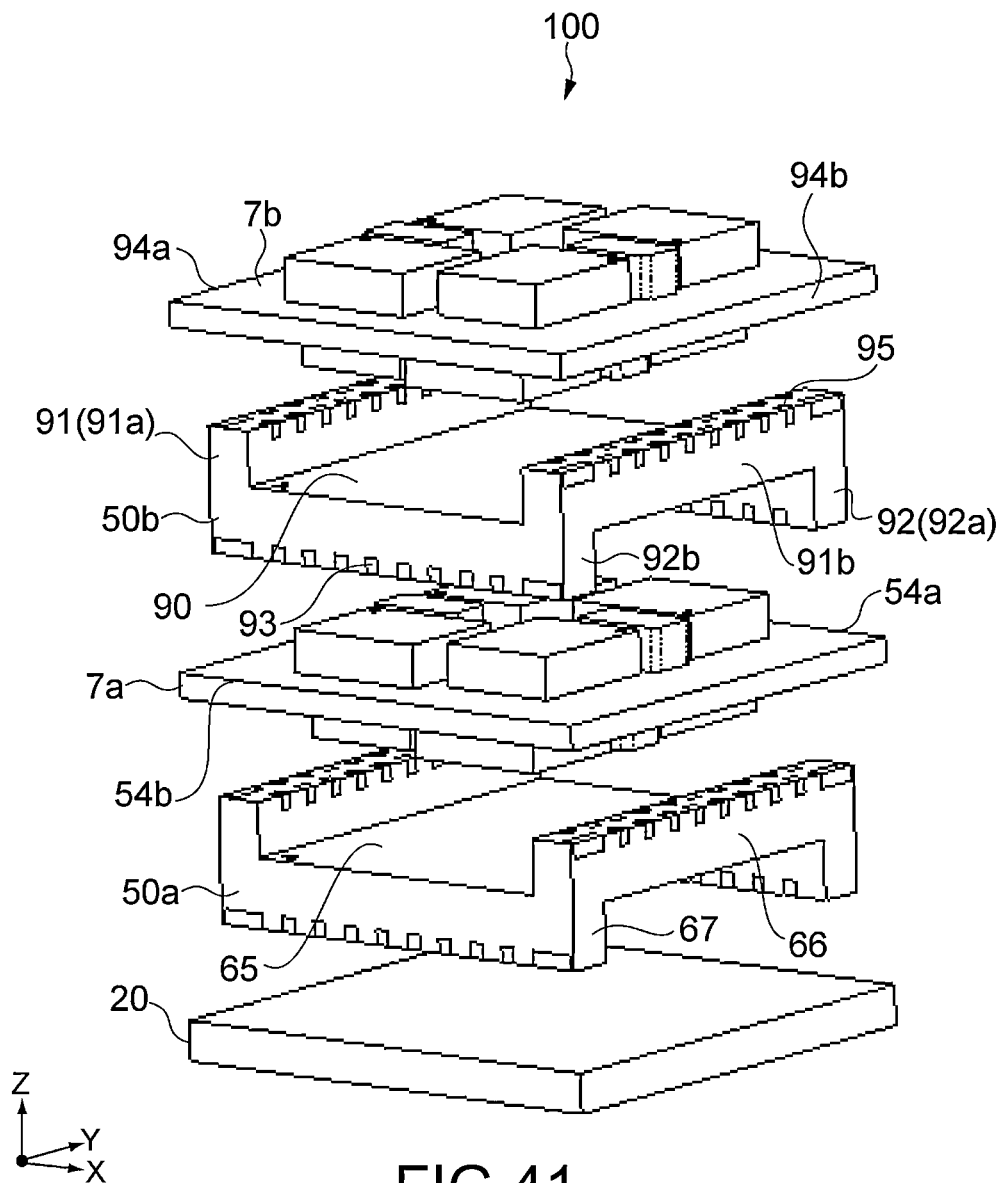
FIG. 41 is a schematic diagram showing other configuration example of the sensor apparatus (exploded perspective diagram).

FIG. 41 is an exploded perspective diagram of the sensor apparatus 100.

The sensor apparatus 100 according to the present embodiment, by a plurality of frames 50, the main substrate 2 and the plurality of sensor substrates 7 are held. Specifically, by the plurality of frames 50, it is possible to stack the plurality of sensor substrates 7 along the vertical direction.

In the example shown in FIG. 40 and FIG. 41, the sensor apparatus 100 includes the main substrate 20, a first frame 50a, the first sensor substrate 7a, a second frame 50b, and the second sensor substrate 7b.

The first frame 50a includes the partition wall portion 65, one or more first contact portions 66, and one or more second contact portions 67. In the first frame 50a, the connection wire as shown in FIGS. 30A, 30B, 30C, 31A, 31B, and 31C (hereinafter referred to as first connection wire) are inserted.

The first frame 50a holds the first sensor substrate 7 and the main substrate 20 so as to electrically connect the first sensor substrate 7a and the main substrate 20 by the first connection wire.

The second frame 50b has the same configuration as the first frame 50a and is connected to the first sensor substrate 7a. The second sensor substrate 7b is connected to an upper side of the second frame 50b.

The second frame 50b has a partition wall portion 90 arranged between the first sensor substrate 7a and the second sensor substrate 7b, one or more contact portions 91 in contact with the second sensor substrate 7b, and one or more contact portions 92 in contact with the first sensor substrate 7a.

The partition wall portion 90 is a portion corresponding to the partition wall portion 65 of the first frame 50a.

The one or more contact portions 91 are portions corresponding to the one or more first contact portions 66 of the first frame 50a. The one or more contact portions 92 are portions corresponding to the one or more second contact portions 67 of the first frame 50a.

In the second frame 50b, a connection wire shown in FIGS. 30A, 30B, 30C, 31A, 31B, and 31C (hereinafter referred to as second connection wire) is inserted.

The second frame 50b holds the first sensor substrate 7a and the second sensor substrate 7b so as to electrically connect the second sensor substrate 7b and the main substrate 20 by the first connection wire and the second connection wire.

In other words, the second frame 50a is connected to the first sensor substrate 7a and holds the second sensor substrate 7b so as to electrically connect the second sensor substrate 7b and the main substrate 20 by the first connection wire and the second connection wire.

In the example shown in FIG. 40 and FIG. 41, the inside of the two side portions 54a and 54b along the X direction of the upper surface of the first sensor substrate 7a is inContact with the two contact portions 92a and 92b of the second frame 50b.

On the upper surface of the first sensor substrate 7a, along the two side portions 54a and 54b, the connection terminal portion (not shown) is formed. The connection terminal portion is electrically connected to the connection terminal portion 93 formed in the two contact portions 92a and 92b of the second frame 50b.

On the lower surface of the second sensor substrate 7a, along the two side portions 94a and 94b along the Y direction, the connection terminal portion (not shown) is formed. The connection terminal portion is electrically connected to the connection terminal portion 95 formed in the two contact portions 91a and 91b of the second frame 50b.

Thus, the second sensor substrate 7b and the main substrate 20 is electrically connected via the second frame 50b (second connection wire), the first sensor substrate 7a, and the first frame 50a (first connection wire).

The wire configuration formed in the first sensor substrate 7a for realizing the electrical connection is not limited and may be arbitrarily designed.

As shown in FIG. 40, a third space S3 is formed at an upper side of the partition wall portion 90 of the second frame 50b. A space S4 is formed at a lower side of the partition wall portion 90.

In the example shown in FIG. 40, the first frame 50a and the second frame 50b are stacked so as to be oriented in the same direction. Thus, an opening position of the third space S3 becomes the same position as the opening position of the first space S1 and is different from a spatial position of the second space S2. An opening position of the fourth space S4 becomes a position different from the opening position of the first space S1 and is the same as the spatial position of the second space S2.

Needless to say, it is not limited to such a configuration, and the first frame 50a and the second frame 50b may be arranged so as to be rotated by 90 degrees with respect to each other. In this case, the opening position of the third space S3 is different from the opening position of the first space S1 and is the same as the spatial position of the second space S2. The opening position of the fourth space S4 becomes the same as the opening position of the first space S1 and is different from the spatial position of the second space S2.

For example, in a multi-stage configuration of the sensor substrate 7, an orientation of each frame 50 may be appropriately set based on the effect of heat from the main substrate 20 to each sensor substrate 7, the wire configuration or the like for electrically connecting the sensor substrate 7 and the main substrate 20.

Thus, by using the plurality of frames 50, the sensor apparatus 100 on which the plurality of sensor substrates 7 are mounted can be realized in a compact and simple configuration.

Needless to say, the number of stages of the stack is not limited, and a multi-stage configuration including an arbitrary number of stages can be easily realized. That is, by using the plurality of frames 50, it is possible to provide a high expandability to the sensor apparatus 100.

Needless to say, even in the configurations shown in FIG. 33, FIG. 35, FIG. 37, and the like, it is possible to realize the multi-stage configuration of the sensor substrate 7 by using the plurality of frames 50. Furthermore, the plurality of frames 50 are not limited to the case where they all have the same configuration, and the plurality of frames 50 having different configurations may be used.

[Device Type]

The type of device capable of mounting the sensor apparatus 100 according to the present technology is not limited. It is possible to mount the sensor apparatus 100 according to the present technology to various devices in various fields.

For example, it is possible to apply the present technology to any electronic device, such as a mobile phone, a smartphone, a personal computer, a game machine, a game controller, a digital camera, audio equipment, a TV, a projector, a car navigation, a GPS terminal, a wearable information devices such as an HMD (eyeglasses type, wristband type), an IoT device connected to the Internet or the like.

It is also possible to mount the sensor apparatus 100 according to the present technology to a flight object such as a drone, a robot, a move device such as an automobile, a construction machine, or the like.

For example, it is also possible to mount the sensor apparatus 100 according to the present technology to any device to be calculated such as posture detection and self-position estimation.

Furthermore, it is also possible to mount the sensor apparatus 100 according to the present technology to a pen-type operation device for a user to grasp by hand, write characters, draw pictures, or the like. It is also possible to realize an application to distinguish and reproduce characters and pictures written and drawn by the user based on an output result of the sensor apparatus 100.

For example, by using a compact sensor apparatus 100 having a cylindrical shape as shown in FIGS. 23A and 23B, it easily realizes attaching to a top of the pen-type operation device and attaching to inside of the pen-type operation device. Needless to say, it is not limited to such a mounting method.

As described above, in the sensor apparatus 100 according to the present embodiment, one or more first IMU sensors 11 are arranged on the first surface 8 of the sensor substrate 7. One or more second IMU sensors 12 are arranged on the second surface 9 opposite to the first surface 8. By arranging the IMU sensor 5 on both the first surface 8 and the second surface 9, it is possible to reduce the size of the apparatus and to suppress the deformation of the sensor substrate 7 due to heat. Thus, it is possible to realize a highly accurate measurement based on the detection result (sensing result) of the plurality of IMU sensors 5.

For example, the use of expensive and large IMU sensors makes it possible to perform highly accurate inertial measurement. On the other hand, when using the MEMS-IMU sensor, although it is possible to suppress the cost, the measurement accuracy may be slightly reduced.

By using the present technology, based on the detection result of the plurality of MEMS-IMU sensors arranged on both sides of the sensor substrate 7, it is possible to realize a highly accurate inertial measurement. As a result, it is possible to improve the measurement accuracy while reducing the size of the apparatus. It is also possible to suppress the cost.

That is, by using the present technology, it is possible to realize a sensor apparatus having a high measurement accuracy in a small size without adopting a special substrate or mounting technology, a large-scale reinforcing structure or the like.

OTHER EMBODIMENTS

The present technology is not limited to the embodiments described above and can realize various other embodiments.

Figure 42:
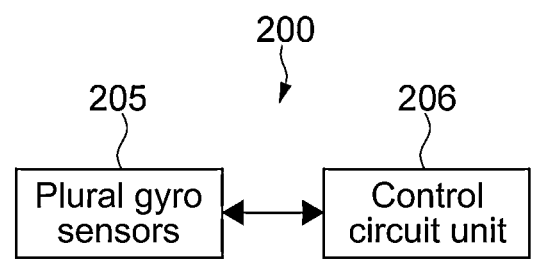
FIG. 42 is a block diagram for explaining a functional outline of a sensor apparatus according to other embodiment.

FIG. 42 is a block diagram for explaining a functional outline of a sensor apparatus according to other embodiment.

A sensor apparatus 200 shown in FIG. 42 includes a plurality of gyro sensors 205 and a control circuit unit 206.

Instead of the IMU sensor 5, it is possible to apply the present technology even when the gyro sensors 205 are used. For example, in the above description, the "IMU sensors" may be replaced with the "gyro sensors" to implement the present technology.

It should be appreciated that the present technology includes a configuration in which one gyro sensor is arranged on the first surface of the sensor substrate and/or a pair of gyro sensors are arranged on the second surface. The gyro sensor may also be configured as an MEMS sensor.

The present technology may be applied when sensors other than the IMU sensors or gyro sensors are used. For example, the present technology may be applied to a case where an acceleration sensor, various biological sensors, a temperature sensor, an illuminance sensor, or the like is used.

In the above, as an embodiment of the sensor apparatus according to the present technology, a case where the sensor apparatus is constituted by a rigid flexible substrate is taken as an example. It should be appreciated that it is not limited to such a configuration. For example, a connector is provided on each of the one or more sensor substrates and the main substrate constituted by the rigid substrate. The flexible substrate is connected to the connector of each substrate, and each substrate is electrically connected via the flexible substrate. With such a configuration, it is also possible to realize an embodiment of the sensor apparatus according to the present technology.

The sensor apparatus, the sensor substrate, the main substrate, the flexible substrate, the holding portion, the frame, each configuration such as members included therein, the measurement method and the like described with reference to the drawings are merely embodiments and can be arbitrarily modified within the scope not deviating from the scope of the present technology. In other words, for example, any other configurations or algorithms for practicing the present technology may be adopted.

In the above description, the word "substantially" has been used as appropriate to describe shapes and the like. This is used merely to facilitate understanding of the description, and the use/non-use of the word "substantially" does not have any particular meaning.

That is, in the present disclosure, concepts defining shapes, sizes, positional relationships, states, and the like, such as "central," "center," "uniform," "equal," "same," "orthogonal," "parallel," "symmetric," "extending," "axial," "cylindrical," "columnar," "ring," "annular," and the like, are concepts including "substantially central," "substantially center," "substantially uniform," "substantially equal," "substantially same," "substantially orthogonal," "substantially parallel," "substantially symmetric," "substantially extending," "substantially axial," "substantially cylindrical," "substantially columnar," "substantially ring," "substantially annular," and the like.

For example, states included in a predetermined range (e.g., ±10% range) based on "perfectly central," "perfectly center," "perfectly uniform," "perfectly equal," "perfectly same," "perfectly orthogonal," "perfectly parallel," "perfectly symmetric," "perfectly extending," "perfectly axial," "perfectly cylindrical," "perfectly columnar," "perfectly ring," "perfectly annular," and the like are also included.

Therefore, even when the word "substantially" is not added, a concept expressed by adding a so-called "substantially" may be included. On the contrary, a complete state is not excluded for the state represented by the addition of "substantially".

At least two of the features of the present technology described above can also be combined. In other words, various features described in the respective embodiments may be combined discretionarily regardless of the embodiments. Furthermore, the various effects described above are not limitative but are merely illustrative, and other effects may be provided.

The present technology may also have the following structures.

(1) A sensor apparatus, including:
  a substrate having a first surface and a second surface opposite to the first surface;
  one or more first IMU sensors arranged on the first surface; and
  one or more second IMU sensors arranged on the second surface.

(2) The sensor apparatus according to (1), in which
  each of the one or more first IMU sensors and each of the one or more second IMU sensors is an MEMS sensor.

(3) The sensor apparatus according to (1) or (2), in which
  a first arrangement configuration of the plurality of first IMU sensors arranged on the first surface and a second arrangement configuration of the plurality of second IMU sensors arranged on the second surface correspond to each other.

(4) The sensor apparatus according to (3), in which
  the first arrangement configuration and the second arrangement configuration are equal to each other.

(5) The sensor apparatus according to any one of (1) to (4), in which
  the one or more first IMU sensors are the plurality of first IMU sensors, and the one or more second IMU sensors are the plurality of second IMU sensors having the number corresponding to the number of the plurality of first IMU sensors.

(6) The sensor apparatus according to (5), in which
  the number of the plurality of second IMU sensors are the same as the number of the plurality of first IMU sensors.

(7) The sensor apparatus according to (5) or (6), in which
  each of the plurality of first IMU sensors is arranged at predetermined positions on the first surface, and each of the plurality of second IMU sensors is arranged on the second surface at positions corresponding to the positions of the plurality of first IMU sensors on the first surface.

(8) The sensor apparatus according to (7), in which
  the position of each of the plurality of first IMU sensors on the first surface and the position of each of the plurality of second IMU sensors on the second surface are equal to each other.

(9) The sensor apparatus according to (7), in which
  each of the plurality of second IMU sensors is arranged on the second surface at positions opposite to the positions of the plurality of first IMU sensors on the first surface.

(10) The sensor apparatus according to any one of (5) to (9), in which
  the plurality of first IMU sensors is symmetrically arranged with respect to a predetermined first reference position of the first surface.

(11) The sensor apparatus according to (10), in which
the plurality of second IMU sensors is symmetrically arranged with respect to a second reference position of the second surface corresponding to the first reference position.
(12) The sensor apparatus according to any one of (1) to (11), further including:
a control circuit unit for controlling an operation of each of the one or more first IMU sensors and the one or more second IMU sensors.
(13) The sensor apparatus according to (12), further including:
in a case where the substrate having the first surface and the second surface is a sensor substrate,
one or more sensor substrates;
a main substrate on which the control circuit unit is arranged, the main substrate formed separately from the one or more sensor substrates; and
one or more flexible substrates that electrically connect the one or more sensor substrates and the main substrate.
(14) The sensor apparatus according to (13), in which
the one or more sensor substrates include a first sensor substrate and a second sensor substrate, and
the one or more flexible substrates include a first flexible substrate electrically connecting the first sensor substrate and the main substrate, and a second flexible substrate electrically connecting the second sensor substrate and the main substrate.
(15) The sensor apparatus according to (14), in which
the main substrate has a third surface on which the control circuit unit is arranged and a fourth surface opposite to the third surface,
the first sensor substrate is arranged at a position facing the third surface or the fourth surface of the main substrate by bending the first flexible substrate, and
the second sensor substrate is arranged at a position facing the third surface or the fourth surface of the main substrate by bending the second flexible substrate.
(16) The sensor apparatus according to (15), in which
the second sensor substrate is arranged at a position on a surface facing the first sensor substrate selected from the third surface and the fourth surface of the main substrate.
(17) The sensor apparatus according to (15), in which
the second sensor substrate is arranged at a position on an opposite surface facing the first sensor substrate selected from the third surface and the fourth surface of the main substrate.
(18) The sensor apparatus according to any one of (13) to (17), further including:
a holding portion that holds the main substrate and the one or more sensor substrates arranged at predetermined positions with respect to the main substrate by bending the one or more flexible substrates.
(19) The sensor apparatus according to (12), further including:
in a case where the substrate having the first surface and the second surface is a sensor substrate,
a main substrate on which the control circuit unit is arranged, the main substrate formed separately from the one or more sensor substrates; and
a frame that has a connection wire and holds the sensor substrate and the main substrate such that the sensor substrate and the main substrate are electrically connected by the connection wire.
(20) The sensor apparatus according to (19), in which
the main substrate has a third surface on which the control circuit unit is arranged and a fourth surface on the opposite side of the third surface, and
the frame holds the sensor substrate and the main substrate such that the sensor substrate faces the third surface or the fourth surface of the main substrate.
(21) The sensor apparatus according to (20), in which
in a case where a surface facing the main substrate selected from the first surface and the second surface of the sensor substrate is taken as a first opposing surface, and
in a case where a surface facing the sensor substrate selected from the third surface and the fourth surface of the main substrate is taken as a second opposing surface,
the frame includes a partition wall portion arranged between the first opposing surface and the second opposing surface,
one or more first contact portions extending from the partition wall portion to a sensor substrate side and in contact with the sensor substrate, and
one or more second contact portions extending from the partition wall portion to a main substrate side and in contact with the main substrate.
(22) The sensor apparatus according to (21), in which
the partition wall portion is formed of a flat plate shape and has a fifth surface facing the sensor substrate and a sixth surface facing the sensor substrate,
the one or more first contact portions are formed in regions of a portion of a periphery of the fifth surface, and
the one or more second contact portions are formed in regions of a portion of a periphery of the sixth surface.
(23) The sensor apparatus according to (22), in which
when viewed from a direction in which the sensor substrate and the main substrate face each other,
positions of the regions in which the one or more first contact portions of the periphery of the fifth surface are formed and positions of regions in which the one or more second contact portions of the periphery of the sixth surface are formed are different from each other.
(24) The sensor apparatus according to (23), in which
when viewed from a direction in which the sensor substrate and the main substrate face each other,
positions of one or more first void regions in which the one or more first contact portions of the periphery of the fifth surface are not formed and positions of one or more second void regions in which the one or more second contact portions of the periphery of the sixth surface are not formed are different from each other.
(25) The sensor apparatus according to (24), in which
when viewed from a direction in which the sensor substrate and the main substrate face each other,
the one or more first contact portions are formed in regions on opposite sides of the one or more second void regions of the sixth surface, and
the one or more second contact portions are formed in regions which are opposite sides of the one or more first void regions of the fifth surface.
(26) The sensor apparatus according to (24) or (25), in which
in a case where the sensor substrate is held on the frame, a first space is formed in which the positions of the one or more first void regions of the fifth surface are open by the partition wall portion, the first contact portion, and the sensor substrate, in a case where the main substrate is held by the frame, a second space is formed in which the positions of the one or more second void regions of the sixth surface are open by the partition wall portion, the second contact portion, and the main substrate.

(27) The sensor apparatus according to (26), in which
when viewed from a direction in which the sensor substrate and the main substrate face each other,
an opening position of the first space and an opening position of the second space are different from each other.

(28) The sensor apparatus according to any one of (21) to (27), in which
when viewed from a direction in which the sensor substrate and the main substrate face each other,
the sensor substrate, the main substrate, and the partition wall have the same shape each other.

(29) The sensor apparatus according to (28), in which
when viewed from the direction in which the sensor substrate and the main substrate face each other,
the sensor substrate, the main substrate, and the partition wall portion have rectangular shapes,
the first contact portion is formed on two first side portions extending in the first direction of the fifth surface and facing each other, and
the second contact portion is formed on two second side portions extending in a second direction orthogonal to the first direction of the sixth surface and facing each other.

(30) The sensor apparatus according to any one of (21) to (29), in which
the connection wire includes
a first connection terminal portion formed on at least one of the one or more first contact surfaces in contact with the sensor substrate of the one or more first contact portions,
a second connection terminal portion formed on at least one of the one or more second contact surfaces in contact with the main substrate of the one or more second contact portions, and
a wire portion electrically connecting the first connection terminal portion and the second connection terminal portion.

(31) The sensor apparatus according to (30), in which
a connection terminal portion which is electrically connected to the first connection terminal portion is formed on a surface in contact with the first contact surface of the sensor substrate, and
a connection terminal portion which is electrically connected to the second connection terminal portion is formed on a surface in contact with the second contact surface of the main substrate.

(32) The sensor apparatus according to any one of (19) to (31), in which
in a case where the sensor substrate is the first sensor substrate and the frame is a first frame,
the sensor apparatus includes a second sensor substrate and a second frame,
the first frame has a first connection wire, and holds the first sensor substrate and the main substrate such that the first sensor substrate and the main substrate are electrically connected by the first connection wire, and the second frame has a second connection wire and holds the first sensor substrate and the second sensor substrate such that the second sensor substrate and the main substrate are electrically connected by the first connection wire and the second connection wire.

(33) The sensor apparatus according to any one of (1) to (32), further including:
one or more dummy components arranged on at least one of the first surface or the second surface.

(34) A sensor apparatus, including:
a substrate having a first surface and a second surface opposite to the first surface;
one or more first gyro sensors arranged on the first surface; and
one or more second gyro sensors arranged on the second surface.

(35) The sensor apparatus according to (33), in which
the one or more dummy components are arranged on the second surface,
a sum of the number of each of the one or more second IMU sensors and the one or more dummy components is the same number as the plurality of first IMU sensors.

(36) The sensor apparatus according to (13), in which
the one or more sensor substrates are three or more sensor substrates.

(37) The sensor apparatus according to (13), in which
the main substrate and the sensor substrate are rigid substrates.

(38) The sensor apparatus according to any one of (19) to (32), in which
the sensor substrate is a ceramic substrate.

(39) The sensor apparatus according to (20), in which
the one or more first gyro sensors are MEMS sensors, and
the one or more second gyro sensors are MEMS sensors.

REFERENCE SIGNS LIST

P1 first reference position
P2 second reference position
5 IMU sensor
6, 206 control circuit unit
7 sensor substrate
11 first IMU sensor
12 second IMU sensor
15 other electronic component
17 dummy component
20 main substrate
24 FPGA
30 holder portion
50 frame
100, 200 sensor apparatus
205 gyro sensor

The invention claimed is:
1. A sensor apparatus, comprising:
a substrate having a first surface and a second surface, wherein
the second surface is opposite to the first surface;
a plurality of first Inertial Measurement Unit (IMU) sensors on the first surface;
a plurality of second IMU sensors on the second surface, wherein
a number of IMU sensors of the plurality of second IMU sensors is the same as a number of IMU sensors of the plurality of first IMU sensors; and a plurality of first electronic components on the first surface, wherein
an arrangement of the plurality of first electronic components on the first surface is in a first direction, and is symmetrical with respect to a reference position on the first surface,
the plurality of first electronic components is different from the plurality of first IMU sensors and the plurality of second IMU sensors, and
the plurality of first electronic components includes at least one of a first diode, a first transistor, a first resistor, a first coil, a first relay, or a first switch.

2. The sensor apparatus according to claim 1, wherein
each IMU sensor of the plurality of first IMU sensors is a first Micro Electro Mechanical System (MEMS) sensor, and
each IMU sensor of the plurality of second IMU sensors is a second MEMS sensor.

3. The sensor apparatus according to claim 1, wherein a first arrangement configuration of the plurality of first IMU sensors on the first surface corresponds to a second arrangement configuration of the plurality of second IMU sensors on the second surface.

4. The sensor apparatus according to claim 3, wherein the first arrangement configuration is same as the second arrangement configuration.

5. The sensor apparatus according to claim 1, wherein positions of the plurality of second IMU sensors on the second surface correspond to positions of the plurality of first IMU sensors on the first surface.

6. The sensor apparatus according to claim 5, wherein a position of each IMU sensor of the plurality of first IMU sensors on the first surface is same as a position of each IMU sensor of the plurality of second IMU sensors on the second surface.

7. The sensor apparatus according to claim 5, wherein the positions of the plurality of second IMU sensors on the second surface are opposite to the positions of the plurality of first IMU sensors on the first surface.

8. The sensor apparatus according to claim 1, wherein the plurality of first IMU sensors has a symmetrical arrangement with respect to a first reference position on the first surface.

9. The sensor apparatus according to claim 8, wherein
the plurality of second IMU sensors has a symmetrical arrangement with respect to a second reference position on the second surface, and
the second reference position corresponds to the first reference position.

10. The sensor apparatus according to claim 1, further comprising: a control circuit unit for controlling an operation of each of the plurality of first IMU sensors and the plurality of second IMU sensors.

11. The sensor apparatus according to claim 10, further comprising: in a case where the substrate having the first surface and the second surface is a sensor substrate, one or more sensor substrates; a main substrate on which the control circuit unit is arranged, the main substrate formed separately from the one or more sensor substrates; and one or more flexible substrates that electrically connect the one or more sensor substrates and the main substrate.

12. The sensor apparatus according to claim 11, wherein the one or more sensor substrates include a first sensor substrate and a second sensor substrate, and the one or more flexible substrates include a first flexible substrate electrically connecting the first sensor substrate and the main substrate, and a second flexible substrate electrically connecting the second sensor substrate and the main substrate.

13. The sensor apparatus according to claim 12, wherein the main substrate has a third surface on which the control circuit unit is arranged and a fourth surface opposite to the third surface, the first sensor substrate is arranged at a position facing the third surface or the fourth surface of the main substrate by bending the first flexible substrate, and the second sensor substrate is arranged at a position facing the third surface or the fourth surface of the main substrate by bending the second flexible substrate.

14. The sensor apparatus according to claim 13, wherein
the second sensor substrate is arranged at the position on a surface facing the first sensor substrate selected from the third surface and the fourth surface of the main substrate.

15. The sensor apparatus according to claim 13, wherein
the second sensor substrate is arranged at the position on an opposite surface facing the first sensor substrate selected from the third surface and the fourth surface of the main substrate.

16. The sensor apparatus according to claim 11, further comprising: a holding portion that holds the main substrate and the one or more sensor substrates arranged at predetermined positions with respect to the main substrate by bending the one or more flexible substrates.

17. The sensor apparatus according to claim 10, further comprising:
in a case where the substrate having the first surface and the second surface is a sensor substrate, a main substrate on which the control circuit unit is arranged, the main substrate formed separately from one or more sensor substrates; and
a frame that has a connection wire and holds the sensor substrate and the main substrate such that the sensor substrate and the main substrate are electrically connected by the connection wire.

18. The sensor apparatus according to claim 17, wherein the main substrate has a third surface on which the control circuit unit is arranged and a fourth surface opposite to the third surface, and the frame holds the sensor substrate and the main substrate such that the sensor substrate faces the third surface or the fourth surface of the main substrate.

19. The sensor apparatus according to claim 18, wherein in a case where a surface facing the main substrate selected from the first surface and the second surface of the sensor substrate is taken as a first opposing surface, and in a case where a surface facing the sensor substrate selected from the third surface and the fourth surface of the main substrate is taken as a second opposing surface, the frame includes a partition wall portion arranged between the first opposing surface and the second opposing surface, one or more first contact portions extending from the partition wall portion to a sensor substrate side and in contact with the sensor substrate, and one or more second contact portions extending from the partition wall portion to a main substrate side and in contact with the main substrate.

20. The sensor apparatus according to claim 19, wherein the partition wall portion is formed of a flat plate shape and has a fifth surface facing the sensor substrate and a sixth surface facing the sensor substrate, the one or more first contact portions are formed in regions of a portion of a periphery of the fifth surface, and the one or more second contact portions are formed in regions of a portion of a periphery of the sixth surface.

21. The sensor apparatus according to claim 20, wherein when viewed from a direction in which the sensor substrate and the main substrate face each other, positions of the regions in which the one or more first contact portions of the periphery of the fifth surface are formed and positions of the regions in which the one or more second contact portions of the periphery of the sixth surface are formed are different from each other.

22. The sensor apparatus according to claim 21, wherein when viewed from the direction in which the sensor substrate and the main substrate face each other, positions of one or more first void regions in which the one or more first contact portions of the periphery of the fifth surface are not formed and positions of one or more second void regions in which the one or more second contact portions of the periphery of the sixth surface are not formed are different from each other.

23. The sensor apparatus according to claim 22, wherein when viewed from the direction in which the sensor substrate and the main substrate face each other, the one or more first contact portions are formed in regions opposite to the one or more second void regions of the sixth surface, and the one or more second contact portions are formed in regions opposite to the one or more first void regions of the fifth surface.

24. The sensor apparatus according to claim 22, wherein in a case where the sensor substrate is held on the frame, a first space is formed in which the positions of the one or more first void regions of the fifth surface are open by the partition wall portion, the one or more first contact portions, and the sensor substrate, and
in a case where the main substrate is held by the frame, a second space is formed in which the positions of the one or more second void regions of the sixth surface are open by the partition wall portion, the one or more second contact portions, and the main substrate.

25. The sensor apparatus according to claim 24, wherein when viewed from the direction in which the sensor substrate and the main substrate face each other, an opening position of the first space and an opening position of the second space are different from each other.

26. The sensor apparatus according to claim 19, wherein when viewed from a direction in which the sensor substrate and the main substrate face each other, the sensor substrate, the main substrate, and the partition wall portion have same shape.

27. The sensor apparatus according to claim 26, wherein when viewed from the direction in which the sensor substrate and the main substrate face each other, the sensor substrate, the main substrate, and the partition wall portion have rectangular shapes,
a first contact portion is formed on two first side portions extending in the first direction of a fifth surface and facing each other, and
a second contact portion is formed on two second side portions extending in a second direction orthogonal to the first direction of a sixth surface and facing each other.

28. The sensor apparatus according to claim 19, wherein the connection wire includes a first connection terminal portion formed on at least one of one or more first contact surfaces in contact with the sensor substrate of the one or more first contact portions, a second connection terminal portion formed on at least one of one or more second contact surfaces in contact with the main substrate of the one or more second contact portions, and a wire portion electrically connecting the first connection terminal portion and the second connection terminal portion.

29. The sensor apparatus according to claim 28, wherein a connection terminal portion which is electrically connected to the first connection terminal portion is formed on a surface in contact with the one or more first contact surfaces of the sensor substrate, and
a connection terminal portion which is electrically connected to the second connection terminal portion is formed on a surface in contact with the one or more second contact surfaces of the main substrate.

30. The sensor apparatus according to claim 17, wherein in a case where the sensor substrate is a first sensor substrate and the frame is a first frame, the sensor apparatus includes a second sensor substrate and a second frame,
the first frame has a first connection wire and holds the first sensor substrate and the main substrate such that the first sensor substrate and the main substrate are electrically connected by the first connection wire, and
the second frame has a second connection wire and holds the first sensor substrate and the second sensor substrate such that the second sensor substrate and the main substrate are electrically connected by the first connection wire and the second connection wire.

31. The sensor apparatus according to claim 1, further comprising at least one dummy component on at least one of the first surface or the second surface.

32. The sensor apparatus according to claim 1, further comprising a plurality of second electronic components on the first surface, wherein
an arrangement of the plurality of second electronic components on the first surface is in a second direction orthogonal to the first direction,
the plurality of second electronic components is different from the plurality of first IMU sensors and the plurality of second IMU sensors,
the plurality of second electronic components includes at least one of a second diode, a second transistor, a second resistor, a second coil, a second relay, or a second switch, and
the arrangement of the plurality of second electronic components on the first surface is symmetrical with respect to a reference position on the first surface.

33. A sensor apparatus, comprising:
a substrate having a first surface and a second surface, wherein
the second surface is opposite to the first surface;
a plurality of first gyro sensors on the first surface;
a plurality of second gyro sensors on the second surface, wherein
a number of gyro sensors of the plurality of second gyro sensors is the same as a number of gyro sensors of the plurality of first gyro sensors; and
a plurality of electronic components on the first surface, wherein
an arrangement of the plurality of electronic components on the first surface is in a specific direction, and is symmetrical with respect to a reference position on the first surface
the plurality of electronic components is different from the plurality of first gyro sensors and the plurality of second gyro sensors, and
the plurality of electronic components includes at least one of a diode, a transistor, a resistor, a coil, a relay, or a switch.

* * * * *